(12) United States Patent
Siddiqui

(10) Patent No.: US 9,304,549 B2
(45) Date of Patent: Apr. 5, 2016

(54) HINGE MECHANISM FOR ROTATABLE COMPONENT ATTACHMENT

(71) Applicant: Microsoft Corporation, Redmond, WA (US)

(72) Inventor: Kabir Siddiqui, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 251 days.

(21) Appl. No.: 13/852,848

(22) Filed: Mar. 28, 2013

(65) Prior Publication Data

US 2014/0293534 A1  Oct. 2, 2014

(51) Int. Cl.
| | |
|---|---|
| *F16M 11/00* | (2006.01) |
| *G06F 1/16* | (2006.01) |
| *E05D 7/00* | (2006.01) |
| *H05K 5/02* | (2006.01) |
| *F16M 13/00* | (2006.01) |
| *F16M 11/10* | (2006.01) |

(52) U.S. Cl.
CPC .............. *G06F 1/1637* (2013.01); *E05D 7/00* (2013.01); *F16M 11/10* (2013.01); *F16M 13/005* (2013.01); *G06F 1/166* (2013.01); *G06F 1/1679* (2013.01); *G06F 1/1681* (2013.01); *H05K 5/0226* (2013.01); *E05Y 2900/606* (2013.01); *Y10T 16/542* (2015.01); *Y10T 16/54035* (2015.01)

(58) Field of Classification Search
CPC ...... G06F 1/166; G06F 1/1681; H05K 5/0234
See application file for complete search history.

(56) References Cited

U.S. PATENT DOCUMENTS

| | | |
|---|---|---|
| 578,325 A | 3/1897 | Fleming |
| 3,600,528 A | 8/1971 | Leposavic |
| 3,777,082 A | 12/1973 | Hatley |
| 3,879,586 A | 4/1975 | DuRocher et al. |
| 3,968,336 A | 7/1976 | Johnson |
| 4,046,975 A | 9/1977 | Seeger, Jr. |
| 4,065,649 A | 12/1977 | Carter et al. |

(Continued)

FOREIGN PATENT DOCUMENTS

| | | |
|---|---|---|
| CA | 990023 | 6/1976 |
| CN | 1352767 | 6/2002 |

(Continued)

OTHER PUBLICATIONS

"Advisory Action", U.S. Appl. No. 14/199,924, May 28, 2014, 2 pages.

(Continued)

*Primary Examiner* — Bradley Duckworth
(74) *Attorney, Agent, or Firm* — Judy Yee; Micky Minhas

(57) ABSTRACT

A hinge mechanism for rotatable component attachment is described. In at least some implementations, the hinge mechanism enables a support component to be adjustably attached to an apparatus, such as a computing device. For example, the hinge mechanism can be employed to rotatably attach a kickstand to a mobile computing device. The kickstand can be rotated via the hinge mechanism to various positions to provide support for different orientations of the computing device. For example, the kickstand can be positioned to support the computing device in a typing orientation such that input can be provided via an associated input device. As another example, the kickstand can be positioned to enable viewing and/or interaction with the computing device, such as in a portrait viewing orientation.

20 Claims, 24 Drawing Sheets

(56) References Cited

U.S. PATENT DOCUMENTS

| | | | |
|---|---|---|---|
| 4,086,451 A | 4/1978 | Boulanger | |
| 4,243,861 A | 1/1981 | Strandwitz | |
| 4,261,042 A | 4/1981 | Ishiwatari et al. | |
| 4,302,648 A | 11/1981 | Sado et al. | |
| 4,317,011 A | 2/1982 | Mazurk | |
| 4,317,013 A | 2/1982 | Larson | |
| 4,323,740 A | 4/1982 | Balash | |
| 4,365,130 A | 12/1982 | Christensen | |
| 4,492,829 A | 1/1985 | Rodrique | |
| 4,503,294 A | 3/1985 | Matsumaru | |
| 4,527,021 A | 7/1985 | Morikawa et al. | |
| 4,559,426 A | 12/1985 | Van Zeeland et al. | |
| 4,577,822 A | 3/1986 | Wilkerson | |
| 4,588,187 A | 5/1986 | Dell | |
| 4,607,147 A | 8/1986 | Ono et al. | |
| 4,651,133 A | 3/1987 | Ganesan et al. | |
| 4,652,704 A | 3/1987 | Franklin | |
| 4,724,605 A | 2/1988 | Fiorella | |
| 4,735,394 A | 4/1988 | Facco | |
| 4,801,771 A | 1/1989 | Mizuguchi et al. | |
| 4,824,268 A | 4/1989 | Diernisse | |
| 4,864,084 A | 9/1989 | Cardinale | |
| 4,990,900 A | 2/1991 | Kikuchi | |
| 5,008,497 A | 4/1991 | Asher | |
| 5,021,638 A | 6/1991 | Nopper et al. | |
| 5,053,585 A | 10/1991 | Yaniger | |
| 5,107,401 A * | 4/1992 | Youn | 361/679.44 |
| 5,128,829 A | 7/1992 | Loew | |
| 5,220,318 A | 6/1993 | Staley | |
| 5,220,521 A | 6/1993 | Kikinis | |
| 5,235,495 A * | 8/1993 | Blair et al. | 361/679.26 |
| 5,253,362 A | 10/1993 | Nolan et al. | |
| 5,283,559 A | 2/1994 | Kalendra et al. | |
| 5,331,443 A | 7/1994 | Stanisci | |
| 5,363,075 A | 11/1994 | Fanucchi | |
| 5,375,076 A | 12/1994 | Goodrich et al. | |
| 5,480,118 A | 1/1996 | Cross | |
| 5,491,313 A | 2/1996 | Bartley et al. | |
| 5,546,271 A | 8/1996 | Gut et al. | |
| 5,548,477 A | 8/1996 | Kumar et al. | |
| 5,558,577 A | 9/1996 | Kato | |
| 5,581,682 A | 12/1996 | Anderson et al. | |
| 5,596,700 A | 1/1997 | Darnell et al. | |
| 5,617,343 A | 4/1997 | Danielson et al. | |
| 5,661,279 A | 8/1997 | Kenmochi | |
| 5,666,112 A | 9/1997 | Crowley et al. | |
| 5,681,220 A | 10/1997 | Bertram et al. | |
| 5,737,183 A | 4/1998 | Kobayashi et al. | |
| 5,745,376 A | 4/1998 | Barker et al. | |
| 5,748,114 A | 5/1998 | Koehn | |
| 5,781,406 A | 7/1998 | Hunte | |
| 5,803,748 A | 9/1998 | Maddrell et al. | |
| 5,807,175 A | 9/1998 | Davis et al. | |
| 5,818,361 A | 10/1998 | Acevedo | |
| 5,828,770 A | 10/1998 | Leis et al. | |
| 5,842,027 A | 11/1998 | Oprescu et al. | |
| 5,861,990 A | 1/1999 | Tedesco | |
| 5,874,697 A | 2/1999 | Selker et al. | |
| 5,905,485 A | 5/1999 | Podoloff | |
| 5,920,317 A | 7/1999 | McDonald | |
| 5,924,555 A | 7/1999 | Sadamori et al. | |
| 5,926,170 A | 7/1999 | Oba | |
| 5,971,635 A | 10/1999 | Wise | |
| 5,995,026 A | 11/1999 | Sellers | |
| 6,002,389 A | 12/1999 | Kasser | |
| 6,002,581 A * | 12/1999 | Lindsey | 361/679.55 |
| 6,005,209 A | 12/1999 | Burleson et al. | |
| 6,012,714 A | 1/2000 | Worley et al. | |
| 6,014,800 A | 1/2000 | Lee | |
| 6,040,823 A | 3/2000 | Seffernick et al. | |
| 6,042,075 A | 3/2000 | Burch, Jr. | |
| 6,044,717 A | 4/2000 | Biegelsen et al. | |
| 6,055,705 A | 5/2000 | Komatsu et al. | |
| 6,061,644 A | 5/2000 | Leis | |
| 6,108,200 A | 8/2000 | Fullerton | |
| 6,112,797 A | 9/2000 | Colson et al. | |
| 6,128,007 A | 10/2000 | Seybold | |
| 6,178,085 B1 * | 1/2001 | Leung | 361/679.56 |
| 6,178,443 B1 | 1/2001 | Lin | |
| 6,188,391 B1 | 2/2001 | Seely et al. | |
| 6,254,105 B1 | 7/2001 | Rinde et al. | |
| 6,279,060 B1 | 8/2001 | Luke et al. | |
| 6,305,073 B1 | 10/2001 | Badders | |
| 6,329,617 B1 | 12/2001 | Burgess | |
| 6,344,791 B1 | 2/2002 | Armstrong | |
| 6,366,440 B1 | 4/2002 | Kung | |
| 6,380,497 B1 | 4/2002 | Hashimoto et al. | |
| 6,437,682 B1 | 8/2002 | Vance | |
| 6,450,046 B1 | 9/2002 | Maeda | |
| 6,511,378 B1 | 1/2003 | Bhatt et al. | |
| 6,532,147 B1 | 3/2003 | Christ, Jr. | |
| 6,543,949 B1 | 4/2003 | Ritchey et al. | |
| 6,565,439 B2 | 5/2003 | Shinohara et al. | |
| 6,585,435 B2 | 7/2003 | Fang | |
| 6,597,347 B1 | 7/2003 | Yasutake | |
| 6,600,121 B1 | 7/2003 | Olodort et al. | |
| 6,603,408 B1 | 8/2003 | Gaba | |
| 6,603,461 B2 | 8/2003 | Smith, Jr. et al. | |
| 6,608,664 B1 | 8/2003 | Hasegawa | |
| 6,617,536 B2 | 9/2003 | Kawaguchi | |
| 6,651,943 B2 | 11/2003 | Cho et al. | |
| 6,684,166 B2 | 1/2004 | Bellwood et al. | |
| 6,685,369 B2 | 2/2004 | Lien | |
| 6,687,614 B2 | 2/2004 | Ihara et al. | |
| 6,695,273 B2 | 2/2004 | Iguchi | |
| 6,704,864 B1 | 3/2004 | Philyaw | |
| 6,721,019 B2 | 4/2004 | Kono et al. | |
| 6,725,318 B1 | 4/2004 | Sherman et al. | |
| 6,774,888 B1 | 8/2004 | Genduso | |
| 6,776,546 B2 | 8/2004 | Kraus et al. | |
| 6,780,019 B1 | 8/2004 | Ghosh et al. | |
| 6,781,819 B2 | 8/2004 | Yang et al. | |
| 6,784,869 B1 | 8/2004 | Clark et al. | |
| 6,798,887 B1 | 9/2004 | Andre | |
| 6,813,143 B2 | 11/2004 | Makela | |
| 6,819,316 B2 | 11/2004 | Schulz et al. | |
| 6,856,506 B2 | 2/2005 | Doherty et al. | |
| 6,861,961 B2 | 3/2005 | Sandbach et al. | |
| 6,909,354 B2 | 6/2005 | Baker et al. | |
| 6,914,197 B2 | 7/2005 | Doherty et al. | |
| 6,950,950 B2 | 9/2005 | Sawyers et al. | |
| 6,962,454 B1 | 11/2005 | Costello | |
| 6,970,957 B1 | 11/2005 | Oshins et al. | |
| 6,976,799 B2 | 12/2005 | Kim et al. | |
| 7,007,238 B2 | 2/2006 | Glaser | |
| 7,051,149 B2 | 5/2006 | Wang et al. | |
| 7,083,295 B1 | 8/2006 | Hanna | |
| 7,091,436 B2 | 8/2006 | Serban | |
| 7,099,149 B2 | 8/2006 | Krieger et al. | |
| 7,106,222 B2 | 9/2006 | Ward et al. | |
| 7,123,292 B1 | 10/2006 | Seeger et al. | |
| 7,152,985 B2 | 12/2006 | Benitez et al. | |
| D535,292 S | 1/2007 | Shi et al. | |
| 7,159,132 B2 | 1/2007 | Takahashi et al. | |
| 7,194,662 B2 | 3/2007 | Do et al. | |
| 7,213,323 B2 | 5/2007 | Baker et al. | |
| 7,213,991 B2 | 5/2007 | Chapman et al. | |
| 7,239,505 B2 | 7/2007 | Keely | |
| 7,252,512 B2 | 8/2007 | Tai et al. | |
| 7,260,221 B1 | 8/2007 | Atsmon | |
| 7,277,087 B2 | 10/2007 | Hill et al. | |
| 7,301,759 B2 * | 11/2007 | Hsiung | 361/679.27 |
| 7,365,967 B2 | 4/2008 | Zheng | |
| 7,415,676 B2 | 8/2008 | Fujita | |
| 7,447,922 B1 | 11/2008 | Asbury et al. | |
| 7,447,934 B2 | 11/2008 | Dasari et al. | |
| 7,457,108 B2 | 11/2008 | Ghosh | |
| 7,469,386 B2 | 12/2008 | Bear et al. | |
| 7,486,165 B2 | 2/2009 | Ligtenberg et al. | |
| 7,499,037 B2 | 3/2009 | Lube | |
| 7,502,803 B2 | 3/2009 | Culter et al. | |
| 7,539,882 B2 | 5/2009 | Jessup et al. | |
| 7,542,052 B2 | 6/2009 | Solomon et al. | |
| 7,558,594 B2 | 7/2009 | Wilson | |

(56) References Cited

U.S. PATENT DOCUMENTS

| | | |
|---|---|---|
| 7,559,834 B1 | 7/2009 | York |
| RE40,891 E | 9/2009 | Yasutake |
| 7,594,638 B2 * | 9/2009 | Chan et al. ............. 248/677 |
| 7,629,966 B2 | 12/2009 | Anson |
| 7,636,921 B2 | 12/2009 | Louie |
| 7,639,329 B2 | 12/2009 | Takeda et al. |
| 7,639,876 B2 | 12/2009 | Clary et al. |
| 7,656,392 B2 | 2/2010 | Bolender |
| 7,722,358 B2 | 5/2010 | Chatterjee et al. |
| 7,729,493 B2 | 6/2010 | Krieger et al. |
| 7,731,147 B2 | 6/2010 | Rha |
| 7,733,326 B1 | 6/2010 | Adiseshan |
| 7,777,972 B1 | 8/2010 | Chen et al. |
| 7,782,342 B2 | 8/2010 | Koh |
| 7,813,715 B2 | 10/2010 | McKillop et al. |
| 7,822,338 B2 | 10/2010 | Wernersson |
| 7,865,639 B2 | 1/2011 | McCoy et al. |
| 7,884,807 B2 | 2/2011 | Hovden et al. |
| 7,893,921 B2 | 2/2011 | Sato |
| D636,397 S | 4/2011 | Green |
| 7,928,964 B2 | 4/2011 | Kolmykov-Zotov et al. |
| 7,932,890 B2 | 4/2011 | Onikiri et al. |
| 7,944,520 B2 | 5/2011 | Ichioka et al. |
| 7,945,717 B2 | 5/2011 | Rivalsi |
| 7,967,462 B2 | 6/2011 | Ogiro et al. |
| 7,973,771 B2 | 7/2011 | Geaghan |
| 7,978,281 B2 | 7/2011 | Vergith et al. |
| 8,016,255 B2 | 9/2011 | Lin |
| 8,053,688 B2 | 11/2011 | Conzola et al. |
| 8,059,384 B2 | 11/2011 | Park et al. |
| 8,065,624 B2 | 11/2011 | Morin et al. |
| 8,069,356 B2 | 11/2011 | Rathi et al. |
| 8,090,885 B2 | 1/2012 | Callaghan et al. |
| 8,098,233 B2 | 1/2012 | Hotelling et al. |
| 8,115,499 B2 | 2/2012 | Osoinach et al. |
| 8,117,362 B2 | 2/2012 | Rodriguez et al. |
| 8,118,274 B2 | 2/2012 | McClure et al. |
| 8,120,166 B2 | 2/2012 | Koizumi et al. |
| 8,130,203 B2 | 3/2012 | Westerman |
| 8,149,219 B2 | 4/2012 | Lii et al. |
| 8,154,524 B2 | 4/2012 | Wilson et al. |
| 8,159,372 B2 | 4/2012 | Sherman |
| 8,162,282 B2 | 4/2012 | Hu et al. |
| D659,139 S | 5/2012 | Gengler |
| 8,169,421 B2 | 5/2012 | Wright et al. |
| 8,229,509 B2 | 7/2012 | Paek et al. |
| 8,229,522 B2 | 7/2012 | Kim et al. |
| 8,231,099 B2 | 7/2012 | Chen |
| 8,240,007 B2 | 8/2012 | Duan et al. |
| 8,243,432 B2 * | 8/2012 | Duan et al. ............. 361/679.3 |
| 8,245,354 B2 | 8/2012 | Duan et al. |
| 8,248,791 B2 | 8/2012 | Wang et al. |
| 8,255,708 B1 | 8/2012 | Zhang |
| 8,264,310 B2 | 9/2012 | Lauder et al. |
| 8,267,368 B2 | 9/2012 | Torii et al. |
| 8,269,731 B2 | 9/2012 | Molne |
| 8,274,784 B2 | 9/2012 | Franz et al. |
| 8,279,589 B2 | 10/2012 | Kim |
| 8,322,290 B1 | 12/2012 | Mignano |
| 8,346,206 B1 | 1/2013 | Andrus et al. |
| 8,373,664 B2 | 2/2013 | Wright |
| 8,384,566 B2 | 2/2013 | Bocirnea |
| 8,387,078 B2 | 2/2013 | Memmott |
| 8,387,938 B2 * | 3/2013 | Lin ............. 248/456 |
| 8,403,576 B2 | 3/2013 | Merz |
| 8,416,559 B2 | 4/2013 | Agata et al. |
| 8,424,160 B2 * | 4/2013 | Chen ............. 16/278 |
| 8,464,079 B2 | 6/2013 | Chueh et al. |
| 8,498,100 B1 | 7/2013 | Whitt, III et al. |
| 8,514,568 B2 * | 8/2013 | Qiao et al. ............. 361/679.59 |
| 8,520,371 B2 * | 8/2013 | Peng et al. ............. 361/679.01 |
| 8,543,227 B1 | 9/2013 | Perek et al. |
| 8,548,608 B2 | 10/2013 | Perek et al. |
| 8,564,944 B2 | 10/2013 | Whitt, III et al. |
| 8,569,640 B2 | 10/2013 | Yamada et al. |
| 8,570,725 B2 | 10/2013 | Whitt, III et al. |
| 8,576,031 B2 | 11/2013 | Lauder et al. |
| 8,587,701 B2 | 11/2013 | Tatsuzawa |
| 8,599,542 B1 | 12/2013 | Healey et al. |
| 8,610,015 B2 | 12/2013 | Whitt et al. |
| 8,614,666 B2 | 12/2013 | Whitman et al. |
| 8,633,898 B2 | 1/2014 | Westerman et al. |
| 8,646,999 B2 | 2/2014 | Shaw et al. |
| 8,674,941 B2 | 3/2014 | Casparian et al. |
| 8,699,215 B2 | 4/2014 | Whitt, III et al. |
| 8,719,603 B2 | 5/2014 | Belesiu |
| 8,724,302 B2 | 5/2014 | Whitt et al. |
| 8,744,070 B2 * | 6/2014 | Zhang et al. ............. 379/433.13 |
| 8,762,746 B1 | 6/2014 | Lachwani et al. |
| 8,767,388 B2 * | 7/2014 | Ahn et al. ............. 361/679.41 |
| 8,780,540 B2 | 7/2014 | Whitt, III et al. |
| 8,780,541 B2 | 7/2014 | Whitt et al. |
| 8,791,382 B2 | 7/2014 | Whitt, III et al. |
| 8,797,765 B2 * | 8/2014 | Lin et al. ............. 361/807 |
| 8,825,187 B1 | 9/2014 | Hamrick et al. |
| 8,830,668 B2 | 9/2014 | Whit, III et al. |
| 8,850,241 B2 | 9/2014 | Oler et al. |
| 8,854,799 B2 | 10/2014 | Whitt, III et al. |
| 8,873,227 B2 | 10/2014 | Whitt et al. |
| 8,891,232 B2 * | 11/2014 | Wang ............. 361/679.3 |
| 8,896,993 B2 | 11/2014 | Belesiu et al. |
| 8,903,517 B2 | 12/2014 | Perek et al. |
| 8,908,858 B2 * | 12/2014 | Chiu et al. ............. 379/428.02 |
| 8,922,996 B2 | 12/2014 | Yeh et al. |
| 8,934,221 B2 * | 1/2015 | Guo ............. 361/679.01 |
| 8,935,774 B2 | 1/2015 | Belesiu et al. |
| 8,939,422 B2 * | 1/2015 | Liu et al. ............. 248/397 |
| 8,947,864 B2 | 2/2015 | Whitt, III et al. |
| 8,949,477 B2 | 2/2015 | Drasnin |
| 8,964,376 B2 * | 2/2015 | Chen et al. ............. 361/679.55 |
| 9,047,207 B2 | 6/2015 | Belesiu et al. |
| 9,064,654 B2 | 6/2015 | Whitt, III et al. |
| 9,075,566 B2 | 7/2015 | Whitt, III et al. |
| 9,098,117 B2 | 8/2015 | Lutz, III et al. |
| 9,116,550 B2 | 8/2015 | Siddiqui et al. |
| 9,134,807 B2 | 9/2015 | Shaw et al. |
| 9,134,808 B2 | 9/2015 | Siddiqui et al. |
| 9,146,620 B2 | 9/2015 | Whitt et al. |
| 9,158,383 B2 | 10/2015 | Shaw et al. |
| 9,158,384 B2 | 10/2015 | Whitt, III et al. |
| 9,176,900 B2 | 11/2015 | Whitt, III et al. |
| 9,176,901 B2 | 11/2015 | Whitt, III et al. |
| 9,268,373 B2 | 2/2016 | Whitt et al. |
| 2001/0023818 A1 | 9/2001 | Masaru et al. |
| 2001/0035859 A1 | 11/2001 | Kiser |
| 2002/0005108 A1 | 1/2002 | Ludwig |
| 2002/0044216 A1 | 4/2002 | Cha |
| 2002/0070883 A1 | 6/2002 | Dosch |
| 2002/0126445 A1 | 9/2002 | Minaguchi et al. |
| 2002/0134828 A1 | 9/2002 | Sandbach et al. |
| 2002/0135457 A1 | 9/2002 | Sandbach et al. |
| 2002/0195177 A1 | 12/2002 | Hinkley et al. |
| 2003/0000821 A1 | 1/2003 | Takahashi et al. |
| 2003/0007648 A1 | 1/2003 | Currell |
| 2003/0011576 A1 | 1/2003 | Sandbach et al. |
| 2003/0044216 A1 | 3/2003 | Fang |
| 2003/0051983 A1 | 3/2003 | Lahr |
| 2003/0067450 A1 | 4/2003 | Thursfield et al. |
| 2003/0108720 A1 | 6/2003 | Kashino |
| 2003/0160712 A1 | 8/2003 | Levy |
| 2003/0163611 A1 | 8/2003 | Nagao |
| 2003/0197687 A1 | 10/2003 | Shetter |
| 2003/0231243 A1 | 12/2003 | Shibutani |
| 2004/0005184 A1 | 1/2004 | Kim et al. |
| 2004/0046796 A1 | 3/2004 | Fujita |
| 2004/0056843 A1 | 3/2004 | Lin et al. |
| 2004/0113956 A1 | 6/2004 | Bellwood et al. |
| 2004/0156168 A1 | 8/2004 | LeVasseur et al. |
| 2004/0160734 A1 | 8/2004 | Yim |
| 2004/0169641 A1 | 9/2004 | Bean et al. |
| 2004/0212598 A1 | 10/2004 | Kraus et al. |
| 2004/0212601 A1 | 10/2004 | Cake et al. |
| 2004/0258924 A1 | 12/2004 | Berger et al. |
| 2004/0268000 A1 | 12/2004 | Barker et al. |

(56) References Cited

U.S. PATENT DOCUMENTS

| | | |
|---|---|---|
| 2005/0030728 A1 | 2/2005 | Kawashima et al. |
| 2005/0047773 A1 | 3/2005 | Satake et al. |
| 2005/0052831 A1 | 3/2005 | Chen |
| 2005/0055498 A1 | 3/2005 | Beckert et al. |
| 2005/0057515 A1 | 3/2005 | Bathiche |
| 2005/0059489 A1 | 3/2005 | Kim |
| 2005/0062715 A1 | 3/2005 | Tsuji et al. |
| 2005/0099400 A1 | 5/2005 | Lee |
| 2005/0134717 A1 | 6/2005 | Misawa |
| 2005/0146512 A1 | 7/2005 | Hill et al. |
| 2005/0236848 A1 | 10/2005 | Kim et al. |
| 2005/0264653 A1 | 12/2005 | Starkweather et al. |
| 2005/0264988 A1 | 12/2005 | Nicolosi |
| 2005/0283731 A1 | 12/2005 | Saint-Hilaire et al. |
| 2006/0049920 A1 | 3/2006 | Sadler et al. |
| 2006/0085658 A1 | 4/2006 | Allen et al. |
| 2006/0092139 A1 | 5/2006 | Sharma |
| 2006/0096392 A1 | 5/2006 | Inkster et al. |
| 2006/0102020 A1 | 5/2006 | Takada et al. |
| 2006/0125799 A1 | 6/2006 | Hillis et al. |
| 2006/0154725 A1 | 7/2006 | Glaser et al. |
| 2006/0155391 A1 | 7/2006 | Pistemaa et al. |
| 2006/0156415 A1 | 7/2006 | Rubinstein et al. |
| 2006/0174143 A1 | 8/2006 | Sawyers et al. |
| 2006/0176377 A1 | 8/2006 | Miyasaka |
| 2006/0181514 A1 | 8/2006 | Newman |
| 2006/0187216 A1 | 8/2006 | Trent, Jr. et al. |
| 2006/0192763 A1 | 8/2006 | Ziemkowski |
| 2006/0195522 A1 | 8/2006 | Miyazaki |
| 2006/0220465 A1 | 10/2006 | Kingsmore et al. |
| 2006/0227393 A1 | 10/2006 | Herloski |
| 2006/0265617 A1 | 11/2006 | Priborsky |
| 2006/0267931 A1 | 11/2006 | Vainio et al. |
| 2006/0272429 A1 | 12/2006 | Ganapathi et al. |
| 2007/0003267 A1 | 1/2007 | Shibutani |
| 2007/0056385 A1 | 3/2007 | Lorenz |
| 2007/0062089 A1 | 3/2007 | Homer et al. |
| 2007/0069153 A1 | 3/2007 | Pai-Paranjape et al. |
| 2007/0072474 A1 | 3/2007 | Beasley et al. |
| 2007/0117600 A1 | 5/2007 | Robertson et al. |
| 2007/0121956 A1 | 5/2007 | Bai et al. |
| 2007/0127205 A1 | 6/2007 | Kuo |
| 2007/0145945 A1 | 6/2007 | McGinley et al. |
| 2007/0172229 A1 | 7/2007 | Wernersson |
| 2007/0176902 A1 | 8/2007 | Newman et al. |
| 2007/0178891 A1 | 8/2007 | Louch et al. |
| 2007/0182663 A1 | 8/2007 | Biech |
| 2007/0182722 A1 | 8/2007 | Hotelling et al. |
| 2007/0185590 A1 | 8/2007 | Reindel et al. |
| 2007/0200830 A1 | 8/2007 | Yamamoto |
| 2007/0220708 A1 | 9/2007 | Lewis |
| 2007/0222766 A1 | 9/2007 | Bolender |
| 2007/0230227 A1 | 10/2007 | Palmer |
| 2007/0234420 A1 | 10/2007 | Novotney et al. |
| 2007/0236408 A1 | 10/2007 | Yamaguchi et al. |
| 2007/0236475 A1 | 10/2007 | Wherry |
| 2007/0236873 A1 | 10/2007 | Yukawa et al. |
| 2007/0247432 A1 | 10/2007 | Oakley |
| 2007/0252674 A1 | 11/2007 | Nelson et al. |
| 2007/0260892 A1 | 11/2007 | Paul et al. |
| 2007/0283179 A1 | 12/2007 | Burnett et al. |
| 2007/0296709 A1 | 12/2007 | Guanghai |
| 2007/0297625 A1 | 12/2007 | Hjort et al. |
| 2008/0001924 A1 | 1/2008 | de los Reyes et al. |
| 2008/0005423 A1 | 1/2008 | Jacobs et al. |
| 2008/0042978 A1 | 2/2008 | Perez-Noguera |
| 2008/0053222 A1 | 3/2008 | Ehrensvard et al. |
| 2008/0059888 A1 | 3/2008 | Dunko |
| 2008/0074398 A1 | 3/2008 | Wright |
| 2008/0104437 A1 | 5/2008 | Lee |
| 2008/0129520 A1 | 6/2008 | Lee |
| 2008/0151478 A1 | 6/2008 | Chern |
| 2008/0158185 A1 | 7/2008 | Westerman |
| 2008/0174570 A1 | 7/2008 | Jobs et al. |
| 2008/0186660 A1 | 8/2008 | Yang |
| 2008/0228969 A1 | 9/2008 | Cheah et al. |
| 2008/0238884 A1 | 10/2008 | Harish |
| 2008/0253822 A1 | 10/2008 | Matias |
| 2008/0307242 A1 | 12/2008 | Qu |
| 2008/0309636 A1 | 12/2008 | Feng et al. |
| 2008/0316002 A1 | 12/2008 | Brunet et al. |
| 2008/0316183 A1 | 12/2008 | Westerman et al. |
| 2008/0320190 A1 | 12/2008 | Lydon et al. |
| 2009/0009476 A1 | 1/2009 | Daley, III |
| 2009/0073957 A1 | 3/2009 | Newland et al. |
| 2009/0083562 A1 | 3/2009 | Park et al. |
| 2009/0089600 A1 | 4/2009 | Nousiainen |
| 2009/0096756 A1 | 4/2009 | Lube |
| 2009/0102805 A1 | 4/2009 | Meijer et al. |
| 2009/0131134 A1 | 5/2009 | Baerlocher et al. |
| 2009/0140985 A1 | 6/2009 | Liu |
| 2009/0158221 A1 | 6/2009 | Nielsen et al. |
| 2009/0174759 A1 | 7/2009 | Yeh et al. |
| 2009/0177906 A1 | 7/2009 | Paniagua, Jr. et al. |
| 2009/0195497 A1 | 8/2009 | Fitzgerald et al. |
| 2009/0195518 A1 | 8/2009 | Mattice et al. |
| 2009/0207144 A1 | 8/2009 | Bridger |
| 2009/0231275 A1 | 9/2009 | Odgers |
| 2009/0239586 A1 | 9/2009 | Boeve et al. |
| 2009/0244009 A1 | 10/2009 | Staats et al. |
| 2009/0244832 A1 | 10/2009 | Behar et al. |
| 2009/0244872 A1* | 10/2009 | Yan .............................. 361/807 |
| 2009/0251008 A1 | 10/2009 | Sugaya |
| 2009/0259865 A1 | 10/2009 | Sheynblat et al. |
| 2009/0262492 A1 | 10/2009 | Whitchurch et al. |
| 2009/0265670 A1 | 10/2009 | Kim et al. |
| 2009/0285491 A1 | 11/2009 | Ravenscroft et al. |
| 2009/0296331 A1 | 12/2009 | Choy |
| 2009/0303204 A1 | 12/2009 | Nasiri et al. |
| 2009/0315830 A1 | 12/2009 | Westerman |
| 2009/0320244 A1 | 12/2009 | Lin |
| 2009/0321490 A1 | 12/2009 | Groene et al. |
| 2010/0001963 A1 | 1/2010 | Doray et al. |
| 2010/0006412 A1 | 1/2010 | Wang et al. |
| 2010/0013319 A1 | 1/2010 | Kamiyama et al. |
| 2010/0023869 A1 | 1/2010 | Saint-Hilaire et al. |
| 2010/0026656 A1 | 2/2010 | Hotelling et al. |
| 2010/0038821 A1 | 2/2010 | Jenkins et al. |
| 2010/0039081 A1 | 2/2010 | Sip |
| 2010/0039764 A1 | 2/2010 | Locker et al. |
| 2010/0045633 A1 | 2/2010 | Gettemy |
| 2010/0051432 A1 | 3/2010 | Lin et al. |
| 2010/0052880 A1 | 3/2010 | Laitinen et al. |
| 2010/0053534 A1 | 3/2010 | Hsieh et al. |
| 2010/0054435 A1 | 3/2010 | Louch et al. |
| 2010/0056130 A1 | 3/2010 | Louch et al. |
| 2010/0073329 A1 | 3/2010 | Raman et al. |
| 2010/0077237 A1 | 3/2010 | Sawyers |
| 2010/0079379 A1 | 4/2010 | Demuynck et al. |
| 2010/0083108 A1 | 4/2010 | Rider et al. |
| 2010/0085321 A1 | 4/2010 | Pundsack |
| 2010/0100752 A1 | 4/2010 | Chueh et al. |
| 2010/0102182 A1 | 4/2010 | Lin |
| 2010/0103112 A1 | 4/2010 | Yoo et al. |
| 2010/0105443 A1 | 4/2010 | Vaisanen |
| 2010/0106983 A1 | 4/2010 | Kasprzak et al. |
| 2010/0115309 A1 | 5/2010 | Carvalho et al. |
| 2010/0117993 A1 | 5/2010 | Kent |
| 2010/0123686 A1 | 5/2010 | Klinghult et al. |
| 2010/0128427 A1 | 5/2010 | Iso |
| 2010/0133398 A1 | 6/2010 | Chiu et al. |
| 2010/0142130 A1 | 6/2010 | Wang et al. |
| 2010/0146317 A1 | 6/2010 | Challener et al. |
| 2010/0148995 A1 | 6/2010 | Elias |
| 2010/0148999 A1 | 6/2010 | Casparian et al. |
| 2010/0149104 A1 | 6/2010 | Sim et al. |
| 2010/0149111 A1 | 6/2010 | Olien |
| 2010/0149377 A1 | 6/2010 | Shintani et al. |
| 2010/0154171 A1 | 6/2010 | Lombardi et al. |
| 2010/0156913 A1 | 6/2010 | Ortega et al. |
| 2010/0161522 A1 | 6/2010 | Tirpak et al. |
| 2010/0164857 A1 | 7/2010 | Liu et al. |
| 2010/0164897 A1 | 7/2010 | Morin et al. |
| 2010/0171891 A1 | 7/2010 | Kaji et al. |

(56) References Cited

U.S. PATENT DOCUMENTS

| | | |
|---|---|---|
| 2010/0174421 A1 | 7/2010 | Tsai et al. |
| 2010/0180063 A1 | 7/2010 | Ananny et al. |
| 2010/0185877 A1 | 7/2010 | Chueh et al. |
| 2010/0188299 A1 | 7/2010 | Rinehart et al. |
| 2010/0201308 A1 | 8/2010 | Lindholm |
| 2010/0205472 A1 | 8/2010 | Tupman et al. |
| 2010/0206614 A1 | 8/2010 | Park et al. |
| 2010/0207774 A1 | 8/2010 | Song |
| 2010/0220205 A1 | 9/2010 | Lee et al. |
| 2010/0222110 A1 | 9/2010 | Kim et al. |
| 2010/0231522 A1 | 9/2010 | Li |
| 2010/0231556 A1 | 9/2010 | Mines et al. |
| 2010/0235546 A1 | 9/2010 | Terlizzi et al. |
| 2010/0238620 A1 | 9/2010 | Fish |
| 2010/0250975 A1 | 9/2010 | Gill et al. |
| 2010/0250988 A1 | 9/2010 | Okuda et al. |
| 2010/0259482 A1 | 10/2010 | Ball |
| 2010/0259876 A1* | 10/2010 | Kim .......................... 361/679.01 |
| 2010/0265182 A1 | 10/2010 | Ball et al. |
| 2010/0271771 A1 | 10/2010 | Wu et al. |
| 2010/0274932 A1 | 10/2010 | Kose |
| 2010/0279768 A1 | 11/2010 | Huang et al. |
| 2010/0289457 A1 | 11/2010 | Onnerud et al. |
| 2010/0295812 A1 | 11/2010 | Burns et al. |
| 2010/0302378 A1 | 12/2010 | Marks et al. |
| 2010/0306538 A1 | 12/2010 | Thomas et al. |
| 2010/0308778 A1 | 12/2010 | Yamazaki et al. |
| 2010/0308844 A1 | 12/2010 | Day et al. |
| 2010/0309617 A1 | 12/2010 | Wang et al. |
| 2010/0313680 A1 | 12/2010 | Joung et al. |
| 2010/0315345 A1 | 12/2010 | Laitinen |
| 2010/0315348 A1 | 12/2010 | Jellicoe et al. |
| 2010/0315373 A1 | 12/2010 | Steinhauser et al. |
| 2010/0321877 A1 | 12/2010 | Moser |
| 2010/0324457 A1 | 12/2010 | Bean et al. |
| 2010/0325155 A1 | 12/2010 | Skinner et al. |
| 2011/0012873 A1 | 1/2011 | Prest et al. |
| 2011/0019123 A1 | 1/2011 | Prest et al. |
| 2011/0031287 A1 | 2/2011 | Le Gette et al. |
| 2011/0032127 A1 | 2/2011 | Roush |
| 2011/0036965 A1 | 2/2011 | Zhang et al. |
| 2011/0037721 A1 | 2/2011 | Cranfill et al. |
| 2011/0043990 A1 | 2/2011 | Mickey et al. |
| 2011/0050576 A1 | 3/2011 | Forutanpour et al. |
| 2011/0050626 A1 | 3/2011 | Porter et al. |
| 2011/0055407 A1 | 3/2011 | Lydon et al. |
| 2011/0057724 A1 | 3/2011 | Pabon |
| 2011/0060926 A1 | 3/2011 | Brooks et al. |
| 2011/0069148 A1 | 3/2011 | Jones et al. |
| 2011/0074688 A1 | 3/2011 | Hull et al. |
| 2011/0102326 A1 | 5/2011 | Casparian et al. |
| 2011/0102752 A1* | 5/2011 | Chen et al. ................... 353/119 |
| 2011/0107958 A1 | 5/2011 | Pance et al. |
| 2011/0108401 A1 | 5/2011 | Yamada et al. |
| 2011/0113368 A1 | 5/2011 | Carvajal et al. |
| 2011/0115738 A1 | 5/2011 | Suzuki et al. |
| 2011/0117970 A1 | 5/2011 | Choi |
| 2011/0134032 A1 | 6/2011 | Chiu et al. |
| 2011/0134043 A1 | 6/2011 | Chen |
| 2011/0157037 A1 | 6/2011 | Shamir et al. |
| 2011/0157046 A1 | 6/2011 | Lee et al. |
| 2011/0157087 A1 | 6/2011 | Kanehira et al. |
| 2011/0163955 A1 | 7/2011 | Nasiri et al. |
| 2011/0164370 A1 | 7/2011 | McClure et al. |
| 2011/0167181 A1 | 7/2011 | Minoo et al. |
| 2011/0167287 A1 | 7/2011 | Walsh et al. |
| 2011/0167391 A1 | 7/2011 | Momeyer et al. |
| 2011/0169762 A1 | 7/2011 | Weiss |
| 2011/0170289 A1 | 7/2011 | Allen et al. |
| 2011/0176035 A1 | 7/2011 | Poulsen |
| 2011/0179864 A1 | 7/2011 | Raasch et al. |
| 2011/0184646 A1 | 7/2011 | Wong et al. |
| 2011/0184824 A1 | 7/2011 | George et al. |
| 2011/0188199 A1 | 8/2011 | Pan |
| 2011/0191480 A1 | 8/2011 | Kobayashi |
| 2011/0193787 A1 | 8/2011 | Morishige et al. |
| 2011/0199389 A1 | 8/2011 | Lu et al. |
| 2011/0205372 A1 | 8/2011 | Miramontes |
| 2011/0221678 A1 | 9/2011 | Davydov |
| 2011/0227913 A1 | 9/2011 | Hyndman |
| 2011/0231682 A1 | 9/2011 | Kakish et al. |
| 2011/0234494 A1 | 9/2011 | Peterson et al. |
| 2011/0241999 A1 | 10/2011 | Thier |
| 2011/0248152 A1 | 10/2011 | Svajda et al. |
| 2011/0248920 A1 | 10/2011 | Larsen |
| 2011/0248941 A1 | 10/2011 | Abdo et al. |
| 2011/0261001 A1 | 10/2011 | Liu |
| 2011/0265287 A1* | 11/2011 | Li et al. .......................... 16/297 |
| 2011/0266672 A1 | 11/2011 | Sylvester |
| 2011/0267272 A1 | 11/2011 | Meyer et al. |
| 2011/0273475 A1 | 11/2011 | Herz et al. |
| 2011/0285555 A1 | 11/2011 | Bocirnea |
| 2011/0290686 A1 | 12/2011 | Huang |
| 2011/0295697 A1 | 12/2011 | Boston et al. |
| 2011/0297566 A1 | 12/2011 | Gallagher et al. |
| 2011/0298919 A1 | 12/2011 | Maglaque |
| 2011/0302518 A1 | 12/2011 | Zhang |
| 2011/0304577 A1 | 12/2011 | Brown |
| 2011/0305875 A1 | 12/2011 | Sanford et al. |
| 2011/0314425 A1 | 12/2011 | Chiang |
| 2011/0316807 A1 | 12/2011 | Corrion |
| 2011/0320204 A1 | 12/2011 | Locker et al. |
| 2012/0002820 A1 | 1/2012 | Leichter |
| 2012/0007821 A1 | 1/2012 | Zaliva |
| 2012/0020019 A1 | 1/2012 | Chen et al. |
| 2012/0020490 A1 | 1/2012 | Leichter |
| 2012/0023401 A1 | 1/2012 | Arscott et al. |
| 2012/0023459 A1 | 1/2012 | Westerman |
| 2012/0024682 A1 | 2/2012 | Huang et al. |
| 2012/0026096 A1 | 2/2012 | Ku |
| 2012/0026110 A1 | 2/2012 | Yamano |
| 2012/0032887 A1 | 2/2012 | Chiu et al. |
| 2012/0032891 A1 | 2/2012 | Parivar |
| 2012/0032901 A1 | 2/2012 | Kwon |
| 2012/0032917 A1 | 2/2012 | Yamaguchi |
| 2012/0038495 A1 | 2/2012 | Ishikawa |
| 2012/0044179 A1 | 2/2012 | Hudson |
| 2012/0047368 A1 | 2/2012 | Chinn et al. |
| 2012/0050975 A1 | 3/2012 | Garelli et al. |
| 2012/0062564 A1 | 3/2012 | Miyashita |
| 2012/0068919 A1 | 3/2012 | Lauder et al. |
| 2012/0069540 A1 | 3/2012 | Lauder et al. |
| 2012/0075249 A1 | 3/2012 | Hoch |
| 2012/0077384 A1 | 3/2012 | Bar-Niv et al. |
| 2012/0092279 A1 | 4/2012 | Martin |
| 2012/0094257 A1 | 4/2012 | Pillischer et al. |
| 2012/0099749 A1 | 4/2012 | Rubin et al. |
| 2012/0113137 A1 | 5/2012 | Nomoto |
| 2012/0113579 A1 | 5/2012 | Agata et al. |
| 2012/0117409 A1 | 5/2012 | Lee et al. |
| 2012/0127118 A1 | 5/2012 | Nolting et al. |
| 2012/0127126 A1 | 5/2012 | Mattice et al. |
| 2012/0139727 A1 | 6/2012 | Houvener et al. |
| 2012/0140396 A1 | 6/2012 | Zeliff et al. |
| 2012/0145525 A1 | 6/2012 | Ishikawa |
| 2012/0156875 A1 | 6/2012 | Srinivas et al. |
| 2012/0161406 A1 | 6/2012 | Mersky |
| 2012/0162693 A1 | 6/2012 | Ito |
| 2012/0175487 A1 | 7/2012 | Goto |
| 2012/0182242 A1 | 7/2012 | Lindahl et al. |
| 2012/0182249 A1 | 7/2012 | Endo et al. |
| 2012/0182743 A1 | 7/2012 | Chou |
| 2012/0194448 A1 | 8/2012 | Rothkopf |
| 2012/0212438 A1 | 8/2012 | Vaisanen |
| 2012/0218194 A1 | 8/2012 | Silverman |
| 2012/0221877 A1 | 8/2012 | Prabu |
| 2012/0224073 A1 | 9/2012 | Miyahara |
| 2012/0229634 A1 | 9/2012 | Laett et al. |
| 2012/0242584 A1 | 9/2012 | Tuli |
| 2012/0246377 A1 | 9/2012 | Bhesania |
| 2012/0249443 A1 | 10/2012 | Anderson et al. |
| 2012/0250873 A1 | 10/2012 | Bakalos et al. |
| 2012/0256829 A1 | 10/2012 | Dodge |
| 2012/0256959 A1 | 10/2012 | Ye et al. |

(56) References Cited

U.S. PATENT DOCUMENTS

| | | |
|---|---|---|
| 2012/0260177 A1 | 10/2012 | Sehrer |
| 2012/0274811 A1 | 11/2012 | Bakin |
| 2012/0299872 A1 | 11/2012 | Nishikawa et al. |
| 2012/0300275 A1 | 11/2012 | Vilardell et al. |
| 2012/0312955 A1 | 12/2012 | Randolph |
| 2012/0326003 A1 | 12/2012 | Solow et al. |
| 2013/0009413 A1 | 1/2013 | Chiu et al. |
| 2013/0015311 A1* | 1/2013 | Kim ............................. 248/393 |
| 2013/0021289 A1 | 1/2013 | Chen et al. |
| 2013/0027867 A1 | 1/2013 | Lauder et al. |
| 2013/0031353 A1 | 1/2013 | Noro |
| 2013/0038541 A1 | 2/2013 | Bakker |
| 2013/0044074 A1 | 2/2013 | Park et al. |
| 2013/0046397 A1 | 2/2013 | Fadell et al. |
| 2013/0063873 A1 | 3/2013 | Wodrich et al. |
| 2013/0067126 A1 | 3/2013 | Casparian et al. |
| 2013/0067259 A1 | 3/2013 | Freiwald et al. |
| 2013/0073877 A1 | 3/2013 | Radke |
| 2013/0076617 A1 | 3/2013 | Csaszar et al. |
| 2013/0082824 A1 | 4/2013 | Colley |
| 2013/0088431 A1 | 4/2013 | Ballagas et al. |
| 2013/0100030 A1 | 4/2013 | Los et al. |
| 2013/0100082 A1 | 4/2013 | Bakin et al. |
| 2013/0106766 A1 | 5/2013 | Yilmaz et al. |
| 2013/0135214 A1 | 5/2013 | Li et al. |
| 2013/0151944 A1 | 6/2013 | Lin |
| 2013/0154959 A1 | 6/2013 | Lindsay et al. |
| 2013/0159749 A1 | 6/2013 | Moeglein et al. |
| 2013/0162554 A1 | 6/2013 | Lauder et al. |
| 2013/0172906 A1 | 7/2013 | Olson et al. |
| 2013/0191741 A1 | 7/2013 | Dickinson et al. |
| 2013/0212483 A1 | 8/2013 | Brakensiek et al. |
| 2013/0215035 A1 | 8/2013 | Guard |
| 2013/0217451 A1 | 8/2013 | Komiyama et al. |
| 2013/0222272 A1 | 8/2013 | Martin, Jr. |
| 2013/0222274 A1 | 8/2013 | Mori et al. |
| 2013/0222275 A1 | 8/2013 | Byrd et al. |
| 2013/0222323 A1 | 8/2013 | McKenzie |
| 2013/0226794 A1 | 8/2013 | Englebardt |
| 2013/0227836 A1 | 9/2013 | Whitt, III et al. |
| 2013/0228023 A1 | 9/2013 | Drasnin |
| 2013/0228433 A1 | 9/2013 | Shaw |
| 2013/0228434 A1 | 9/2013 | Whitt, III et al. |
| 2013/0228439 A1 | 9/2013 | Whitt, III |
| 2013/0229100 A1* | 9/2013 | Siddiqui et al. ............... 312/326 |
| 2013/0229335 A1 | 9/2013 | Whitman |
| 2013/0229347 A1 | 9/2013 | Lutz, III |
| 2013/0229350 A1 | 9/2013 | Shaw |
| 2013/0229351 A1 | 9/2013 | Whitt, III |
| 2013/0229354 A1 | 9/2013 | Whitt, III |
| 2013/0229363 A1 | 9/2013 | Whitman |
| 2013/0229366 A1 | 9/2013 | Dighde |
| 2013/0229380 A1 | 9/2013 | Lutz, III |
| 2013/0229534 A1 | 9/2013 | Panay |
| 2013/0229568 A1 | 9/2013 | Belesiu |
| 2013/0229570 A1 | 9/2013 | Beck et al. |
| 2013/0229756 A1 | 9/2013 | Whitt, III |
| 2013/0229757 A1 | 9/2013 | Whitt, III |
| 2013/0229758 A1 | 9/2013 | Belesiu |
| 2013/0229759 A1 | 9/2013 | Whitt, III |
| 2013/0229760 A1 | 9/2013 | Whitt, III |
| 2013/0229761 A1 | 9/2013 | Shaw |
| 2013/0229762 A1 | 9/2013 | Whitt, III |
| 2013/0229773 A1* | 9/2013 | Siddiqui et al. ............ 361/679.59 |
| 2013/0230346 A1 | 9/2013 | Shaw |
| 2013/0231755 A1 | 9/2013 | Perek |
| 2013/0232280 A1 | 9/2013 | Perek |
| 2013/0232348 A1 | 9/2013 | Oler |
| 2013/0232349 A1 | 9/2013 | Oler |
| 2013/0232350 A1 | 9/2013 | Belesiu et al. |
| 2013/0232353 A1 | 9/2013 | Belesiu |
| 2013/0232571 A1 | 9/2013 | Belesiu |
| 2013/0232742 A1 | 9/2013 | Burnett et al. |
| 2013/0262886 A1 | 10/2013 | Nishimura |
| 2013/0268897 A1 | 10/2013 | Li et al. |
| 2013/0285922 A1 | 10/2013 | Alberth, Jr. et al. |
| 2013/0300590 A1 | 11/2013 | Dietz |
| 2013/0300647 A1 | 11/2013 | Drasnin |
| 2013/0301199 A1 | 11/2013 | Whitt |
| 2013/0301206 A1 | 11/2013 | Whitt |
| 2013/0304941 A1 | 11/2013 | Drasnin |
| 2013/0321992 A1* | 12/2013 | LIU et al. ................. 361/679.01 |
| 2013/0322000 A1 | 12/2013 | Whitt |
| 2013/0322001 A1 | 12/2013 | Whitt |
| 2013/0329360 A1 | 12/2013 | Aldana |
| 2013/0332628 A1 | 12/2013 | Panay |
| 2013/0335891 A1 | 12/2013 | Chen et al. |
| 2013/0339757 A1 | 12/2013 | Reddy |
| 2013/0342976 A1* | 12/2013 | Chung ...................... 361/679.01 |
| 2014/0012401 A1 | 1/2014 | Perek |
| 2014/0029180 A1 | 1/2014 | Nishimura et al. |
| 2014/0036430 A1 | 2/2014 | Wroblewski et al. |
| 2014/0043275 A1 | 2/2014 | Whitman |
| 2014/0048399 A1 | 2/2014 | Whitt, III |
| 2014/0083883 A1 | 3/2014 | Elias |
| 2014/0085814 A1* | 3/2014 | Kielland .................. 361/679.55 |
| 2014/0119802 A1 | 5/2014 | Shaw |
| 2014/0132550 A1 | 5/2014 | McCracken et al. |
| 2014/0167585 A1* | 6/2014 | Kuan et al. ..................... 312/326 |
| 2014/0185215 A1 | 7/2014 | Whitt et al. |
| 2014/0185220 A1 | 7/2014 | Whitt et al. |
| 2014/0204514 A1 | 7/2014 | Whitt et al. |
| 2014/0204515 A1 | 7/2014 | Whitt et al. |
| 2014/0247546 A1 | 9/2014 | Whitt |
| 2014/0291134 A1 | 10/2014 | Whitt |
| 2014/0362506 A1 | 12/2014 | Whitt, III et al. |
| 2014/0372914 A1 | 12/2014 | Byrd et al. |
| 2014/0374230 A1 | 12/2014 | Shaw et al. |
| 2014/0379942 A1 | 12/2014 | Perek et al. |
| 2015/0005953 A1 | 1/2015 | Fadell et al. |
| 2015/0036274 A1 | 2/2015 | Belesiu et al. |
| 2015/0212553 A1 | 7/2015 | Park et al. |
| 2015/0227212 A1 | 8/2015 | Whitt, III et al. |
| 2015/0234478 A1 | 8/2015 | Belesiu et al. |
| 2015/0261262 A1 | 9/2015 | Whitt, III et al. |
| 2015/0311014 A1 | 10/2015 | Shaw et al. |
| 2015/0378392 A1 | 12/2015 | Siddiqui et al. |

FOREIGN PATENT DOCUMENTS

| | | |
|---|---|---|
| CN | 1537223 | 10/2004 |
| CN | 1653411 | 8/2005 |
| CN | 1787605 | 6/2006 |
| CN | 1808362 | 7/2006 |
| CN | 101198925 | 6/2008 |
| CN | 101366001 | 2/2009 |
| CN | 101410781 | 4/2009 |
| CN | 101452334 | 6/2009 |
| CN | 101464750 | 6/2009 |
| CN | 101500388 | 8/2009 |
| CN | 101644979 | 2/2010 |
| CN | 101675406 | 3/2010 |
| CN | 101681189 | 3/2010 |
| CN | 101908428 | 12/2010 |
| CN | 102004559 | 4/2011 |
| CN | 1102012763 | 4/2011 |
| CN | 102096494 | 6/2011 |
| CN | 102112947 | 6/2011 |
| CN | 201853163 | 6/2011 |
| CN | 102117121 | 7/2011 |
| CN | 102124532 | 7/2011 |
| CN | 102138113 | 7/2011 |
| CN | 102147643 | 8/2011 |
| CN | 102214040 | 10/2011 |
| CN | 102292687 | 12/2011 |
| CN | 102356624 | 2/2012 |
| CN | 202441167 | 9/2012 |
| CN | 103455149 | 12/2013 |
| CN | 203606723 | 5/2014 |
| DE | 10116556 | 10/2002 |
| DE | 202010005274 | 7/2010 |
| EP | 645726 | 3/1995 |
| EP | 1003188 | 5/2000 |
| EP | 1223722 | 7/2002 |

(56) References Cited

FOREIGN PATENT DOCUMENTS

| | | |
|---|---|---|
| EP | 1480029 | 11/2004 |
| EP | 1591891 | 11/2005 |
| EP | 1983411 | 10/2008 |
| EP | 2006869 | 12/2008 |
| EP | 2026178 | 2/2009 |
| EP | 2353978 A1 | 8/2011 |
| EP | 2410408 | 1/2012 |
| GB | 2068643 | 8/1981 |
| GB | 2123213 | 1/1984 |
| GB | 2305780 | 4/1997 |
| GB | 2381584 | 5/2003 |
| GB | 2402460 | 12/2004 |
| GB | 2482932 | 2/2012 |
| JP | 52107722 | 9/1977 |
| JP | 56108127 | 8/1981 |
| JP | 10326124 | 12/1998 |
| JP | 1173239 | 3/1999 |
| JP | 11338575 | 12/1999 |
| JP | 2000010654 | 1/2000 |
| JP | 2001142564 | 5/2001 |
| JP | 2002170458 | 6/2002 |
| JP | 2004038950 | 2/2004 |
| JP | 2006163459 | 6/2006 |
| JP | 2006294361 | 10/2006 |
| JP | 2010244514 | 10/2010 |
| JP | 2003077368 | 3/2014 |
| KR | 20010107055 | 12/2001 |
| KR | 20050014299 | 2/2005 |
| KR | 20060003093 | 1/2006 |
| KR | 20080006404 | 1/2008 |
| KR | 20090029411 | 3/2009 |
| KR | 20100022059 | 2/2010 |
| KR | 20100067366 | 6/2010 |
| KR | 20100115675 | 10/2010 |
| KR | 102011008717 | 8/2011 |
| KR | 20110109791 | 10/2011 |
| KR | 20110120002 | 11/2011 |
| KR | 20110122333 | 11/2011 |
| KR | 101113530 | 2/2012 |
| WO | WO-2006044818 | 4/2006 |
| WO | WO-2007103631 | 9/2007 |
| WO | WO-2007112172 | 10/2007 |
| WO | WO-2009034484 | 3/2009 |
| WO | WO-2010074116 | 7/2010 |
| WO | WO-2011049609 | 4/2011 |
| WO | WO-2014209818 | 12/2014 |

OTHER PUBLICATIONS

"Corrected Notice of Allowance", U.S. Appl. No. 13/565,124, Mar. 10, 2014, 2 pages.
"Corrected Notice of Allowance", U.S. Appl. No. 13/565,124, Apr. 14, 2014, 2 pages.
"Corrected Notice of Allowance", U.S. Appl. No. 13/938,930, May 6, 2014, 2 pages.
"Corrected Notice of Allowance", U.S. Appl. No. 13/938,930, Jun. 6, 2014, 2 pages.
"Corrected Notice of Allowance", U.S. Appl. No. 13/939,002, May 22, 2014, 2 pages.
"Corrected Notice of Allowance", U.S. Appl. No. 13/939,002, Jun. 19, 2014, 2 pages.
"Corrected Notice of Allowance", U.S. Appl. No. 13/939,002, May 5, 2014, 2 pages.
"Corrected Notice of Allowance", U.S. Appl. No. 13/939,032, Jun. 26, 2014, 2 pages.
"Final Office Action", U.S. Appl. No. 13/653,682, Jun. 11, 2014, 11 pages.
"Final Office Action", U.S. Appl. No. 14/063,912, Apr. 29, 2014, 10 pages.
"Final Office Action", U.S. Appl. No. 14/199,924, May 6, 2014, 5 pages.
"Foreign Notice of Allowance", CN Application No. 201320096755.7, Jan. 27, 2014, 2 pages.
"Foreign Office Action", CN Application No. 201320097079.5, Sep. 26, 2013, 4 pages.
"i-Blason Spring Series Premium Flexible KickStand Anti-Slippery TPU Cover Case for iPhone 4 4S (White)", Retrieved From: <http://www.amazon.com/i-Blason-Premium-Flexible-KickStand-Anti-Slippery/dp/B007LCLXLU> Jun. 12, 2014, Nov. 30, 2012, 4 Pages.
"Interlink Electronics FSR (TM) Force Sensing Resistors (TM)", Retrieved at <<http://akizukidenshi.com/download/ds/ interlinkelec/94-00004+Rev+B%20FSR%20 1ntegration%Guide.pdf on Mar. 21, 2013, 36 pages.
"International Search Report and Written Opinion", Application No. PCT/US2014/031531, Jun. 20, 2014, 10 Pages.
"Non-Final Office Action", U.S. Appl. No. 13/468,882, Jul. 9, 2014, 9 pages.
"Non-Final Office Action", U.S. Appl. No. 13/468,949, Jun. 20, 2014, 10 pages.
"Non-Final Office Action", U.S. Appl. No. 13/470,951, Jul. 2, 2014, 19 pages.
"Non-Final Office Action", U.S. Appl. No. 13/471,001, Jun. 17, 2014, 23 pages.
"Non-Final Office Action", U.S. Appl. No. 13/471,030, May 15, 2014, 10 pages.
"Non-Final Office Action", U.S. Appl. No. 13/471,054, Jun. 3, 2014, 15 pages.
"Non-Final Office Action", U.S. Appl. No. 13/471,336, May 7, 2014, 17 pages.
"Non-Final Office Action", U.S. Appl. No. 13/492,232, Apr. 30, 2014, 9 pages.
"Non-Final Office Action", U.S. Appl. No. 13/564,520, Jun. 16, 2014, 5 pages.
"Non-Final Office Action", U.S. Appl. No. 13/595,700, Jun. 18, 2014, 8 pages.
"Non-Final Office Action", U.S. Appl. No. 13/651,976, Jun. 16, 2014, 23 pages.
"Non-Final Office Action", U.S. Appl. No. 14/199,924, Apr. 10, 2014, 6 pages.
"Non-Final Office Action", U.S. Appl. No. 14/200,595, Apr. 11, 2014, 4 pages.
"Non-Final Office Action", U.S. Appl. No. 14/225,250, Jun. 17, 2014, 5 pages.
"Non-Final Office Action", U.S. Appl. No. 14/225,276, Jun. 13, 2014, 6 pages.
"Non-Final Office Action", U.S. Appl. No. 14/277,240, Jun. 13, 2014, 6 pages.
"Notice of Allowance", U.S. Appl. No. 13/468,918, Jun. 17, 2014, 5 pages.
"Notice of Allowance", U.S. Appl. No. 13/471,186, Jul. 3, 2014, 7 pages.
"Notice of Allowance", U.S. Appl. No. 13/471,237, May 12, 2014, 8 pages.
"Notice of Allowance", U.S. Appl. No. 13/471,405, Jun. 24, 2014, 9 pages.
"Notice of Allowance", U.S. Appl. No. 13/651,232, Apr. 25, 2014, 9 pages.
"Notice of Allowance", U.S. Appl. No. 13/651,287, May 2, 2014, 6 pages.
"Notice of Allowance", U.S. Appl. No. 14/018,286, May 23, 2014, 8 pages.
"Notice of Allowance", U.S. Appl. No. 14/199,924, Jun. 10, 2014, 4 pages.
"Restriction Requirement", U.S. Appl. No. 13/595,700, May 28, 2014, 6 pages.
"Supplemental Notice of Allowance", U.S. Appl. No. 14/018,286, Jun. 11, 2014, 5 pages.
"The New Lenovo Yoga Tablet 8", Retrieved From:<http://www.pricepanda.co.in/lenovo-yoga-tablet-8-pid1529091/> Jun. 11, 2014, 2014, 2 Pages.
Arar, "HP Envy Rove: A Movable (If Underpowered) All-In-One PC", Retrieved From: <http://www.pcworld.com/article/2047032/hp-envy-rove-a-movable-if-underpowered-all-in-one-pc.html> Jun. 11, 2014, Aug. 21, 2013, 6 Pages.

(56) References Cited

OTHER PUBLICATIONS

Lee, et al., "LED Light Coupler Design for a Ultra Thin Light Guide", Journal of the Optical Society of Korea, vol. 11, Issue.3, Retrieved from <http://opticslab.kongju.ac.kr/pdf/06.pdf>,Sep. 2007, 5 pages.

Purcher, "Apple Designs a Future Built-In Stand for the iPad & More", Retrieved From: <http://www.patentlyapple.com/patently-apple/2011/02/apple-designs-a-future-built-in-stand-for-the-ipad-more.html> Jun. 11, 2014, Feb. 13, 2011, 9 pages.

Thurrott, "Surface Pro 3: Continuous Kickstand", Retrieved From: <http://winsupersite.com/mobile-devices/surface-pro-3-continuous-kickstand> Jun. 11, 2014, May 21, 2014, 5 Pages.

"Accessing Device Sensors", retrieved from <https://developer.palm.com/content/api/dev-guide/pdk/accessing-device-sensors.html> on May 25, 2012, 4 pages.

"ACPI Docking for Windows Operating Systems", Retrieved from: <http://www.scritube.com/limba/engleza/software/ACPI-Docking-for-Windows-Opera331824193.php> on Jul. 6, 2012,10 pages.

"Cholesteric Liquid Crystal", Retrieved from: <http://en.wikipedia.org/wiki/Cholesteric_liquid_crystal> on Aug. 6, 2012,(Jun. 10, 2012), 2 pages.

"Corrected Notice of Allowance", U.S. Appl. No. 13/470,633, (Apr. 9, 2013), 2 pages.

"Corrected Notice of Allowance", U.S. Appl. No. 13/470,633, (Jul. 2, 2013), 2 pages.

"DR2PA", retrieved from <http://www.architainment.co.uk/wp-content/uploads/2012/08/DR2PA-AU-US-size-Data-Sheet-Rev-H_LOGO.pdf> on Sep. 17, 2012, 4 pages.

"Final Office Action", U.S. Appl. No. 13/651,195, (Apr. 18, 2013),13 pages.

"Final Office Action", U.S. Appl. No. 13/651,232, (May 21, 2013), 21 pages.

"Final Office Action", U.S. Appl. No. 13/651,287, (May 3, 2013),16 pages.

"First One Handed Fabric Keyboard with Bluetooth Wireless Technology", Retrieved from: <http://press.xtvworld.com/article3817.html> on May 8, 2012,(Jan. 6, 2005), 2 pages.

"Force and Position Sensing Resistors: An Emerging Technology", *Interlink Electronics*, Available at <http://staff.science.uva.nl/~vlaander/docu/FSR/An_Exploring_Technology.pdf>,(Feb. 1990), pp. 1-6.

"Frogpad Introduces Weareable Fabric Keyboard with Bluetooth Technology", Retrieved from: <http://www.geekzone.co.nz/content.asp?contentid=3898> on May 7, 2012,(Jan. 7, 2005), 3 pages.

"i-Interactor electronic pen", Retrieved from: <http://www.alibaba.com/product-gs/331004878/i_Interactor_electronic_pen.html> on Jun. 19, 2012, 5 pages.

"Incipio LG G-Slate Premium Kickstand Case—Black Nylon", Retrieved from: <http://www.amazon.com/Incipio-G-Slate-Premium-Kickstand-Case/dp/B004ZKP916> on May 8, 2012, 4 pages.

"Membrane Keyboards & Membrane Keypads", Retrieved from: <http://www.pannam.com/> on May 9, 2012,(Mar. 4, 2009),2 pages.

"Motion Sensors", *Android Developers*, retrieved from <http://developer.android.com/guide/topics/sensors/sensors_motion.html> on May 25, 2012, 7 pages.

"MPC Fly Music Production Controller", *AKAI Professional*, Retrieved from: <http://www.akaiprompc.com/mpc-fly> on Jul. 9, 2012, 4 pages.

"NI Releases New Maschine & Maschine Mikro", Retrieved from <http://www.djbooth.net/index/dj-equipment/entry/ni-releases-new-maschine-mikro/> on Sep. 17, 2012, 19 pages.

"Non-Final Office Action", U.S. Appl. No. 13/471,001, (Feb. 19, 2013),15 pages.

"Non-Final Office Action", U.S. Appl. No. 13/471,139, (Mar. 21, 2013),12 pages.

"Non-Final Office Action", U.S. Appl. No. 13/471,202, (Feb. 11, 2013),10 pages.

"Non-Final Office Action", U.S. Appl. No. 13/471,336, (Jan. 18, 2013),14 pages.

"Non-Final Office Action", U.S. Appl. No. 13/563,435, (Jun. 14, 2013), 6 pages.

"Non-Final Office Action", U.S. Appl. No. 13/564,520, (Jun. 19, 2013), 8 pages.

"Non-Final Office Action", U.S. Appl. No. 13/565,124, (Jun. 17, 2013), 5 pages.

"Non-Final Office Action", U.S. Appl. No. 13/651,195, (Jan. 2, 2013),14 pages.

"Non-Final Office Action", U.S. Appl. No. 13/651,232, (Jan. 17, 2013),15 pages.

"Non-Final Office Action", U.S. Appl. No. 13/651,272, (Feb. 12, 2013),10 pages.

"Non-Final Office Action", U.S. Appl. No. 13/651,287, (Jan. 29, 2013),13 pages.

"Non-Final Office Action", U.S. Appl. No. 13/651,304, (Mar. 22, 2013), 9 pages.

"Non-Final Office Action", U.S. Appl. No. 13/651,327, (Mar. 22, 2013), 6 pages.

"Non-Final Office Action", U.S. Appl. No. 13/651,726, (Apr. 15, 2013), 6 pages.

"Non-Final Office Action", U.S. Appl. No. 13/651,871, (Mar. 18, 2013),14 pages.

"Non-Final Office Action", U.S. Appl. No. 13/651,871, (Jul. 1, 2013), 5 pages.

"Non-Final Office Action", U.S. Appl. No. 13/651,976, (Feb. 22, 2013),16 pages.

"Non-Final Office Action", U.S. Appl. No. 13/653,321, (Feb. 1, 2013),13 pages.

"Non-Final Office Action", U.S. Appl. No. 13/653,682, (Feb. 7, 2013),11 pages.

"Non-Final Office Action", U.S. Appl. No. 13/653,682, (Jun. 3, 2013),14 pages.

"Non-Final Office Action", U.S. Appl. No. 13/656,055, (Apr. 23, 2013),11 pages.

"Notice of Allowance", U.S. Appl. No. 13/470,633, (Mar. 22, 2013), 7 pages.

"Notice of Allowance", U.S. Appl. No. 13/471,202, (May 28, 2013), 7 pages.

"Notice of Allowance", U.S. Appl. No. 13/651,195, (Jul. 8, 2013), 9 pages.

"Notice of Allowance", U.S. Appl. No. 13/651,272, (May 2, 2013), 7 pages.

"Notice of Allowance", U.S. Appl. No. 13/651,304, (Jul. 1, 2013), 5 pages.

"Notice of Allowance", U.S. Appl. No. 13/651,327, (Jun. 11, 2013), 7 pages.

"Notice of Allowance", U.S. Appl. No. 13/651,726, (May 31, 2013), 5 pages.

"Position Sensors", *Android Developers*, retrieved from <http://developer.android.com/guide/topics/sensors/sensors_position.html> on May 25, 2012, 5 pages.

"Reflex LCD Writing Tablets", retrieved from <http://www.kentdisplays.com/products/lcdwritingtablets.html> on Jun. 27, 2012, 3 pages.

"Restriction Requirement", U.S. Appl. No. 13/471,139, (Jan. 17, 2013), 7 pages.

"Restriction Requirement", U.S. Appl. No. 13/651,304, (Jan. 18, 2013), 7 pages.

"Restriction Requirement", U.S. Appl. No. 13/651,726, (Feb. 22, 2013), 6 pages.

"Restriction Requirement", U.S. Appl. No. 13/651,871, (Feb. 7, 2013), 6 pages.

"SMART Board™ Interactive Display Frame Pencil Pack", Available at <http://downloads01.smarttech.com/media/sitecore/en/support/product/sbfpd/400series(interactivedisplayframes)/guides/smartboardinteractivedisplayframepencilpackv12mar09.pdf>,(2009), 2 pages.

"SolRxTM E-Series Multidirectional Phototherapy ExpandableTM 2-Bulb Full Body Panel System", Retrieved from: < http://www.solarcsystems.com/us_multidirectional_uv_light_therapy_1_intro.html > on Jul. 25, 2012,(2011), 4 pages.

"Tilt Shift Lenses: Perspective Control", retrieved from http://www.cambridgeincolour.com/tutorials/tilt-shift-lenses1.htm, (Mar. 28, 2008), 11 Pages.

(56) References Cited

OTHER PUBLICATIONS

"Virtualization Getting Started Guide", *Red Hat Enterprise Linux 6, Edition 0.2*, retrieved from <http://docs.redhat.com/docs/en-US/Red_Hat_Enterprise_Linux/6/html-single/Virtualization_Getting_Started_Guide/index.html> on Jun. 13, 2012, 24 pages.

"What is Active Alignment?", http://www.kasalis.com/active_alignment.html, retrieved on Nov. 22, 2012, 2 Pages.

Block, Steve et al., "DeviceOrientation Event Specification", *W3C, Editor's Draft*, retrieved from <https://developer.palm.com/content/api/dev-guide/pdk/accessing-device-sensors.html> May 25, 2012,(Jul. 12, 2011),14 pages.

Brown, Rich "Microsoft Shows Off Pressure-Sensitive Keyboard", retrieved from <http://news.cnet.com/8301-17938_105-10304792-1.html> on May 7, 2012, (Aug. 6, 2009), 2 pages.

Butler, Alex et al., "SideSight: Multi-"touch" Interaction around Small Devices", *In the proceedings of the 21st annual ACM symposium on User interface software and technology.*, retrieved from <http://research.microsoft.com/pubs/132534/sidesight_crv3.pdf> on May 29, 2012,(Oct. 19, 2008), 4 pages.

Crider, Michael "Sony Slate Concept Tablet "Grows" a Kickstand", Retrieved from: <http://androidcommunity.com/sony-slate-concept-tablet-grows-a-kickstand-20120116/> on May 4, 2012,(Jan. 16, 2012), 9 pages.

Das, Apurba et al., "Study of Heat Transfer through Multilayer Clothing Assemblies: A Theoretical Prediction", Retrieved from <http://www.autexrj.com/cms/zalaczone_pliki/5_013_11.pdf>, (Jun. 2011),7 pages.

Dietz, Paul H., et al., "A Practical Pressure Sensitive Computer Keyboard", In Proceedings of UIST 2009,(Oct. 2009), 4 pages.

Glatt, Jeff "Channel and Key Pressure (Aftertouch)." Retrieved from: <http://home.roadrunner.com/~jgglatt/tutr/touch.htm> on Jun. 11, 2012, 2 pages.

Hanlon, Mike "ElekTex Smart Fabric Keyboard Goes Wireless", Retrieved from: <http://www.gizmag.com/go/5048/ > on May 7, 2012,(Jan. 15, 2006), 5 pages.

Kaur, Sukhmani "Vincent Liew's redesigned laptop satisfies ergonomic needs", Retrieved from: <http://www.designbuzz.com/entry/vincent-liew-s-redesigned-laptop-satisfies-ergonomic-needs/> on Jul. 27, 2012,(Jun. 21, 2010), 4 pages.

Khuntontong, Puttachat et al., "Fabrication of Molded Interconnection Devices by Ultrasonic Hot Embossing on Thin Polymer Films", IEEE Transactions on Electronics Packaging Manufacturing, vol. 32, No. 3,(Jul. 2009), pp. 152-156.

Linderholm, Owen "Logitech Shows Cloth Keyboard for PDAs", Retrieved from: <http://www.pcworld.com/article/89084/logitech_shows_cloth_keyboard_for_pdas.html> on May 7, 2012,(Mar. 15, 2002), 5 pages.

McLellan, Charles "Eleksen Wireless Fabric Keyboard: a first look", Retrieved from: <http://www.zdnetasia.com/eleksen-wireless-fabric-keyboard-a-first-look-40278954.htm> on May 7, 2012,(Jul. 17, 2006), 9 pages.

Post, E.R. et al., "E-Broidery: Design and Fabrication of Textile-Based Computing", IBM Systems Journal, vol. 39, Issue 3 & 4,(Jul. 2000), pp. 840-860.

Purcher, Jack "Apple is Paving the Way for a New 3D GUI for IOS Devices", Retrieved from: <http://www.patentlyapple.com/patently-apple/2012/01/apple-is-paving-the-way-for-a-new-3d-gui-for-ios-devices.html> on Jun. 4, 2012,(Jan. 12, 2012),15 pages.

Qin, Yongqiang et al., "pPen: Enabling Authenticated Pen and Touch Interaction on Tabletop Surfaces", *In Proceedings of ITS 2010*, Available at <http://www.dfki.de/its2010/papers/pdf/po172.pdf>,(Nov. 2010), pp. 283-284.

Sumimoto, Mark "Touch & Write: Surface Computing With Touch and Pen Input", Retrieved from: <http://www.gottabemobile.com/2009/08/07/touch-write-surface-computing-with-touch-and-pen-input/> on Jun. 19, 2012,(Aug. 7, 2009), 4 pages.

Takamatsu, Seiichi et al., "Flexible Fabric Keyboard with Conductive Polymer-CoatedFibers", In Proceedings of Sensors 2011,(Oct. 28, 2011), 4 pages.

Valliath, G T., "Design of Hologram for Brightness Enhancement in Color LCDs", Retrieved from <http://www.loreti.it/Download/PDF/LCD/44_05.pdf> on Sep. 17, 2012, 5 pages.

Williams, Jim "A Fourth Generation of LCD Backlight Technology", Retrieved from <http://cds.linear.com/docs/Application%20Note/an65f.pdf>, (Nov. 1995),124 pages.

Zhang, et al., "Model-Based Development of Dynamically Adaptive Software", *In Proceedings of ICSE 2006*, Available at <http://www.irisa.fr/lande/lande/icse-proceedings/icse/p371.pdf>,(May 20, 2006), pp. 371-380.

"Corrected Notice of Allowance", U.S. Appl. No. 13/651,232, Jul. 31, 2014, 2 pages.

"Corrected Notice of Allowance", U.S. Appl. No. 13/939,032, Jul. 15, 2014, 2 pages.

"Final Office Action", U.S. Appl. No. 13/471,376, Aug. 18, 2014, 24 pages.

"Final Office Action", U.S. Appl. No. 13/595,700, Aug. 15, 2014, 6 pages.

"Final Office Action", U.S. Appl. No. 13/599,635, Aug. 8, 2014, 16 pages.

"International Search Report and Written Opinion", Application No. PCT/US2013/028483, Jun. 24, 2014, 10 pages.

"International Search Report and Written Opinion", Application No. PCT/US2013/028484, Jun. 24, 2014, 10 pages.

"International Search Report and Written Opinion", Application No. PCT/US2013/028485, Jun. 25, 2014, 10 pages.

"International Search Report and Written Opinion", Application No. PCT/US2013/028769, Jun. 26, 2014, 10 pages.

"International Search Report and Written Opinion", Application No. PCT/US2013/028771, Jun. 19, 2014, 10 pages.

"International Search Report and Written Opinion", Application No. PCT/US2013/028486, Jun. 20, 2014, 10 pages.

"International Search Report and Written Opinion", Application No. PCT/US2013/041017, Jul. 17, 2014, 10 pages.

"International Search Report and Written Opinion", Application No. PCT/US2013/028489, Jun. 20, 2014, 11 pages.

"International Search Report and Written Opinion", Application No. PCT/US2013/028488, Jun. 24, 2014, 11 pages.

"International Search Report and Written Opinion", Application No. PCT/US2013/028767, Jun. 24, 2014, 11 pages.

"International Search Report and Written Opinion", Application No. PCT/US2013/028481, Jun. 19, 2014, 11 pages.

"International Search Report and Written Opinion", Application No. PCT/US2013/028490, Jun. 24, 2014, 11 pages.

"International Search Report and Written Opinion", Application No. PCT/US2013/028766, Jun. 26, 2014, 11 pages.

"International Search Report and Written Opinion", Application No. PCT/US2013/028772, Jun. 30, 2014, 11 pages.

"International Search Report and Written Opinion", Application No. PCT/US2013/028768, Jun. 24, 2014, 12 pages.

"International Search Report and Written Opinion", Application No. PCT/US2013/028482, Jun. 20, 2014, 13 pages.

"International Search Report and Written Opinion", Application No. PCT/US2013/028487, May 27, 2014, 9 pages.

"International Search Report and Written Opinion", Application No. PCT/US2013/028770, Jun. 26, 2014, 9 pages.

"Non-Final Office Action", U.S. Appl. No. 13/471,412, Jul. 11, 2014, 22 pages.

"The Microsoft Surface Tablets Comes With Impressive Design and Specs", Retrieved at <<http://microsofttabletreview.com/the-microsoft-surface-tablets-comes-with-impressive-design-and-specs>>, Retrieved Date: Jan. 29, 2013, pp. 2.

"Cirago Slim Case®—Protective case with built-in kickstand for your iPhone 5®", Retrieved at <<http://cirago.com/wordpress/wp-content/uploads/2012/10/ipc1500brochure1.pdf>>, Retrieved Date: Jan. 29, 2013, p. 1.

"Corrected Notice of Allowance", U.S. Appl. No. 13/651,327, (Sep. 12, 2013), 2 pages.

"Corrected Notice of Allowance", U.S. Appl. No. 13/651,726, (Sep. 17, 2013), 2 pages.

"Final Office Action", U.S. Appl. No. 13/471,001, (Jul. 25, 2013), 20 pages.

(56) References Cited

OTHER PUBLICATIONS

"Final Office Action", U.S. Appl. No. 13/471,139, (Sep. 16, 2013),13 pages.
"Final Office Action", U.S. Appl. No. 13/471,336, (Aug. 28, 2013),18 pages.
"Final Office Action", U.S. Appl. No. 13/651,976, (Jul. 25, 2013), 21 pages.
"Final Office Action", U.S. Appl. No. 13/653,321, (Aug. 2, 2013),17 pages.
"Non-Final Office Action", U.S. Appl. No. 13/527,263, (Jul. 19, 2013), 5 pages.
"Non-Final Office Action", U.S. Appl. No. 13/938,930, (Aug. 29, 2013), 9 pages.
"Non-Final Office Action", U.S. Appl. No. 13/939,002, (Aug. 28, 2013), 6 pages.
"Non-Final Office Action", U.S. Appl. No. 13/939,032, (Aug. 29, 2013), 7 pages.
"PCT Search Report and Written Opinion", Application No. PCT/US2013/029461, (Jun. 21, 2013),11 pages.
"PCT Search Report and Written Opinion", Application No. PCT/US2013/028948, (Jun. 21, 2013),11 pages.
"Advanced Configuration and Power Management Specification", *Intel Corporation, Microsoft Corporation, Toshiba Corp. Revision 1*, (Dec. 22, 1996), 364 pages.
"Basic Cam Motion Curves", Retrieved From: <http://ocw.metu.edu.tr/pluginfile.php/6886/mod_resource/content/1/ch8/8-3.htm> Nov. 22, 2013, Middle East Technical University,(1999), 14 Pages.
"Corrected Notice of Allowance", U.S. Appl. No. 13/651,327, (Sep. 23, 2013), 2 pages.
"Final Office Action", U.S. Appl. No. 13/653,682, (Oct. 18, 2013),16 pages.
"Final Office Action", U.S. Appl. No. 13/656,055, (Oct. 23, 2013),14 pages.
"Final Office Action", U.S. Appl. No. 13/938,930, (Nov. 8, 2013),10 pages.
"Final Office Action", U.S. Appl. No. 13/939,002, (Nov. 8, 2013), 7 pages.
"International Search Report and Written Opinion", Application No. PCT/US2013/040968, (Sep. 5, 2013),12 pages.
"International Search Report and Written Opinion", Application No. PCT/US2013/042550, (Sep. 24, 2013),14 pages.
"Non-Final Office Action", U.S. Appl. No. 13/780,228, (Oct. 30, 2013),12 pages.
"Notice of Allowance", U.S. Appl. No. 13/563,435, (Nov. 12, 2013), 5 pages.
"Notice of Allowance", U.S. Appl. No. 13/651,871, (Oct. 2, 2013), 7 pages.
"Notice to Grant", CN Application No. 201320097089.9, (Sep. 29, 2013), 2 Pages.
"Notice to Grant", CN Application No. 201320097124.7, (Oct. 8, 2013), 2 pages.
"Restriction Requirement", U.S. Appl. No. 13/468,918, (Nov. 29, 2013), 6 pages.
"Teach Me Simply", Retrieved From: <http://techmesimply.blogspot.in/2013/05/yugatech_3.html> on Nov. 22, 2013, (May 3, 2013), pp. 1-6.
"Welcome to Windows 7", Retrieved from: <http://www.microsoft.com/en-us/downloaded/confirmation.aspx?id=4984> on Aug. 1, 2013, (Sep. 16, 2009), 3 pages.
Chavan, Umesh et al., "Synthesis, Design and Analysis of a Novel Variable Lift Cam Follower System", *In Proceedings: International Journal of Desingn Engineering*, vol. 3, Issue 4, Inderscience Publishers,(Jun. 3, 2010),1 Page.
Justin, "Seidio Active with Kickstand for the Galaxy SIII", Retrieved From: <http://www.t3chniq.com/seidio-active-with-kickstand-gs3/> on Nov. 22, 2013, (Jan. 3, 2013), 5 Pages.
Lahr, Derek "Development of a Novel Cam-based Infinitely Variable Transmission", *Proceedings: In Thesis of Master of Science in Mechanical Engineering*, Virginia Polytechnic Institute and State University,(Nov. 6, 2009), 91 pages.

Lambert, Steve B., "Cam Design", *In Proceedings: Kinematics and dynamics of Machine*, University of Waterloo Department of Mechanical Engineering,(Jul. 2, 2002), pp. 51-60.
Prospero, Michael "Samsung Outs Series 5 Hybrid PC Tablet", Retrieved from: <http://blog.laptopmag.com/samsung-outs-series-5-hybrid-pc-tablet-running-windows-8> on Oct. 31, 2013, (Jun. 4, 2012), 7 pages.
Sanap, Suresh et al., "Design and Analysis of Globoidal Cam Index Drive", *Proceedings: In International Journal of Scientific Research Engineering & Technology*, (Jun. 2013), 6 Pages.
Siddiqui, Kabir "Hinge Mechanism for Rotatable Component Attachment", U.S. Appl. No. 13/852,848, (Mar. 28, 2013), 51 pages.
"Corrected Notice of Allowance", U.S. Appl. No. 13/471,030, Sep. 30, 2014, 2 pages.
"Corrected Notice of Allowance", U.S. Appl. No. 14/199,924, Sep. 19, 2014, 2 pages.
"Final Office Action", U.S. Appl. No. 13/468,949, Oct. 6, 2014, 11 pages.
"Final Office Action", U.S. Appl. No. 13/471,054, Oct. 23, 2014, 17 pages.
"Final Office Action", U.S. Appl. No. 13/471,336, Oct. 6, 2014, 13 pages.
"Final Office Action", U.S. Appl. No. 13/492,232, Nov. 17, 2014, 13 pages.
"Final Office Action", U.S. Appl. No. 13/595,700, Oct. 9, 2014, 8 pages.
"Final Office Action", U.S. Appl. No. 14/200,595, Nov. 19, 2014, 5 pages.
"International Search Report and Written Opinion", Application No. PCT/US2014/043546, Oct. 9, 2014, 10 pages.
"Non-Final Office Action", U.S. Appl. No. 13/471,393, Oct. 20, 2014, 12 pages.
"Non-Final Office Action", U.S. Appl. No. 13/525,614, Nov. 24, 2014, 19 pages.
"Non-Final Office Action", U.S. Appl. No. 13/780,228, Sep. 15, 2014, 18 pages.
"Notice of Allowance", U.S. Appl. No. 13/653,682, Sep. 24, 2014, 4 pages.
"Restriction Requirement", U.S. Appl. No. 14/147,252, Dec. 1, 2014, 6 pages.
Harrison, "UIST 2009 Student Innovation Contest-Demo Video", Retrieved From: <https://www.youtube.com/watch?v=PDI8eYIASf0> Sep. 16, 2014, Jul. 23, 2009, 1 pages.
"Corrected Notice of Allowance", U.S. Appl. No. 13/651,287, Aug. 21, 2014, 2 pages.
"Corrected Notice of Allowance", U.S. Appl. No. 14/199,924, Aug. 29, 2014, 2 pages.
"Corrected Notice of Allowance", U.S. Appl. No. 14/199,924, Sep. 5, 2014, 2 pages.
"Final Office Action", U.S. Appl. No. 13/656,055, Sep. 17, 2014, 10 pages.
"Foreign Notice of Allowance", CN Application No. 201320097065.3, Nov. 21, 2013, 2 pages.
"Foreign Office Action", CN Application No. 201320097065.3, Jun. 18, 2013, 2 pages.
"Non-Final Office Action", U.S. Appl. No. 13/471,282, Sep. 3, 2014, 13 pages.
"Non-Final Office Action", U.S. Appl. No. 14/063,912, Sep. 2, 2014, 11 pages.
"Notice of Allowance", U.S. Appl. No. 13/471,030, Sep. 5, 2014, 6 pages.
"Notice of Allowance", U.S. Appl. No. 14/277,240, Sep. 16, 2014, 4 pages.
"Supplemental Notice of Allowance", U.S. Appl. No. 13/471,405, Aug. 29, 2014, 5 pages.
"Advisory Action", U.S. Appl. No. 13/939,032, Feb. 24, 2014, 2 pages.
"Corrected Notice of Allowance", U.S. Appl. No. 13/563,435, Mar. 20, 2014, 2 pages.
"Corrected Notice of Allowance", U.S. Appl. No. 13/565,124, Apr. 3, 2014, 4 pages.
"Final Office Action", U.S. Appl. No. 13/780,228, Mar. 28, 2014, 13 pages.

(56) References Cited

OTHER PUBLICATIONS

"Foreign Office Action", CN Application No. 201320328022.1, Feb. 17, 2014, 4 Pages.
"Foreign Office Action", CN Application No. 201320328022.1, Oct. 18, 2013, 3 Pages.
"Non-Final Office Action", U.S. Appl. No. 13/599,635, Feb. 25, 2014, 13 pages.
"Non-Final Office Action", U.S. Appl. No. 13/471,186, Feb. 27, 2014, 8 pages.
"Non-Final Office Action", U.S. Appl. No. 13/471,237, Mar. 24, 2014, 7 pages.
"Non-Final Office Action", U.S. Appl. No. 13/471,376, Apr. 2, 2014, 17 pages.
"Non-Final Office Action", U.S. Appl. No. 13/471,405, Feb. 20, 2014, 37 pages.
"Non-Final Office Action", U.S. Appl. No. 13/527,263, Apr. 3, 2014, 6 pages.
"Non-Final Office Action", U.S. Appl. No. 13/564,520, Feb. 14, 2014, 5 pages.
"Non-Final Office Action", U.S. Appl. No. 13/653,682, Feb. 26, 2014, 10 pages.
"Non-Final Office Action", U.S. Appl. No. 13/656,055, Mar. 12, 2014, 17 pages.
"Notice of Allowance", U.S. Appl. No. 13/471,139, Mar. 17, 2014, 4 pages.
"Notice of Allowance", U.S. Appl. No. 13/938,930, Feb. 20, 2014, 4 pages.
"Notice of Allowance", U.S. Appl. No. 13/939,002, Mar. 3, 2014, 4 pages.
"Notice of Allowance", U.S. Appl. No. 13/939,032, Apr. 3, 2014, 4 pages.
"Supplemental Notice of Allowance", U.S. Appl. No. 13/653,321, Mar. 28, 2014, 4 pages.
"Final Office Action", U.S. Appl. No. 13/468,882, Feb. 12, 2015, 9 pages.
"First Examination Report", NZ Application No. 628690, Nov. 27, 2014, 2 pages.
"Non-Final Office Action", U.S. Appl. No. 13/492,232, Feb. 24, 2015, 12 pages.
"Non-Final Office Action", U.S. Appl. No. 13/599,635, Feb. 12, 2015, 16 pages.
"Non-Final Office Action", U.S. Appl. No. 14/147,252, Feb. 23, 2015, 11 pages.
"Notice of Allowance", U.S. Appl. No. 14/200,595, Feb. 17, 2015, 2 pages.
"Notice of Allowance", U.S. Appl. No. 14/200,595, Feb. 25, 2015, 4 pages.
"Non-Final Office Action", U.S. Appl. No. 14/063,912, Jan. 2, 2014, 10 pages.
"FingerWorks Installation and Operation Guide for the TouchStream ST and TouchStream LP", FingerWorks, Inc. Retrieved from <http://ec1.images-amazon.com/media/i3d/01/A/man-migrate/MANUAL000049862.pdf>, 2002, 14 pages.
"Non-Final Office Action", U.S. Appl. No. 13/651,232, Dec. 5, 2013, 15 pages.
"Non-Final Office Action", U.S. Appl. No. 13/468,918, Dec. 26, 2013, 18 pages.
"Corrected Notice of Allowance", U.S. Appl. No. 13/563,435, Jan. 14, 2014, 2 pages.
"Corrected Notice of Allowance", U.S. Appl. No. 13/563,435, Jan. 22, 2014, 2 pages.
"Notice of Allowance", U.S. Appl. No. 13/653,321, Dec. 18, 2013, 4 pages.
"Foreign Office Action", CN Application No. 201320097066.8, Oct. 24, 2013, 5 Pages.
"Non-Final Office Action", U.S. Appl. No. 13/939,002, Dec. 20, 2013, 5 pages.
"Final Office Action", U.S. Appl. No. 13/939,032, Dec. 20, 2013, 5 pages.
"Notice of Allowance", U.S. Appl. No. 13/565,124, Dec. 24, 2013, 6 pages.
"Final Office Action", U.S. Appl. No. 13/564,520, Jan. 15, 2014, 7 pages.
"Corrected Notice of Allowance", U.S. Appl. No. 14/277,240, Jan. 8, 2015, 2 pages.
"Final Office Action", U.S. Appl. No. 13/470,951, Jan. 12, 2015, 20 pages.
"Final Office Action", U.S. Appl. No. 13/471,412, Dec. 15, 2014, 11 pages.
"Final Office Action", U.S. Appl. No. 13/527,263, Jan. 27, 2015, 7 pages.
"Final Office Action", U.S. Appl. No. 14/063,912, Jan. 12, 2015, 12 pages.
"Final Office Action", U.S. Appl. No. 14/225,276, Dec. 17, 2014, 6 pages.
"Foreign Office Action", CN Application No. 201320097079.5, Jul. 28, 2014, 4 pages.
"Non-Final Office Action", U.S. Appl. No. 13/471,030, Jan. 15, 2015, 7 pages.
"Non-Final Office Action", U.S. Appl. No. 13/564,520, Jan. 26, 2015, 6 pages.
"Notice of Allowance", U.S. Appl. No. 13/595,700, Jan. 21, 2015, 4 pages.
"Notice of Allowance", U.S. Appl. No. 13/651,976, Jan. 21, 2015, 10 pages.
"Supplemental Notice of Allowance", U.S. Appl. No. 13/471,405, Dec. 17, 2014, 5 pages.
"Corrected Notice of Allowance", U.S. Appl. No. 13/651,232, Apr. 24, 2015, 2 pages.
"Corrected Notice of Allowance", U.S. Appl. No. 13/651,232, Jun. 10, 2015, 2 pages.
"Corrected Notice of Allowance", U.S. Appl. No. 13/656,055, Apr. 13, 2015, 2 pages.
"Corrected Notice of Allowance", U.S. Appl. No. 14/200,595, Jun. 4, 2015, 3 pages.
"Final Office Action", U.S. Appl. No. 13/525,614, Apr. 29, 2015, 20 pages.
"Final Office Action", U.S. Appl. No. 13/780,228, Apr. 10, 2015, 19 pages.
"Final Office Action", U.S. Appl. No. 14/225,250, Mar. 13, 2015, 7 pages.
"Foreign Notice on Reexamination", CN Application No. 201320097066.8, Apr. 3, 2015, 7 Pages.
"Foreign Office Action", CN Application No. 201310067808.7, May 28, 2015, 14 Pages.
"Non-Final Office Action", U.S. Appl. No. 13/471,054, Mar. 13, 2015, 18 pages.
"Non-Final Office Action", U.S. Appl. No. 13/471,336, Jun. 24, 2015, 15 pages.
"Non-Final Office Action", U.S. Appl. No. 13/471,376, Mar. 27, 2015, 28 pages.
"Non-Final Office Action", U.S. Appl. No. 13/471,393, Mar. 26, 2015, 13 pages.
"Non-Final Office Action", U.S. Appl. No. 13/471,412, Jun. 1, 2015, 31 pages.
"Non-Final Office Action", U.S. Appl. No. 14/059,280, Mar. 3, 2015, 18 pages.
"Non-Final Office Action", U.S. Appl. No. 14/063,912, May 7, 2015, 12 pages.
"Non-Final Office Action", U.S. Appl. No. 14/225,276, Apr. 23, 2015, 7 pages.
"Notice of Allowance", U.S. Appl. No. 13/468,949, Apr. 24, 2015, 9 pages.
"Notice of Allowance", U.S. Appl. No. 13/468,918, Apr. 8, 2015, 7 pages.
"Notice of Allowance", U.S. Appl. No. 13/468,949, Apr. 24, 2015, 8 pages.
"Notice of Allowance", U.S. Appl. No. 13/471,030, Apr. 6, 2015, 6 pages.
"Notice of Allowance", U.S. Appl. No. 13/471,282, Apr. 30, 2015, 8 pages.

(56) References Cited

OTHER PUBLICATIONS

"Notice of Allowance", U.S. Appl. No. 13/564,520, May 8, 2015, 4 pages.
"Notice of Allowance", U.S. Appl. No. 13/651,232, Mar. 30, 2015, 7 pages.
"Notice of Allowance", U.S. Appl. No. 13/656,055, Mar. 4, 2015, 7 pages.
"Notice of Allowance", U.S. Appl. No. 14/225,276, Jun. 22, 2015, 4 pages.
"Supplemental Notice of Allowance", U.S. Appl. No. 13/468,918, Jun. 4, 2015, 2 pages.
"Supplemental Notice of Allowance", U.S. Appl. No. 13/468,949, Jun. 5, 2015, 2 pages.
"Supplemental Notice of Allowance", U.S. Appl. No. 13/595,700, Apr. 10, 2015, 2 pages.
"Supplemental Notice of Allowance", U.S. Appl. No. 13/595,700, May 4, 2015, 2 pages.
"Supplemental Notice of Allowance", U.S. Appl. No. 13/595,700, May 22, 2015, 2 pages.
"Supplemental Notice of Allowance", U.S. Appl. No. 13/656,055, May 15, 2015, 2 pages.
"Supplemental Notice of Allowance", U.S. Appl. No. 13/656,055, Jun. 10, 2015, 2 pages.
Schafer,"Using Interactive Maps for Navigation and Collaboration", CHI '01 Extended Abstracts on Human Factors in Computing Systems, Mar. 31, 2001, 2 pages.
"Advisory Action", U.S. Appl. No. 13/471,376, Sep. 23, 2015, 7 pages.
"Advisory Action", U.S. Appl. No. 14/059,280, Sep. 25, 2015, 7 pages.
"Corrected Notice of Allowance", U.S. Appl. No. 13/564,520, Sep. 17, 2015, 2 pages.
"Corrected Notice of Allowance", U.S. Appl. No. 14/225,276, Aug. 27, 2015, 2 pages.
"Corrected Notice of Allowance", U.S. Appl. No. 14/225,276, Sep. 29, 2015, 2 pages.
"Corrected Notice of Allowance", U.S. Appl. No. 14/457,881, Aug. 20, 2015, 2 pages.
"Corrected Notice of Allowance", U.S. Appl. No. 14/457,881, Oct. 2, 2015, 2 pages.
"Decision on Reexamination", CN Application No. 201320097079.5, Sep. 7, 2015, 8 Pages.
"Extended European Search Report", EP Application No. 13858620.1, Sep. 18, 2015, 6 pages.
"Extended European Search Report", EP Application No. 13858834.8, Oct. 29, 2015, 8 pages.
"Extended European Search Report", EP Application No. 13859280.3, Sep. 7, 2015, 6 pages.
"Extended European Search Report", EP Application No. 13859406.4, Sep. 8, 2015, 6 pages.
"Final Office Action", U.S. Appl. No. 13/689,541, Nov. 2, 2015, 21 pages.
"Final Office Action", U.S. Appl. No. 14/063,912, Sep. 3, 2015, 13 pages.
"Foreign Office Action", CN Application No. 201310067385.9, Aug. 6, 2015, 16 pages.
"Foreign Office Action", CN Application No. 201310067592.4, Oct. 23, 2015, 12 Pages.
"Foreign Office Action", CN Application No. 201310067627.4, Sep. 28, 2015, 14 pages.
"Foreign Office Action", CN Application No. 201310096345.7, Oct. 19, 2015, 16 Pages.
"Foreign Office Action", CN Application No. 201310316114.2, Sep. 29, 2015, 13 pages.
"Non-Final Office Action", U.S. Appl. No. 13/470,951, Oct. 1, 2015, 29 pages.
"Non-Final Office Action", U.S. Appl. No. 13/471,393, Sep. 30, 2015, 15 pages.
"Non-Final Office Action", U.S. Appl. No. 13/780,228, Sep. 18, 2015, 19 pages.
"Non-Final Office Action", U.S. Appl. No. 14/162,529, Sep. 18, 2015, 13 pages.
"Non-Final Office Action", U.S. Appl. No. 14/225,250, Aug. 19, 2015, 9 pages.
"Non-Final Office Action", U.S. Appl. No. 14/225,276, Aug. 19, 2015, 9 pages.
"Notice of Allowance", U.S. Appl. No. 13/471,054, Sep. 25, 2015, 7 pages.
"Notice of Allowance", U.S. Appl. No. 14/727,001, Oct. 2, 2015, 4 pages.
"Supplemental Notice of Allowance", U.S. Appl. No. 13/468,949, Sep. 14, 2015, 2 pages.
"Corrected Notice of Allowance", U.S. Appl. No. 13/471,030, Aug. 10, 2015, 2 pages.
"Corrected Notice of Allowance", U.S. Appl. No. 13/564,520, Aug. 14, 2015, 2 pages.
"Corrected Notice of Allowance", U.S. Appl. No. 13/651,232, Jul. 6, 2015, 2 pages.
"Corrected Notice of Allowance", U.S. Appl. No. 13/656,055, Jul. 1, 2015, 2 pages.
"Final Office Action", U.S. Appl. No. 13/471,376, Jul. 28, 2015, 35 pages.
"Final Office Action", U.S. Appl. No. 13/492,232, Jul. 10, 2015, 11 pages.
"Final Office Action", U.S. Appl. No. 13/599,635, Jul. 30, 2015, 23 pages.
"Final Office Action", U.S. Appl. No. 14/059,280, Jul. 22, 2015, 25 pages.
"Final Office Action", U.S. Appl. No. 14/147,252, Jun. 25, 2015, 11 pages.
"Foreign Office Action", CN Application No. 201310067335.0, Jun. 12, 2015, 15 Pages.
"Foreign Office Action", CN Application No. 201310225788.1, Jun. 23, 2015, 14 Pages.
"International Preliminary Report on Patentability", Application No. PCT/US2014/031531, Jun. 9, 2015, 7 pages.
"Non-Final Office Action", U.S. Appl. No. 13/525,614, Jul. 31, 2015, 20 pages.
"Non-Final Office Action", U.S. Appl. No. 14/727,001, Jul. 10, 2015, 7 pages.
"Notice of Allowance", U.S. Appl. No. 14/457,881, Jul. 22, 2015, 7 pages.
"Supplemental Notice of Allowance", U.S. Appl. No. 13/468,918, Aug. 7, 2015, 4 pages.
Cunningham,"Software Infrastructure for Natural Language Processing", In Proceedings of the fifth conference on Applied natural language processing, Mar. 31, 1997, pp. 237-244.
"Corrected Notice of Allowance", U.S. Appl. No. 13/471,054, Jan. 11, 2016, 2 pages.
"Corrected Notice of Allowance", U.S. Appl. No. 13/527,263, Jan. 4, 2016, 2 pages.
"Corrected Notice of Allowance", U.S. Appl. No. 13/527,263, Jan. 11, 2016, 2 pages.
"Corrected Notice of Allowance", U.S. Appl. No. 14/727,001, Dec. 15, 2015, 2 pages.
"Extended European Search Report", EP Application No. 13858283.8, Nov. 23, 2015, 10 pages.
"Extended European Search Report", EP Application No. 13858397.6, Nov. 30, 2015, 7 pages.
"Extended European Search Report", EP Application No. 13858674.8, Nov. 27, 2015, 6 pages.
"Extended European Search Report", EP Application No. 13860272.7, Dec. 14, 2015, 9 pages.
"Extended European Search Report", EP Application No. 13861292.4, Nov. 23, 2015, 7 pages.
"Final Office Action", U.S. Appl. No. 13/471,336, Dec. 10, 2015, 17 pages.
"Foreign Office Action", CN Application No. 201310065273.X, Oct. 28, 2015, 14 pages.
"Foreign Office Action", CN Application No. 201310067373.6, Dec. 23, 2015, 15 Pages.
"Foreign Office Action", CN Application No. 201310067429.8, Nov. 25, 2015, 12 Pages.

(56) References Cited

OTHER PUBLICATIONS

"Foreign Office Action", CN Application No. 201310067622.1, Oct. 27, 2015, 14 pages.
"Foreign Office Action", CN Application No. 201310067631.0, Dec. 10, 2015, 11 Pages.
"Foreign Office Action", CN Application No. 201310067641.4, Dec. 30, 2015, 12 Pages.
"Foreign Office Action", CN Application No. 201310067808.7, Jan. 7, 2016, 6 Pages.
"International Search Report and Written Opinion", Application No. PCT/US2015/052757, Dec. 4, 2015, 12 pages.
"Non-Final Office Action", U.S. Appl. No. 13/468,882, Nov. 13, 2015, 9 pages.
"Non-Final Office Action", U.S. Appl. No. 13/492,232, Dec. 17, 2015, 11 pages.
"Notice of Allowance", U.S. Appl. No. 13/471,376, Nov. 23, 2015, 9 pages.
"Notice of Allowance", U.S. Appl. No. 13/471,412, Nov. 20, 2015, 10 pages.
"Notice of Allowance", U.S. Appl. No. 13/527,263, Dec. 9, 2015, 6 pages.
"Notice of Allowance", U.S. Appl. No. 14/059,280, Nov. 23, 2015, 9 pages.
"Notice of Allowance", U.S. Appl. No. 14/166,596, Dec. 4, 2015, 15 pages.
"Notice of Allowance", U.S. Appl. No. 14/727,001, Dec. 15, 2015, 2 pages.
"Restriction Requirement", U.S. Appl. No. 14/794,182, Dec. 22, 2015, 6 pages.
"Supplemental Notice of Allowance", U.S. Appl. No. 13/471,054, Nov. 19, 2015, 2 pages.
"Supplementary European Search Report", EP Application No. 13728568.0, Oct. 30, 2015, 7 pages.
"Corrected Notice of Allowance", U.S. Appl. No. 13/471,412, Feb. 16, 2016, 2 pages.
"Corrected Notice of Allowance", U.S. Appl. No. 14/727,001, Jan. 25, 2016, 2 pages.
"Extended European Search Report", EP Application No. 13857958.6, Dec. 18, 2015, 8 pages.
"Extended European Search Report", EP Application No. 13860836.9, Nov. 27, 2015, 9 pages.
"Final Office Action", U.S. Appl. No. 14/225,250, Jan. 29, 2016, 10 pages.
"Restriction Requirement", U.S. Appl. No. 14/502,867, Feb. 16, 2016, 7 pages.

* cited by examiner

HINGE MECHANISM FOR ROTATABLE COMPONENT ATTACHMENT

BACKGROUND

Mobile computing devices have been developed to increase the functionality that is made available to users in a mobile setting. For example, a user may interact with a mobile phone, tablet computer, or other mobile computing device to check email, surf the web, compose texts, interact with applications, and so on.

Because mobile computing devices are configured to be mobile, however, the devices are typically designed to be used in a handheld manner. Typical ways of adapting mobile devices for other uses (e.g., on a table or other surface) tend to be awkward and detract from the mobile aesthetic associated with mobile devices.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A hinge mechanism for rotatable component attachment is described. In at least some implementations, the hinge mechanism enables a support component to be adjustably attached to an apparatus, such as a computing device. For example, the hinge mechanism can be employed to rotatably attach a kickstand to a mobile computing device. The kickstand can be rotated via the hinge mechanism to various positions to provide support for different orientations of the computing device. For example, the kickstand can be positioned to support the computing device in a typing orientation such that input can be provided via an associated input device. As another example, the kickstand can be positioned to enable viewing and/or interaction with the computing device, such as in a portrait viewing orientation.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items. Entities represented in the figures may be indicative of one or more entities and thus reference may be made interchangeably to single or plural forms of the entities in the discussion.

DETAILED DESCRIPTION

Overview

A variety of different devices may be physically attached to a mobile computing device to provide a variety of functionality. For example, a device may be configured to provide a cover for at least a display device of the computing device to protect it against harm. Other devices may also be physically attached to the mobile computing device, such as an input device (e.g., keyboard having a track pad) to provide inputs to the computing device. Further, functionality of these devices may be combined, such as to provide a combination cover and input device.

A hinge mechanism for rotatable component attachment is described. In at least some implementations, the hinge mechanism enables a support component to be adjustably attached to an apparatus, such as a computing device. For example, the hinge mechanism can be employed to rotatably attach a kickstand to a mobile computing device. The kickstand can be rotated via the hinge mechanism to various positions to provide support for different orientations of the computing device. For example, the kickstand can be positioned to support the computing device in a typing orientation such that input can be provided via an associated input device. As another example, the kickstand can be positioned to enable viewing and/or interaction with the computing device, such as in a portrait viewing orientation.

In at least some embodiments, a hinge mechanism utilizes preset hinge positions that enable a kickstand to be placed at different preset positions. Further, an example hinge mechanism includes a center of rotation that coincides with a seam between abutting edges of the kickstand and the computing device. Thus, the kickstand can conform to a contour of the computing device when in a closed position, and the seam can be maintained when the kickstand is open.

In the following discussion, an example environment is first described that may employ the techniques described herein. Embodiments discussed herein are not limited to the example environment, and the example environment is not limited to embodiments discussed herein. Next, example device orientations are discussed in accordance with one or more embodiments. Following this, an example kickstand is described in accordance with one or more embodiments. Next, example hinges for kickstand attachment are discussed in accordance with one or more embodiments. Finally, an example system and device are discussed that may implement various techniques described herein. Further, although an input device is described herein, other devices are also contemplated that do not include input functionality, such as Covers.

Example Environment

Figure 1:
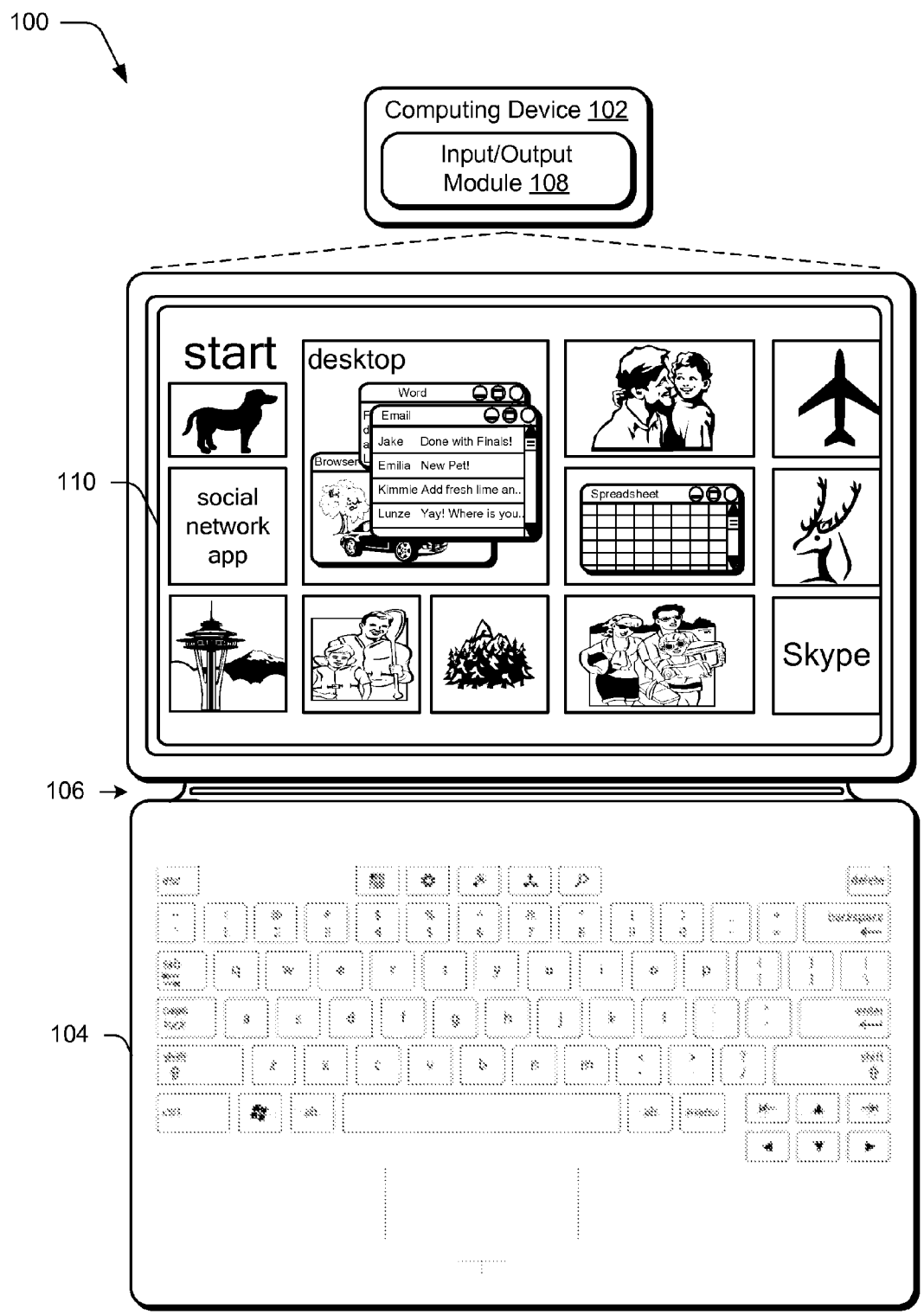
FIG. 1 is an illustration of an environment in an example implementation that is operable to employ the techniques described herein in accordance with one or more embodiments.

FIG. 1 is an illustration of an environment 100 in an example implementation that is operable to employ the techniques described herein. The illustrated environment 100 includes an example of a computing device 102 that is physically and communicatively coupled to an input device 104 via a flexible hinge 106. The computing device 102 may be configured in a variety of ways. For example, the computing device 102 may be configured for mobile use, such as a mobile phone, a tablet computer as illustrated, and so on. Thus, the computing device 102 may range from full resource devices with substantial memory and processor resources to a low-resource device with limited memory and/or processing resources. The computing device 102 may also relate to software that causes the computing device 102 to perform one or more operations. An example implementation of the computing device 102 is discussed below with reference to FIG. 35.

The computing device 102, for instance, is illustrated as including an input/output module 108. The input/output module 108 is representative of functionality relating to processing of inputs and rendering outputs of the computing device 102. A variety of different inputs may be processed by the input/output module 108, such as inputs relating to functions that correspond to keys of the input device 104, keys of a virtual keyboard displayed by the display device 110 to identify gestures and cause operations to be performed that correspond to the gestures that may be recognized through the input device 104 and/or touchscreen functionality of the display device 110, and so forth. Thus, the input/output module 108 may support a variety of different input techniques by recognizing and leveraging a division between types of inputs including key presses, gestures, and so on.

In the illustrated example, the input device 104 is configured as having an input portion that includes a keyboard having a QWERTY arrangement of keys and track pad although other arrangements of keys are also contemplated. Further, other non-conventional configurations are also contemplated, such as a game controller, configuration to mimic a musical instrument, and so forth. Thus, the input device 104 and keys incorporated by the input device 104 may assume a variety of different configurations to support a variety of different functionality.

As previously described, the input device 104 is physically and communicatively coupled to the computing device 102 in this example through use of a flexible hinge 106. The flexible hinge 106 is flexible in that rotational movement supported by the hinge is achieved through flexing (e.g., bending) of the material forming the hinge as opposed to mechanical rotation as supported by a pin, although that embodiment is also contemplated. Further, this flexible rotation may be configured to support movement in one or more directions (e.g., vertically in the figure) yet restrict movement in other directions, such as lateral movement of the input device 104 in relation to the computing device 102. This may be used to support consistent alignment of the input device 104 in relation to the computing device 102, such as to align sensors used to change power states, application states, and so on.

The flexible hinge 106, for instance, may be formed using one or more layers of fabric and include conductors formed as flexible traces to communicatively couple the input device 104 to the computing device 102 and vice versa. This communication, for instance, may be used to communicate a result of a key press to the computing device 102, receive power from the computing device, perform authentication, provide supplemental power to the computing device 102, and so on. The flexible hinge 106 may be configured in a variety of ways, further discussion of which may be found in relation to the following figure.

Figure 2:
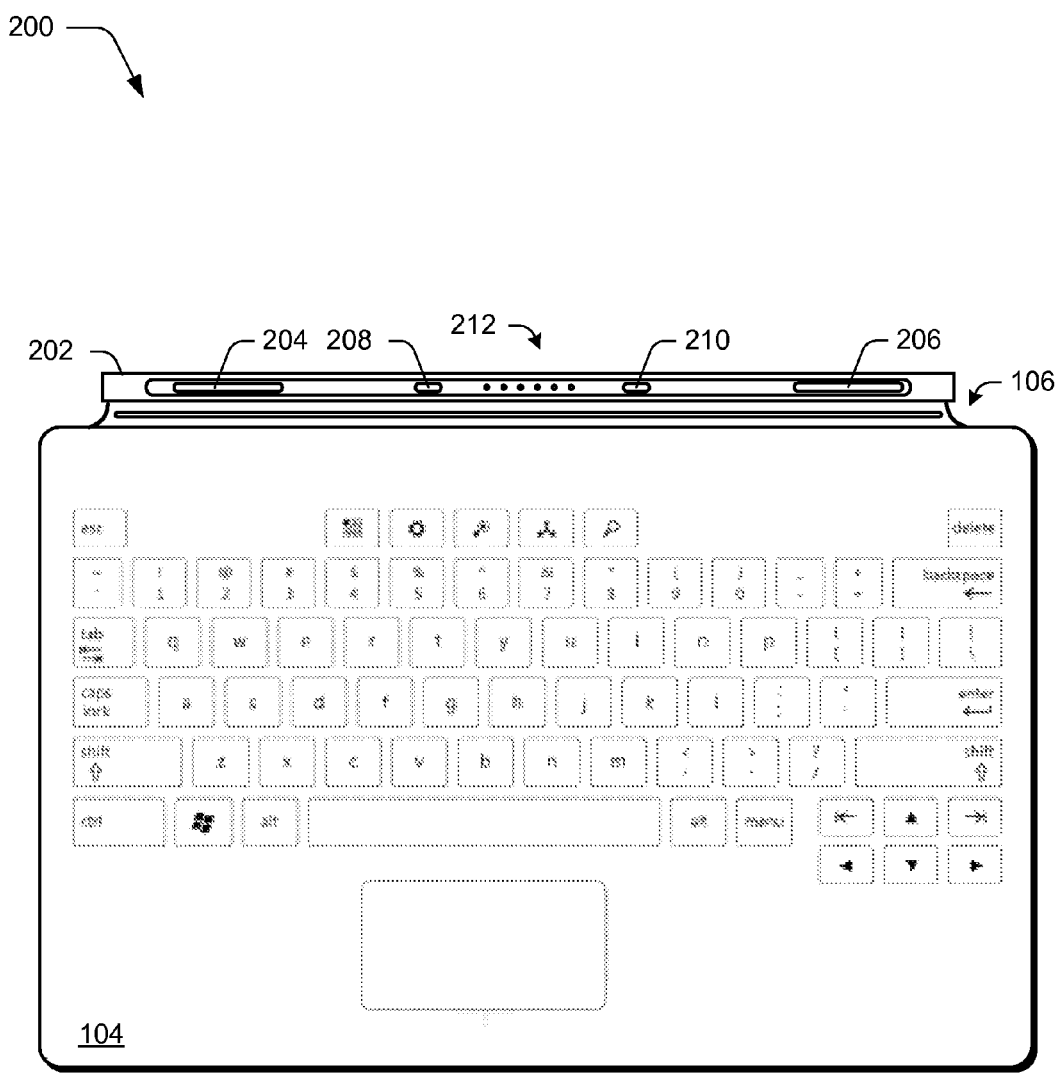
FIG. 2 depicts an example implementation of an input device of FIG. 1 as showing a flexible hinge in greater detail in accordance with one or more embodiments.

FIG. 2 depicts an example implementation 200 of the input device 104 of FIG. 1 as showing the flexible hinge 106 in greater detail. In this example, a connection portion 202 of the input device is shown that is configured to provide a communicative and physical connection between the input device 104 and the computing device 102. The connection portion 202 as illustrated has a height and cross section configured to be received in a channel in the housing of the computing device 102, although this arrangement may also be reversed without departing from the spirit and scope thereof.

The connection portion 202 is flexibly connected to a portion of the input device 104 that includes the keys through use of the flexible hinge 106. Thus, when the connection portion 202 is physically connected to the computing device the combination of the connection portion 202 and the flexible hinge 106 supports movement of the input device 104 in relation to the computing device 102 that is similar to a hinge of a book.

The connection portion 202 is illustrated in this example as including magnetic coupling devices 204, 206, mechanical coupling protrusions 208, 210, and communication contacts 212. The magnetic coupling devices 204, 206 are configured to magnetically couple to complementary magnetic coupling devices of the computing device 102 through use of one or more magnets. In this way, the input device 104 may be physically secured to the computing device 102 through use of magnetic attraction.

The connection portion 202 also includes mechanical coupling protrusions 208, 210 to form a mechanical physical connection between the input device 104 and the computing device 102. The communication contacts 212 are configured to contact corresponding communication contacts of the computing device 102 to form a communicative coupling between the devices as shown.

Example Device Orientations

Figure 3:
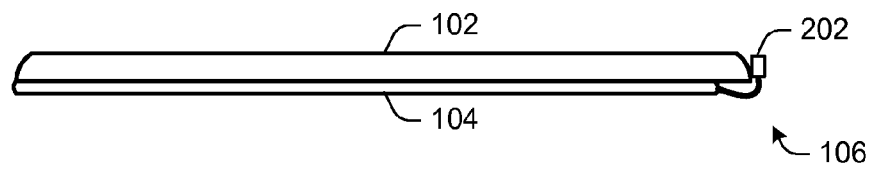
FIG. 3 depicts an example orientation of the input device in relation to the computing device as covering a display device of the computing device in accordance with one or more embodiments.

Through rotational movement of the flexible hinge 106, a variety of different orientations of the input device 104 in relation to the computing device 102 may be supported. For example, rotational movement may be supported by the flexible hinge 106 such that the input device 104 may be placed against the display device 110 of the computing device 102 and thereby act as a cover as shown in the example orientation 300 of FIG. 3. Thus, the input device 104 may act to protect the display device 110 of the computing device 102 from harm.

Figure 4:
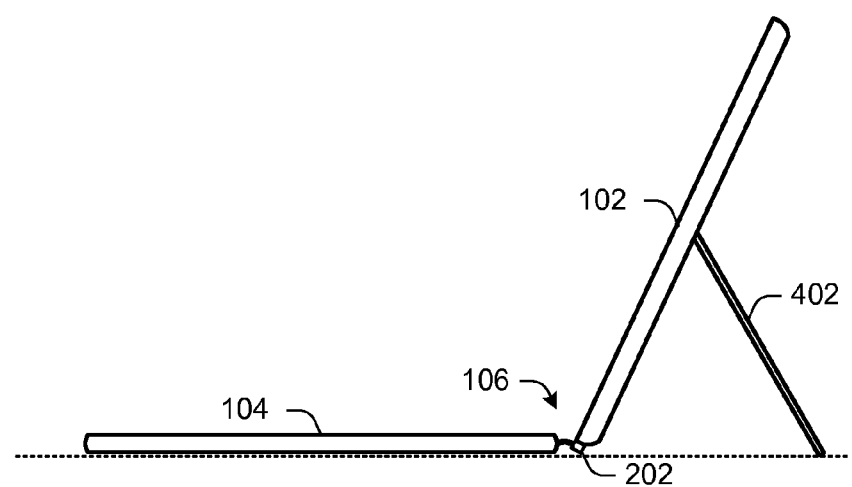
FIG. 4 depicts an example orientation of the input device in relation to the computing device as assuming a typing orientation in accordance with one or more embodiments.

As shown in the example orientation 400 of FIG. 4, a typing arrangement may be supported. In this orientation, the input device 104 is laid flat against a surface and the computing device 102 is disposed at an angle to permit viewing of the display device 110, e.g., such as through use of a kickstand 402 disposed on a rear surface of the computing device 102.

Figure 5:
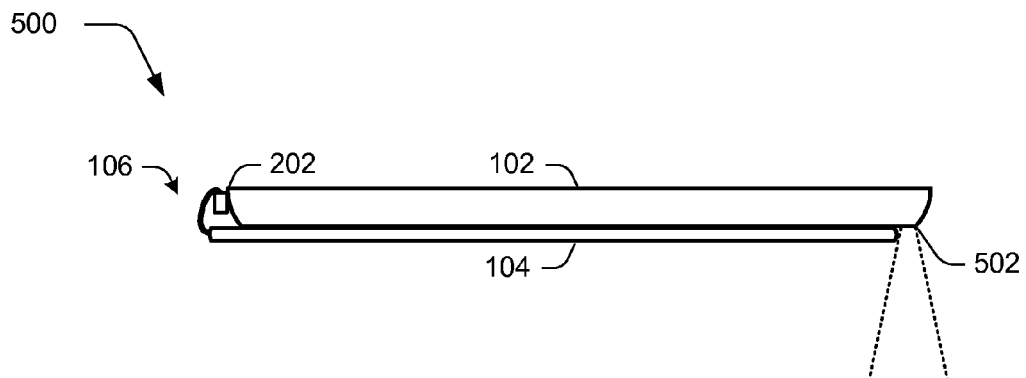
FIG. 5 depicts an example orientation of the input device in relation to the computing device as covering a rear housing of the computing device 102 and exposing a display device of the computing device in accordance with one or more embodiments.

In the example orientation 500 of FIG. 5, the input device 104 may also be rotated so as to be disposed against a back of the computing device 102, e.g., against a rear housing of the computing device 102 that is disposed opposite the display device 110 on the computing device 102. In this example, through orientation of the connection portion 202 to the computing device 102, the flexible hinge 106 is caused to "wrap around" the connection portion 202 to position the input device 104 at the rear of the computing device 102.

This wrapping causes a portion of a rear of the computing device 102 to remain exposed. This may be leveraged for a variety of functionality, such as to permit a camera 502 positioned on the rear of the computing device 102 to be used even though a significant portion of the rear of the computing device 102 is covered by the input device 104 in this example orientation 500. Although configuration of the input device 104 to cover a single side of the computing device 102 at any one time was described above, other configurations are also contemplated.

Figure 6:
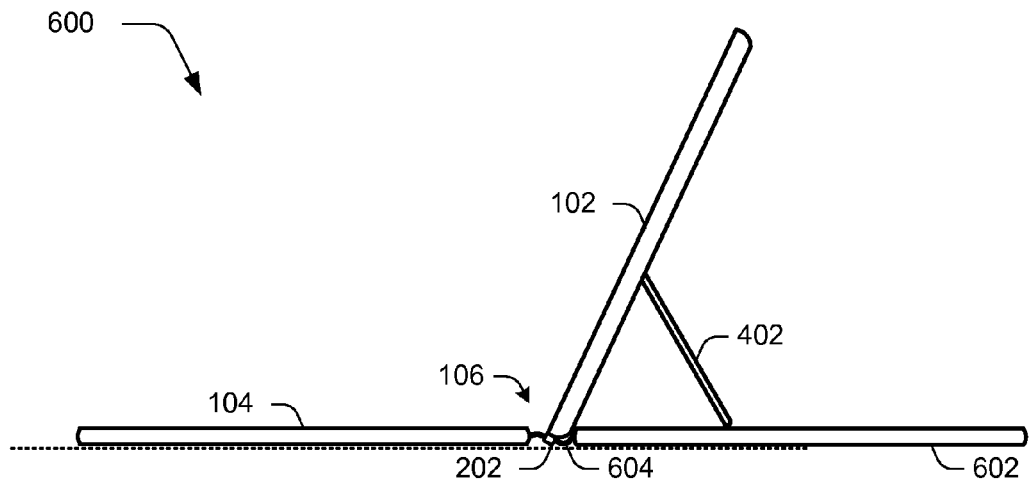
FIG. 6 depicts an example orientation of the input device as including a portion configured to cover a rear of the computing device, which in this instance is used to support a kickstand of the computing device in accordance with one or more embodiments.

In the example orientation 600 of FIG. 6, the input device 104 is illustrated as including a portion 602 configured to cover a rear of the computing device. This portion 602 is also connected to the connection portion 202 using a flexible hinge 604.

The example orientation 600 of FIG. 6 also illustrates a typing arrangement in which the input device 104 is laid flat against a surface and the computing device 102 is disposed at an angle to permit viewing of the display device 110. This is supported through use of the kickstand 402 disposed on a rear surface of the computing device 102 to contact the portion 602 in this example.

Figure 7:
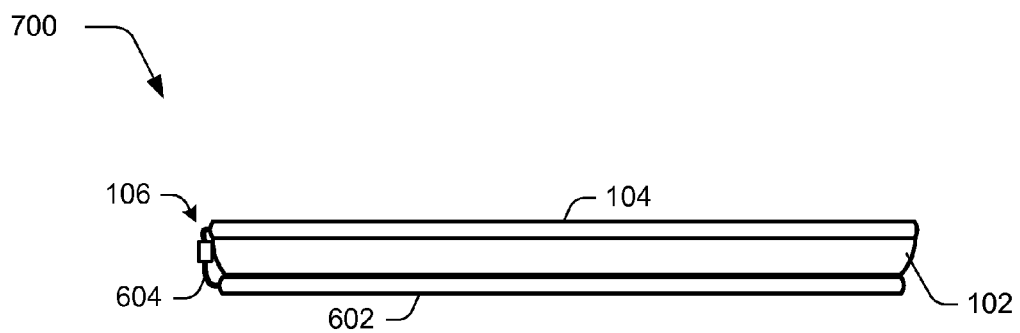
FIG. 7 depicts an example orientation in which the input device including the portion of FIG. 6 are used to cover both the front and back of the computing device in accordance with one or more embodiments.

FIG. 7 depicts an example orientation 700 in which the input device 104 including the portion 602 are used to cover both the front (e.g., display device 110) and back (e.g., opposing side of the housing from the display device) of the computing device 102. In one or more implementations, electrical and other connectors may also be disposed along the sides of the computing device 102 and/or the input device 104, e.g., to provide auxiliary power when closed.

Naturally, a variety of other orientations are also supported. For instance, the computing device 102 and input device 104 may assume an arrangement such that both are laid flat against a surface as shown in FIG. 1. Other instances are also contemplated, such as a tripod arrangement, meeting arrangement, presentation arrangement, and so forth.

Kickstand

The described kickstand can be employed to enable a variety of different orientations for the computing device 102. For instance, consider the following implementations of a kickstand in accordance with various embodiments.

Figure 8:
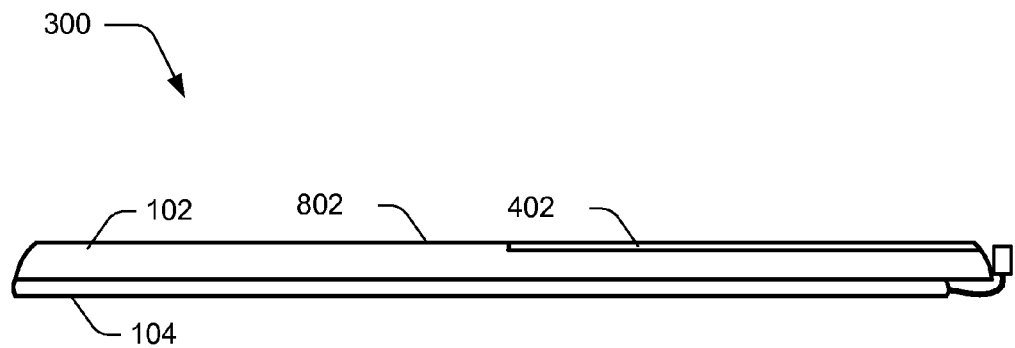
FIG. 8 depicts an example orientation of a computing device with a kickstand in accordance with one or more embodiments.

FIG. 8 illustrates the orientation 300, and includes the kickstand 402 in a closed position. In the closed position, the kickstand 402 forms a portion of a rear surface 802 of the computing device 102 such that the kickstand 402 conforms to a surface contour of the computing device 102. For instance, when the kickstand 402 is in the closed position, the kickstand 402 integrates into the computing device 102 and does not protrude from a plane formed by the rear surface 802.

Figure 9:
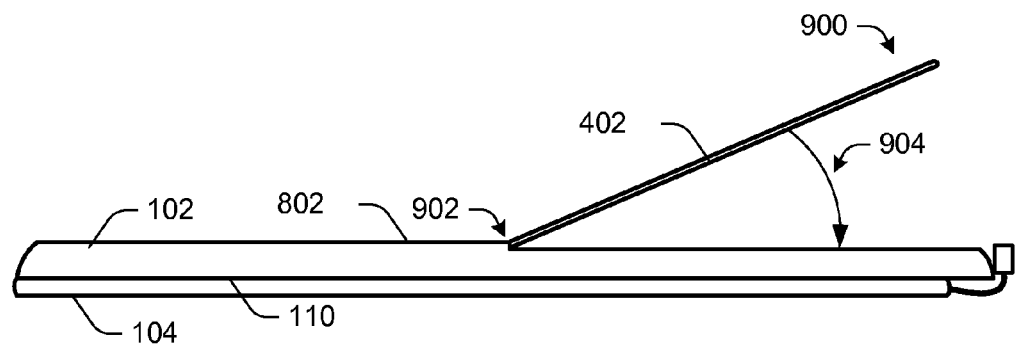
FIG. 9 depicts an example orientation of a computing device with a kickstand in accordance with one or more embodiments.

FIG. 9 illustrates that the kickstand 402 can be rotated away from the rear surface 802 of the computing device 102 to a position 900. For instance, the kickstand 402 can be rotatably attached to the computing device 102 along a seam 902 via a hinge mechanism. Examples of such a hinge mechanism are detailed below.

In at least some implementations, the position 900 corresponds to a preset position for the kickstand 402. For instance, when a user applies pressure to the kickstand 402 away from the rear surface 802, the kickstand 402 can snap into the position 900. As detailed below, a hinge mechanism employed to attach the kickstand 402 to the computing device 102 can utilize spring pressure and detent settings to provide preset open positions for the kickstand 402. In this example, the position 900 is associated with an angle 904 between the rear surface of the computing device 102, and the kickstand 402. For instance, the angle 904 can range from 20 degrees (20°) to 30 degrees) (30°). Any suitable range of angles may be employed, however.

With the kickstand 402 in the position 900, the computing device 102 can be rotated away from the input device 104 and supported by the kickstand 402, such as illustrated in the orientation 400 of FIG. 4. Thus, the position 900 can enable the display device 110 to be viewed, and input to be provided to the computing device 102 via the input device 104.

Figure 10:
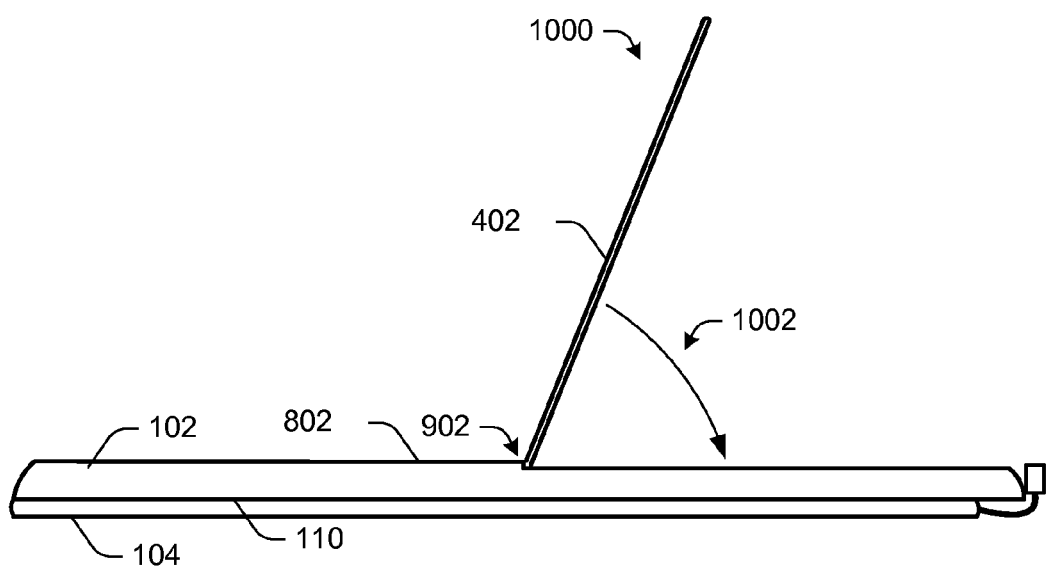
FIG. 10 depicts an example orientation of a computing device with a kickstand in accordance with one or more embodiments.

FIG. 10 illustrates that the kickstand 402 can be rotated away from the rear surface 802 of the computing device 102 to a position 1000. For instance, the kickstand 402 can be rotated further past the position 900 to the position 1000.

In at least some implementations, the position 1000 corresponds to a preset position for the kickstand 402. For example, when a user applies pressure to the kickstand 402 away from the rear surface 802, the kickstand 402 can snap into the position 1000. In this example, the position 1000 is associated with an angle 1002 between the rear surface of the computing device 102, and the kickstand 402. For instance, the angle 1002 can range from 65 degrees (65°) to 75 degrees (75°). Any suitable range of angles may be employed, however. Further, the seam 902 can be maintained (e.g., the width of the seam) during rotation to the position 1000.

With the kickstand 402 in the position 1000, the computing device 102 can be rotated sideways (e.g., to a portrait viewing position) and supported via the kickstand 402. For instance, consider an orientation 1100 illustrated in FIG. 11.

Figure 11:
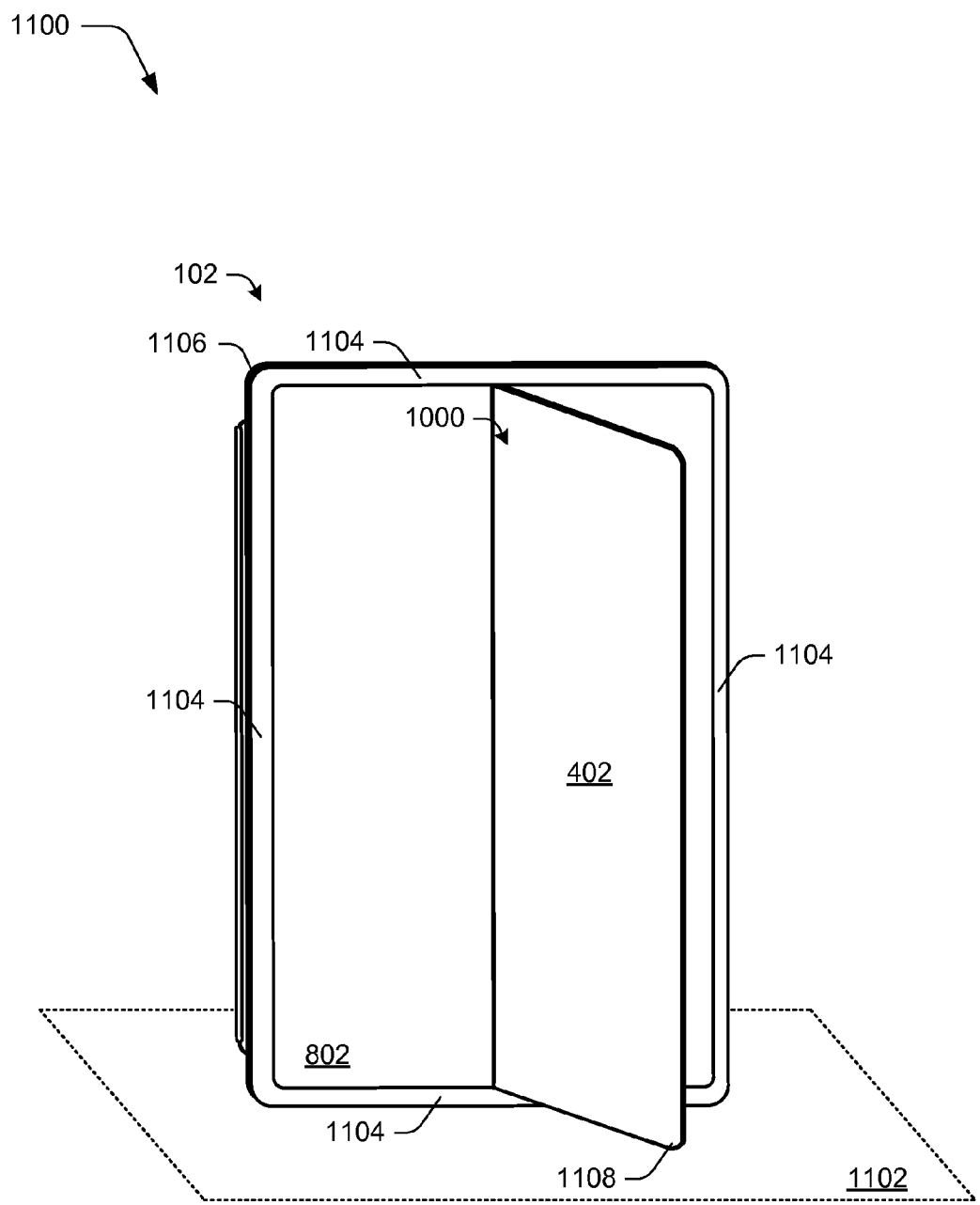
FIG. 11 depicts a rear view of an example orientation of a computing device with a kickstand in accordance with one or more embodiments.

FIG. 11 illustrates a rear view of the computing device 102 in the orientation 1100, showing that the computing device 102 is rotated to a portrait viewing position, such as 90 degrees (90°) to the orientation illustrated in FIG. 1. Further, the kickstand 402 is positioned in the position 1000 such that the computing device 102 reclines back and is supported by the kickstand 402 on a surface 1102. Although not illustrated here, placing the computing device 102 in the orientation 1100 can cause a view orientation of the display device 110 to be rotated to a portrait view.

In FIG. 11, the computing device 102 is illustrated without the input device 104. Thus, in at least some embodiments the input device 104 can be separated from the computing device 102 such that the computing device 102 has functionality independent of the input device 104. For example, the flexible hinge 106 can employ a magnetic attachment mechanism that holds the input device 104 to the computing device 102 via magnetic force. Thus, a user can grasp the computing device 102 and the input device 104, and can pull the two apart by overcoming the magnetic attraction between them.

When separate from the input device 104, the computing device 102 can provide various functionality. For example, a user can view content via the computing device 102, such as movies and/or streaming content. Further, a user can interact with touch screen functionality of the display device 110. Thus, placing the kickstand 402 in the position 1000 can enable a user to place the computing device in a portrait orientation, and to view and/or interact with the computing device in such an orientation.

As further illustrated in FIG. 11, the computing device 102 includes a beveled edge 1104 between the rear surface 802 and a front surface 1106. The beveled edge 1104 is angled such that the width of the rear surface 802 is narrower than the width of a front surface 1106. The kickstand 402 is integrated into the rear surface 802, and has substantially the same width as the rear surface 802. Thus, the kickstand 402 has a narrower width than the front surface 1106.

Accordingly, when the computing device is positioned in the orientation 1100, and the kickstand 402 is placed in the position 1000, the computing device 102 leans back away from the front surface 1106 and rests on a corner 1108 of the kickstand 402. The corner 1108 can employ some form of cushioning material to reduce sliding of the corner 1108 on the surface 1102, and to reduce the transmission of vibrations between the surface 1102 and the computing device 102.

Figure 12:
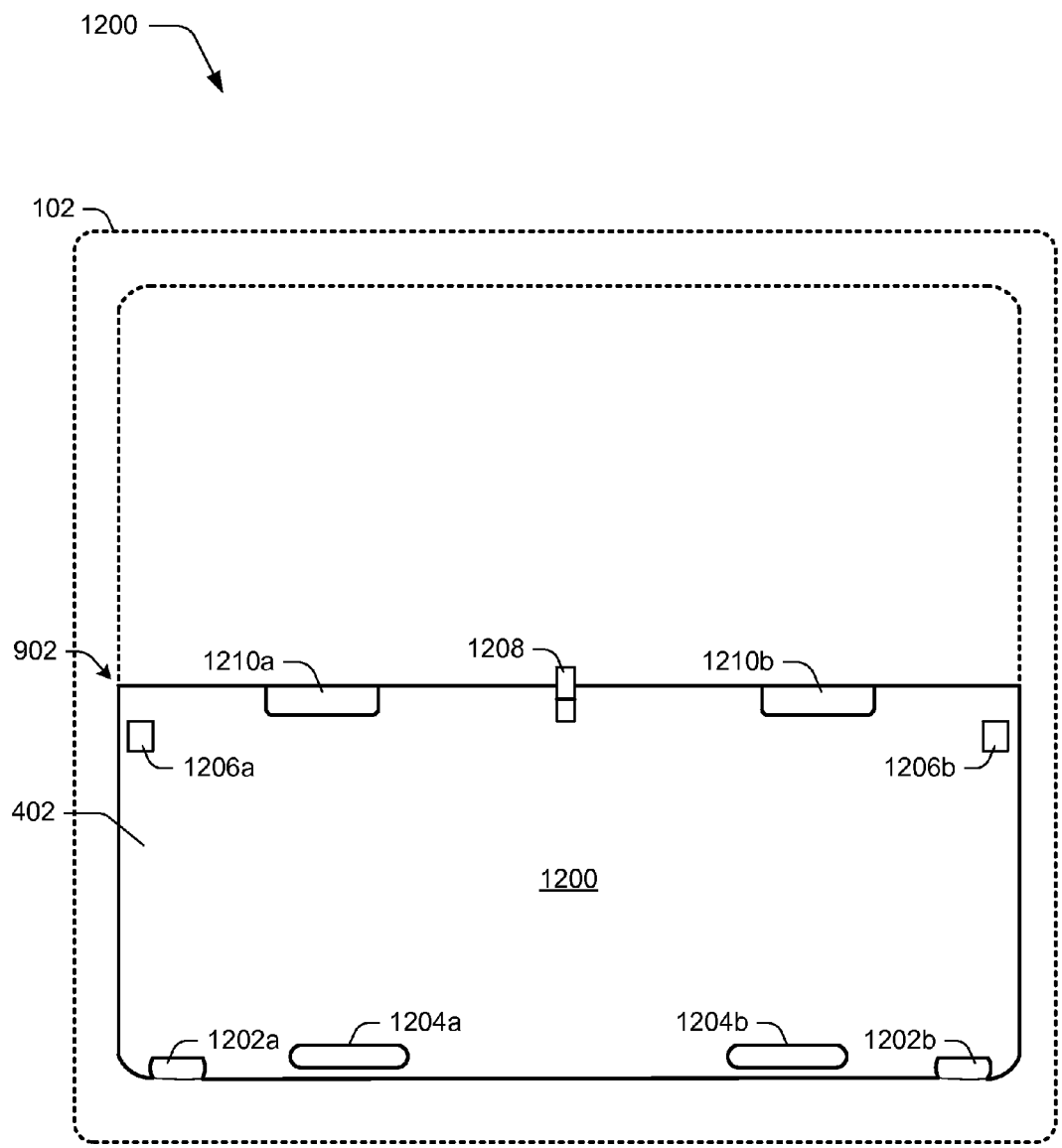
FIG. 12 depicts an example inner surface of a kickstand in accordance with one or more embodiments.

FIG. 12 illustrates a view of an inner surface 1200 of the kickstand 402 in accordance with one or more embodiments. In this example, the kickstand 402 is illustrated in the context of an outline of the computing device 102.

The inner surface 1200 includes surface contacts 1202*a* and 1202*b*, which function as surface contact points when the kickstand 402 is in an open position. The surface contacts 1202*a*, 1202*b* can be formed using a variety of types of skid-resistant materials, and can be positioned within a notch in the inner surface 1200. For example, the surface contacts 1202*a*, 1202*b* can be formed from an elastic material and can be substantially dovetail shaped such that the surface contacts can be held within a notch in the rear surface 1200 via elastic pressure. Additionally or alternatively, the surface contacts 1202*a*, 1022*b* can be affixed to the inner surface 1200 via a suitable adhesive.

The surface contacts 1202*a*, 1202*b* are positioned on a bottom edge of the kickstand 402 such that when the kickstand 402 is open and resting on a surface, the surface contacts 1202*a*, 1202*b* serve as insulators between the kickstand 402 and the surface. For example, the surface contacts 1202*a*, 1202*b* can reduce the transmission of vibrations between the kickstand 402 and an adjacent surface. Further, the surface contacts 1202*a*, 1202*b* can reduce slippage of the kickstand 402 on a surface. For instance, the surface contacts 1202*a*, 1202*b* can be formed from a rubberized material that resists slippage on a variety of different surfaces. Thus, when the computing device 102 is supported by the kickstand 402 (e.g., in the orientation 400 discussed above), the surface contacts 1202*a*, 1202*b* can assist in stabilizing the computing device 102 and reduce noise that can be caused by vibration of the kickstand 402 on a surface.

Further included on the inner surface 1200 are a stabilizer plate 1204*a* and a stabilizer plate 1204*b*, which are placed along a lower edge of the inner surface 1200 and formed from a material (e.g., ferromagnetic) that is attracted to a magnetic field. When the kickstand 402 is in a closed position, the stabilizer plates 1204*a*, 1204*b* are attracted to magnets placed along an adjacent edge of the computing device 102. Thus, in the closed position the magnetic force exerted by the magnets on the stabilizer plates 1204*a*, 1204*b* can assist in holding the lower edge of the kickstand 402 against the computing device 102.

The inner surface 1200 further includes peripheral hinge mounts 1206*a*, 1206*b*, which function as mounting points for hinge mechanisms that are employed to attach the kickstand 402 to the computing device 102. Examples of hinge mechanisms are discussed below. A center hinge key 1208 is also included, which functions as slidable attachment to a center hinge employed between the kickstand 402 and the computing device 102.

A damper 1210*a* and a damper 1210*b* are fastened (e.g., using a suitable adhesive) to the inner surface 1200, and function to suppress vibration of the kickstand 402. For example, the dampers 1210*a*, 1210*b* can be formed from a material that absorbs and/or dissipates vibrations of the kickstand 402. Examples of such materials include urethane foam, rubber, neoprene, silicone, and so on. Thus, the dampers 1210*a*, 1210*b* can reduce noise caused by vibration of the kickstand 402, such as when the kickstand 402 is being opened and closed.

Hinges for Component Attachment

A variety of different hinge mechanisms can be employed for attaching various components in accordance with various embodiments. Some example hinge mechanisms and hinge arrangements are discussed below.

Figure 13:
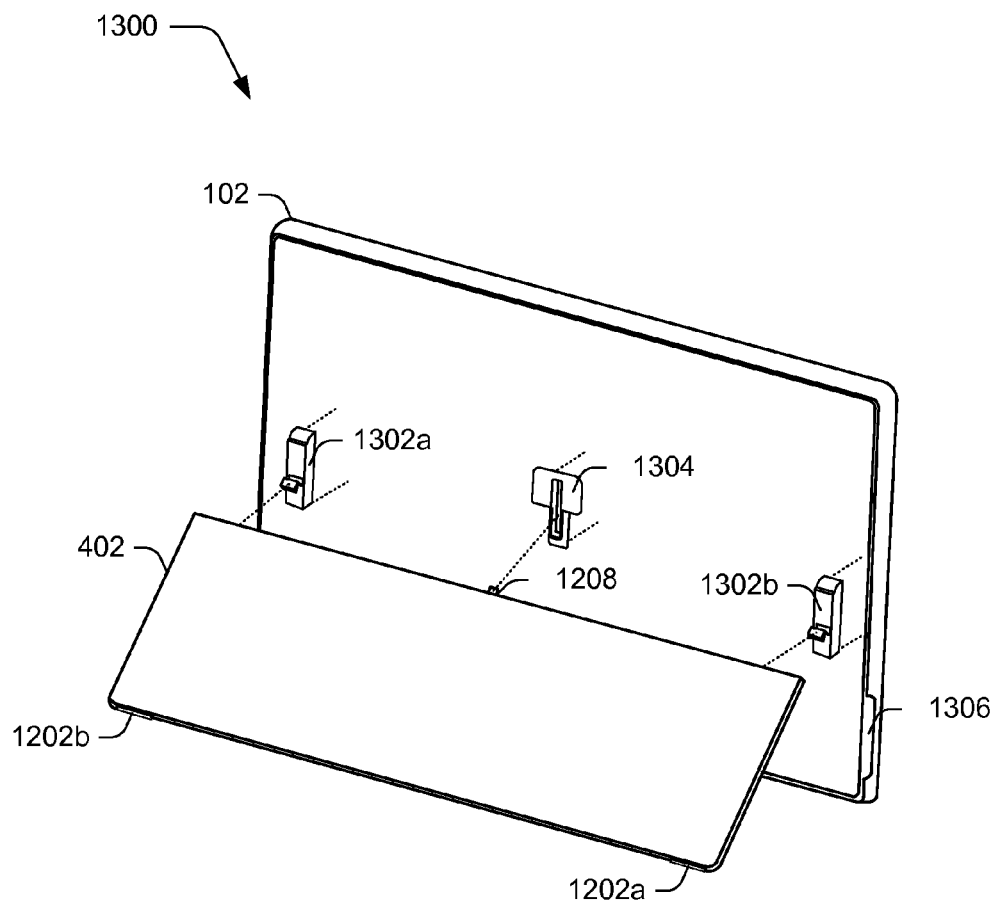
FIG. 13 depicts an example exploded view of a computing device with a kickstand in accordance with one or more embodiments.

FIG. 13 illustrates an exploded rear view 1300 of the computing device 102 and the kickstand 402. Included in the rear view 1300 are peripheral hinges 1302*a* and 1302*b*, which can be employed to attach the kickstand 402 to the computing device 102. The peripheral hinges 1302*a*, 1302*b* are configured to be installed internally in the computing device 102, such as via a suitable attachment method and/or device.

The kickstand 402 can be attached to a pivoting portion of the peripheral hinges 1302a, 1302b via the peripheral hinge mounts 1206a, 1206b, discussed above with reference to FIG. 12. Thus, attachment to the peripheral hinges 1302a, 1302b enables the kickstand 402 to pivot between various positions with reference to the computing device 102.

Further illustrated is a center hinge 1304, which is also configured to be installed internally in the computing device 102, such as via a suitable attachment method and/or device. The center hinge key 1208 of the kickstand 402 can be engaged in the center hinge 1304.

The peripheral hinges 1302a, 1302b and the center hinge 1304 are installed in the computing device 102 such that when the kickstand 402 is rotated on the hinges to a closed position, the hinges are not visible and the kickstand 402 forms a smooth contour with the chassis of the computing device 102. For example, see the closed position illustrated and discussed with reference to FIG. 8.

Also illustrated in the rear view 1300 are the surface contacts 1202a, 1202b. As discussed above, the surface contacts 1202a, 1202b can stabilize the kickstand 402 and the computing device 102 when the kickstand 402 is in an open position and resting on a surface. In at least some embodiments, the surface contacts 1202a, 1202b are positioned in a groove in an inner surface of the kickstand 402 such that the surface contacts 1202a, 1202b are not externally visible when the kickstand 402 is in a closed position.

To assist a user in opening the kickstand 402 from a closed position, a notch 1306 is formed in an edge of the computing device 102. For instance, the notch 1306 can enable a user to insert a small portion of a finger behind the closed kickstand 402, and apply pressure to rotate the kickstand 402 to an open position. Additionally or alternatively, a notch can be formed in an edge of the kickstand 402 to assist in opening the kickstand 402.

Figure 14:
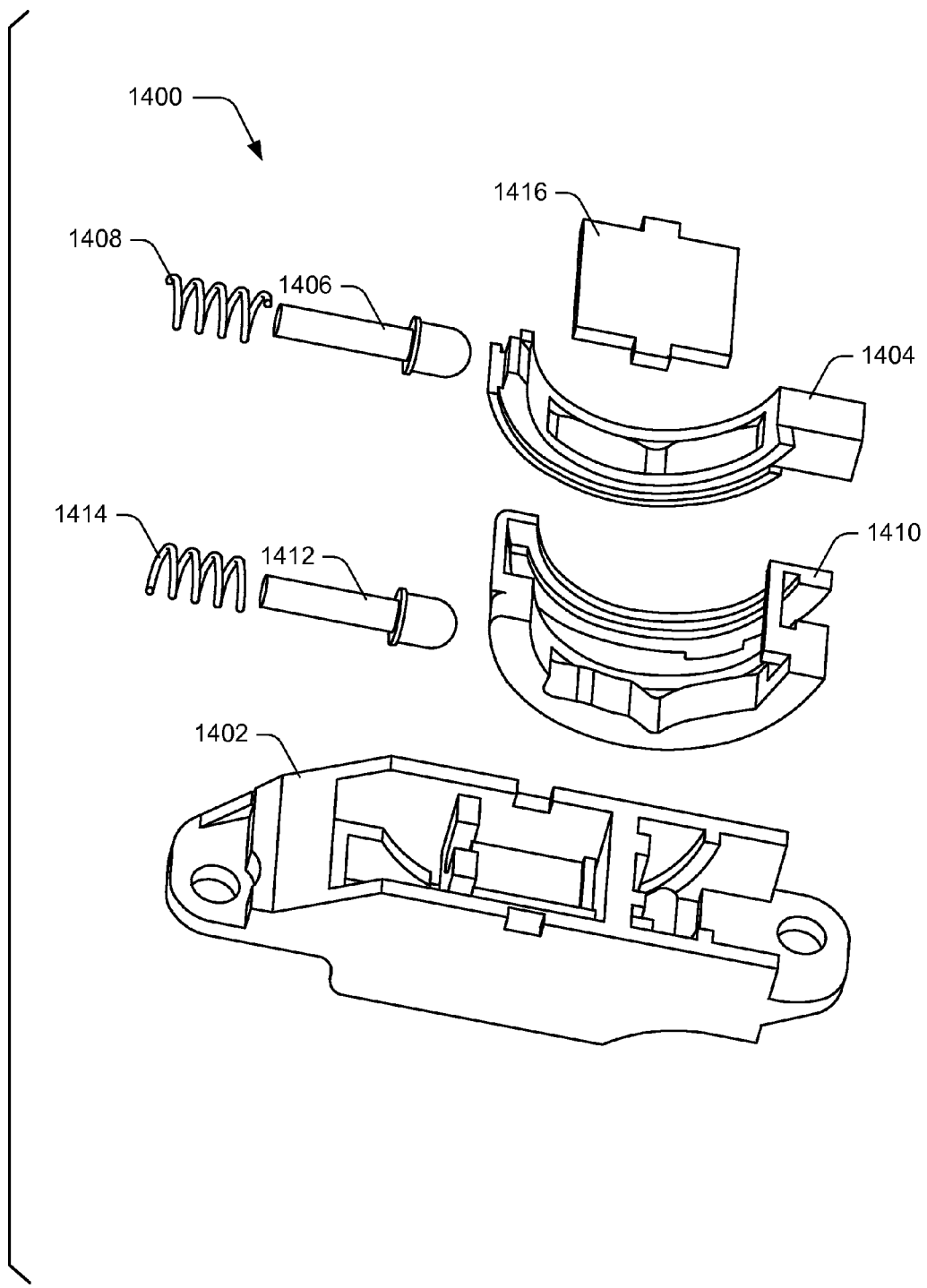
FIG. 14 illustrates components of an example hinge mechanism in accordance with one or more embodiments.

FIG. 14 illustrates components of an example hinge 1400 in accordance with one or more embodiments. The hinge 1400, for instance, can represent an implementation of the peripheral hinges 1302a, 1302b discussed above. This is not intended to be limiting, however, and the hinge 1400 can be employed as a hinge mechanism for a variety of different components and attachment scenarios. Further, the hinge 1400 and its various components can be formed using any suitable material, such as metals, plastics, polymers, alloys, and so forth.

Components of the hinge 1400 include a hinge frame 1402 in which various other components of the hinge 1400 can be disposed. For example, the hinge frame 1402 can be mounted to a device (e.g., the computing device 102) and function as a support structure for other components of the hinge 1400.

Further included is a hinge ring 1404, which can be rotatably and/or movably positioned within the hinge frame 1402. In at least some embodiments, a kickstand (e.g., the kickstand 402) can be attached to the hinge ring 1404. Movement of the hinge ring 1404 within the hinge frame 1402 can enable an attached kickstand to be placed in various positions relative to an attached device.

Operably associated with the hinge ring 1404 are a hinge ring follower 1406 and a hinge ring spring 1408, which can be positioned relative to the hinge ring 1404 to apply pressure to the hinge ring 1404. As detailed below, pressure from the hinge ring spring 1408 and the hinge ring follower 1406 can enable the hinge ring 1404 (and thus an attached kickstand) to maintain preset positions relative to an attached device.

The hinge 1400 further includes a ring support 1410, which can be movably positioned within the hinge frame 1402. In at least some embodiments, the ring support 1410 provides structural support for the hinge ring 1404. For instance, when the hinge ring 1404 is pivoted open to certain positions, the ring support 1410 can stabilize the hinge ring 1404 and thus an attached component, e.g., a kickstand. Stabilization of the hinge ring 1404 via the ring support 1410 is discussed in more detail below.

Operably associated with the ring support 1410 are a ring support follower 1412 and a ring support spring 1414, which can be positioned relative to the ring support 1410 to apply pressure to the ring support 1410. As detailed below, pressure from the ring support spring 1414 and the ring support follower 1412 can enable the ring support 1410 and the hinge ring 1404 to maintain preset positions relative to an attached device.

The hinge 1400 includes a hinge cap 1416, which can be attached to the hinge frame 1402 to secure other components of the hinge 1400 within the hinge frame 1402.

Figure 15:
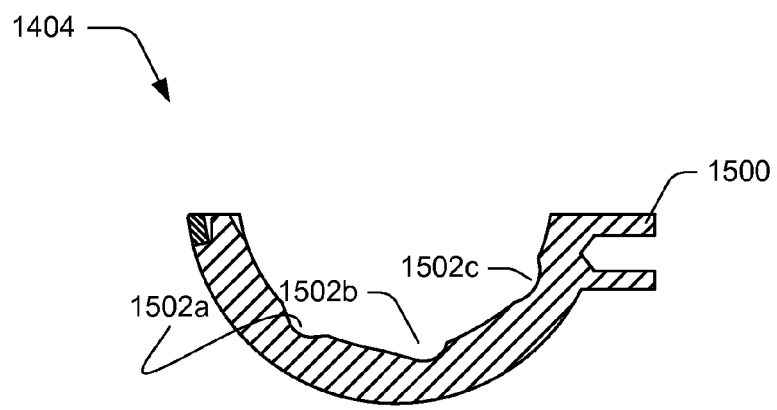
FIG. 15 illustrates a section view of a hinge ring in accordance with one or more embodiments.

FIG. 15 illustrates a section view of the hinge ring 1404 in accordance with one or more embodiments. The hinge ring 1404 includes a hinge ring mount 1500, to which various components can be mounted. For example, the kickstand 402 can be attached to the hinge ring mount 1500.

Various attachment techniques can be utilized to attach components to the hinge ring mount 1500. For instance, the hinge ring mount 1500 can be threaded to accept a screw, bolt, or other threaded fastener. With reference to the kickstand 402, for example, a threaded fastener can be used to attach one of the peripheral hinge mounts 1206a, 1206b to the hinge ring mount 1500. Other types of attachment techniques may alternatively or additionally be employed.

For instance, in at least some embodiments magnetic force may be employed to hold a peripheral hinge mount to the hinge ring mount 1500. A peripheral hinge mount and the ring mount 1500, for example, can include magnetic material, e.g., magnets, ferromagnetic materials, and so forth. Thus, in such embodiments, when a peripheral hinge mount is aligned with the ring mount 1500, magnetic force can removably bind the peripheral hinge mount to the ring mount 1500.

Magnets can thus be employed in some embodiments to attach the kickstand 402 to hinge assemblies (e.g., the hinge 1400) such that kickstand 402 can be detached from an associated device. This can enable a device (e.g., the computing device 102) to be customized in various ways, such as by replacing the kickstand 402 with a different kickstand of a different color, different graphics, different materials, and so forth.

The hinge ring 1404 further includes ring notches 1502a, 1502b, and 1502c. In at least some implementations, the ring notches 1502a, 1502b, and 1502c correspond to preset positions for the hinge ring 1404. For instance, when the hinge ring rotates within the hinge 1400, pressure from the hinge ring spring 1408 can cause the hinge ring follower 1406 to catch in a respective notch of the ring notches 1502a, 1502b, and 1502c. The ring notches 1502a, 1502b, and 1502c, for example, can correspond to preset positions for the kickstand 402. While the hinge ring 1404 is illustrated as included three ring notches, it is to be appreciated that embodiments can include any suitable number of ring notches in accordance with the claimed embodiments. Further example features of the hinge ring 1404 are presented below.

Figure 16:
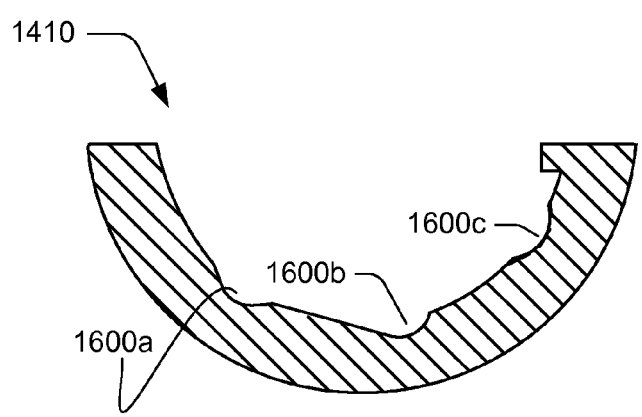
FIG. 16 illustrates a section view of a ring support in accordance with one or more embodiments.

FIG. 16 illustrates a section view of the ring support 1410 in accordance with one or more embodiments. The ring support 1410 further includes support notches 1600a, 1600b, and 1600c. In at least some implementations, the support notches 1600*a*, 1600*b*, and 1600*c* correspond to preset positions for the ring support 1410. For instance, when the ring support 1410 rotates within the hinge 1400, pressure from the ring support spring 1414 can cause the ring support follower 1412 to catch in a respective notch of the support notches 1600*a*, 1600*b*, and 1600*c*. The support notches 1600*a*, 1600*b*, and 1600*c*, for example, can correspond to preset positions for the kickstand 402.

While the ring support 1410 is illustrated as included three support notches, it is to be appreciated that embodiments can include any suitable number of support notches in accordance with the claimed embodiments. Further example features of the ring support 1410 are presented below.

Figure 17:
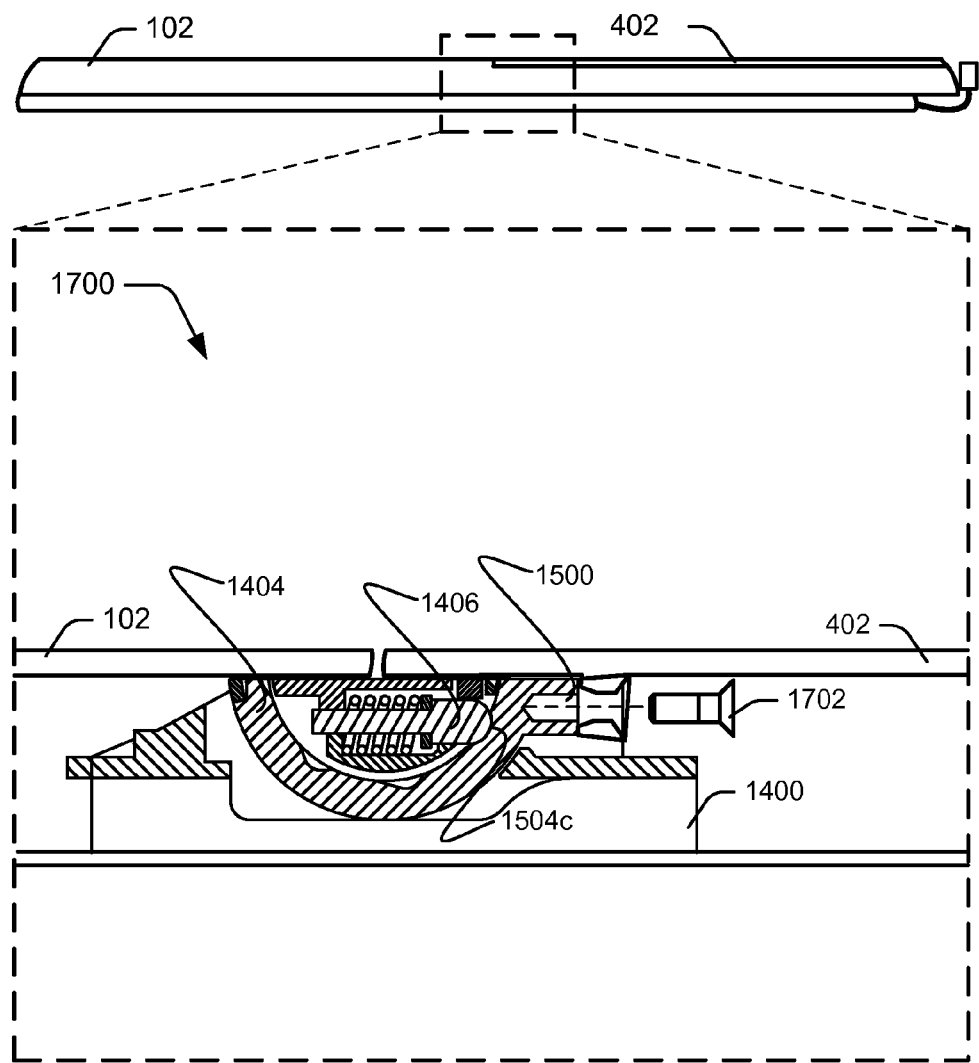
FIG. 17 illustrates a partial section view of a computing device in accordance with one or more embodiments.

FIG. 17 illustrates a partial section view of the computing device 102, generally at 1700. The view 1700 includes a cross section of the hinge 1400 with the kickstand 402 is in a closed position.

As illustrated, the kickstand 402 can be attached to the hinge ring mount 1500 using a screw 1702. However, a wide variety of attachment techniques may be employed in accordance with the claimed embodiments, examples of which are discussed above.

Further illustrated in the view 1700 is that the hinge ring follower 1406 is positioned in the ring notch 1502*c* of the hinge ring 1404. Pressure from the hinge ring follower 1406 against the ring notch 1502*c* holds the hinge 1400, and thus the kickstand 402, in a closed position. A user may open the kickstand 402 by applying pressure to the kickstand 402 sufficient to overcome the static friction applied by the hinge ring follower 1406 against the ring notch 1502*c*.

Figure 18:
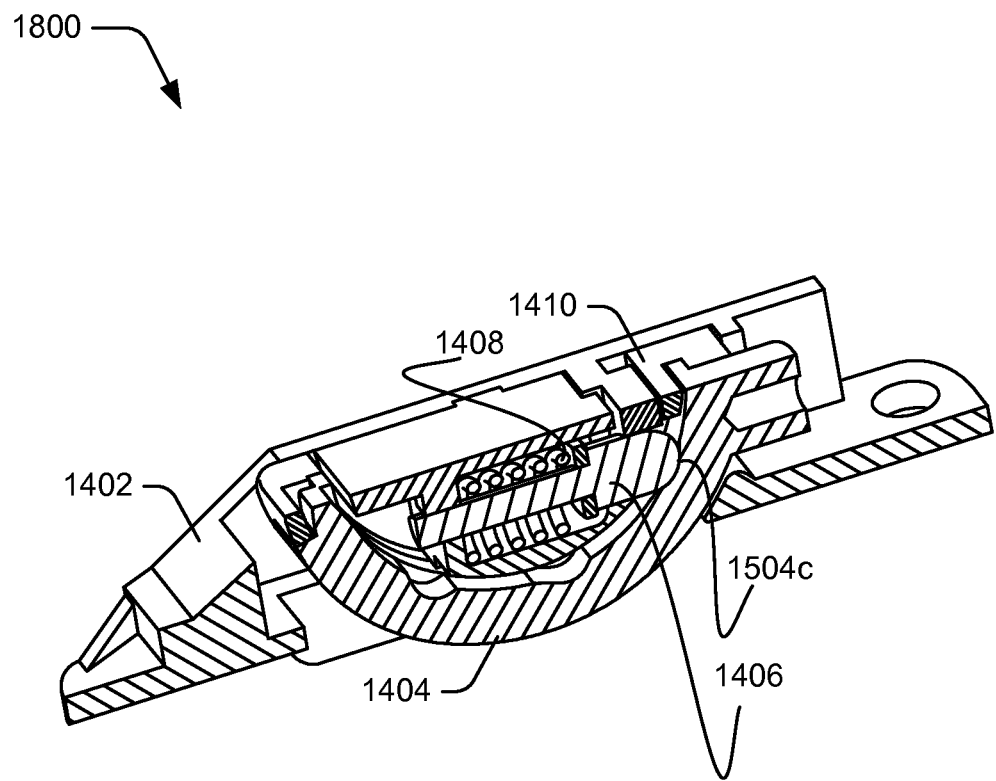
FIG. 18 illustrates a section view of a hinge in a closed position in accordance with one or more embodiments.

FIG. 18 illustrates a section view 1800 of the hinge 1400 in a closed position, such as illustrated with reference to FIG. 17. For ease of viewing, the hinge 1400 is illustrated separate from an attached device and kickstand.

Illustrated as part of the view 1800 are the hinge frame 1402, the hinge ring 1404, and the ring support 1410. Further illustrated is that the hinge ring spring 1408 applies pressure to the hinge ring follower 1406, which in turn applies pressure to the hinge ring 1404 at the ring notch 1502*c*. As discussed above, pressure on the ring notch 1502*c* holds the hinge 1400 in a closed position, and thus holds an attached component (e.g., the kickstand 402) in a closed position.

Figure 19:
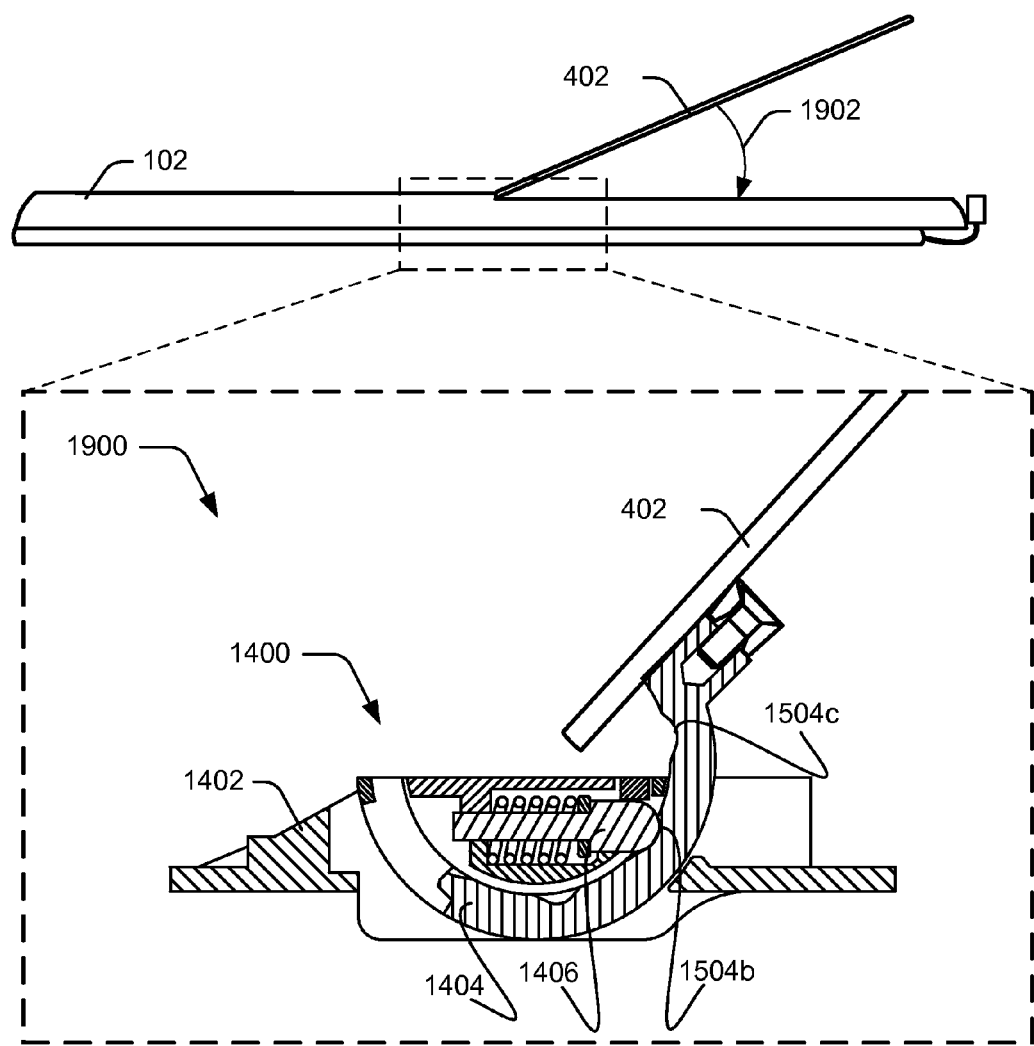
FIG. 19 illustrates a section view of a hinge in an open position in accordance with one or more embodiments.

FIG. 19 illustrates a section view 1900 of the hinge 1400 in an open position. For example, the view 1900 can correspond to an open position of the kickstand 402 relative to the computing device 102. For ease of viewing, the hinge 1400 is illustrated with the kickstand 402 attached but separate from the computing device 102.

Further to the view 1900, the hinge ring follower 1406 has been disengaged from the ring notch 1502*c* of the hinge ring 1404, and engaged with the ring notch 1502*b*. For example, a user can apply pressure to the kickstand 402 away from the computing device 102 to cause the kickstand 402 to transition to a first open position. Thus, engagement of the hinge ring follower 1406 with the ring notch 1502*b* can correspond to a first open position for the hinge 1400, and thus the kickstand 402. Pressure applied by the hinge ring spring 1408 against the hinge ring follower 1406 holds the hinge ring follower in the ring notch 1502*b*, and thus holds the kickstand 402 in the first open position.

In at least some embodiments, the first open position can correspond to an angle 1902 with reference to the kickstand 402 and the computing device 102. For example, the angle 1902 can correspond to angle from 40 degrees to 50 degrees, e.g., 45 degrees.

Figure 20:
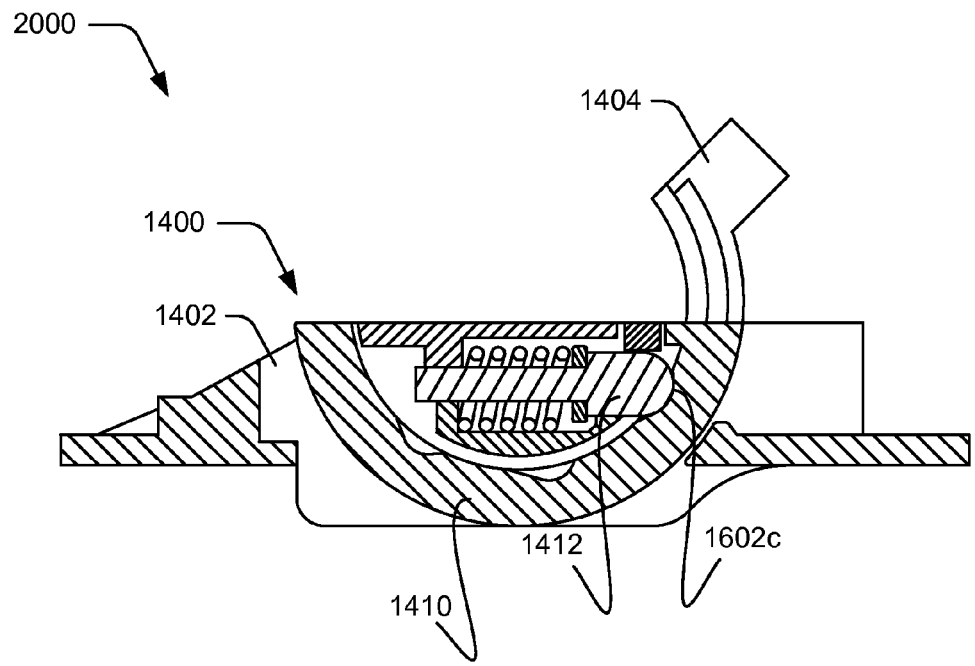
FIG. 20 illustrates a section view of a hinge in a first open position in accordance with one or more embodiments.

FIG. 20 illustrates a section view 2000 of the hinge 1400 in the first open position, as discussed above with reference to FIG. 19. For ease of viewing, the hinge 1400 is illustrated in the view 2000 separate from an associated device and kickstand.

The view 2000 illustrates that in the first open position, the hinge ring 1404 is rotated to an open position. The ring support 1410, however, remains in a closed position within the hinge frame 1402. For instance, in the first open position of the hinge 1400, the ring support follower 1412 remains engaged in the support notch 1600*c* of the ring support 1410.

Figure 21:
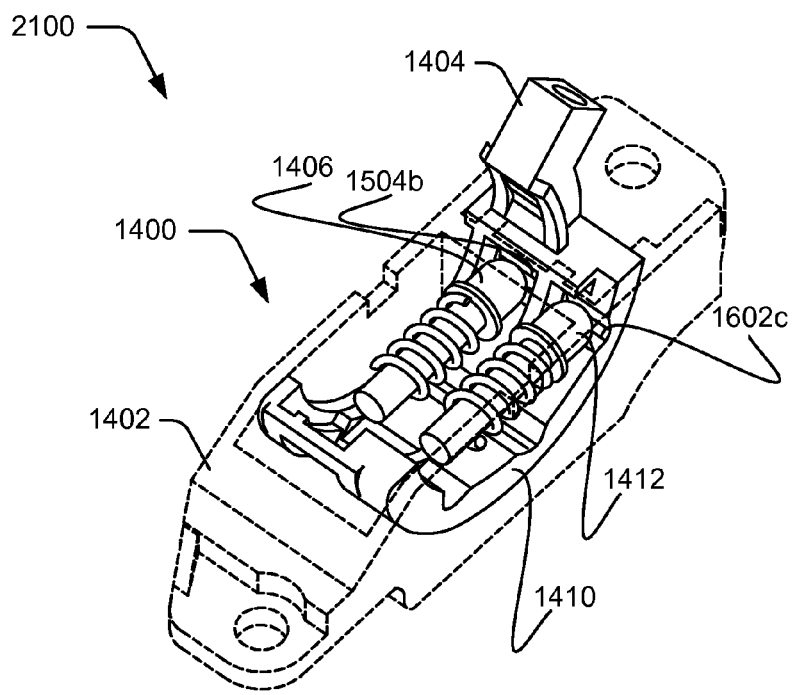
FIG. 21 illustrates an overhead view of a hinge in a first open position in accordance with one or more embodiments.

FIG. 21 illustrates an overhead view 2100 of the hinge 1400 in the first open position, as discussed above with reference to FIGS. 19 and 20. For ease of viewing, the hinge 1400 is illustrated in the view 2100 separate from an associated device and kickstand. Further, the hinge frame 1402 is illustrated via dashed lines.

The view 2100 illustrates that in the first open position for the hinge 1400, the hinge ring follower 1406 is engaged in the ring notch 1502*b* of the hinge ring 1404. Further illustrated is that the ring support follower 1412 is engaged in the support notch 1600*c* of the ring support 1410.

Figure 22:
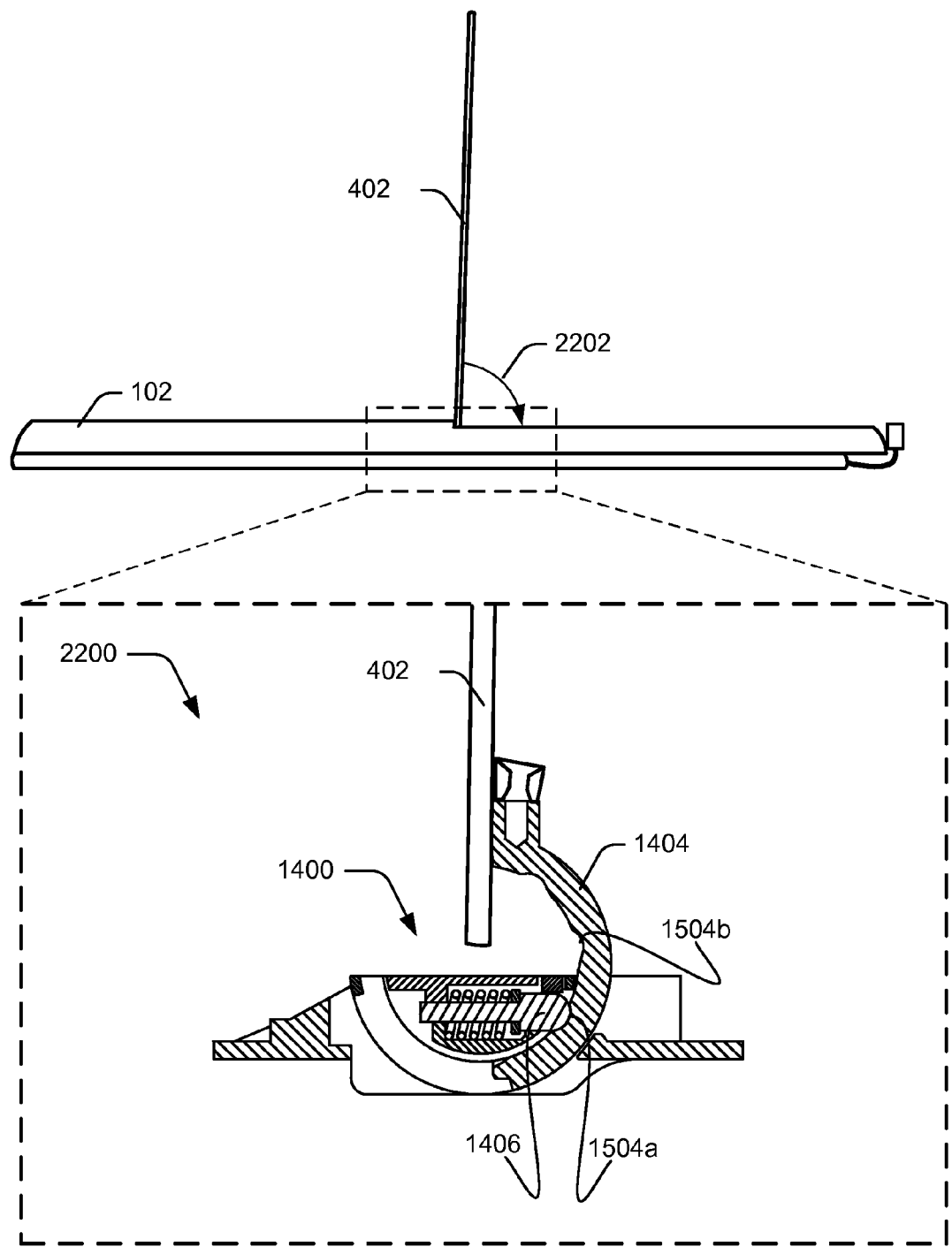
FIG. 22 illustrates a section view of a hinge in a second open position in accordance with one or more embodiments.

FIG. 22 illustrates a section view 2200 of the hinge 1400 in a second open position. For example, the view 2200 can correspond to a second open position of the kickstand 402 relative to the computing device 102. For ease of viewing, the hinge 1400 is illustrated with the kickstand 402 attached but separate from the computing device 102.

Further to the view 2200, the hinge ring follower 1406 has been disengaged from the ring notch 1502*b* of the hinge ring 1404, and engaged with the ring notch 1502*a*. For example, a user can apply pressure to the kickstand 402 to cause the kickstand 402 to transition to a second open position. Thus, engagement of the hinge ring follower 1406 with the ring notch 1502*a* can correspond to a second open position for the hinge 1400, and thus the kickstand 402. Pressure applied by the hinge ring spring 1408 against the hinge ring follower 1406 holds the hinge ring follower 1406 in the ring notch 1502*a*, and thus holds the kickstand 402 in the second open position.

In at least some embodiments, the second open position can correspond to an angle 2202 with reference to the kickstand 402 and the computing device 102. For example, the angle 2202 can correspond to angle from 85 degrees to 95 degrees, e.g., 90 degrees.

Figure 23:
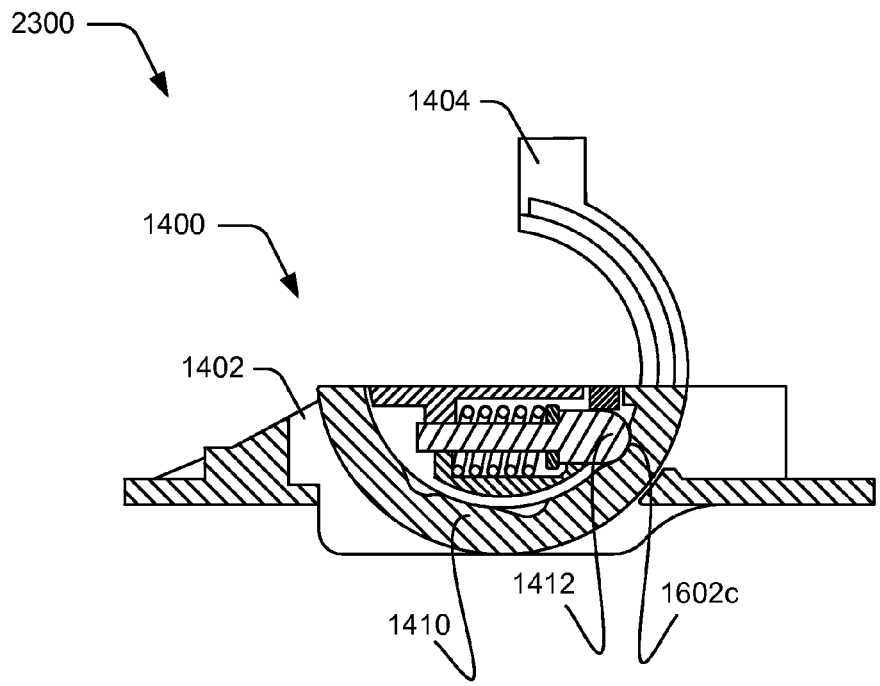
FIG. 23 illustrates a section view of a hinge in a second open position in accordance with one or more embodiments.

FIG. 23 illustrates a section view 2300 of the hinge 1400 in the second open position, as discussed above with reference to FIG. 22. For ease of viewing, the hinge 1400 is illustrated in the view 2300 separate from an associated device and kickstand.

The view 2300 illustrates that in the second open position, the hinge ring 1404 is rotated to the second open position as discussed above. Similar to the first open position, the ring support 1410 remains in a closed position within the hinge frame 1402. For instance, in the second open position of the hinge 1400, the ring support follower 1412 remains engaged in the support notch 1600*c* of the ring support 1410.

Figure 24:
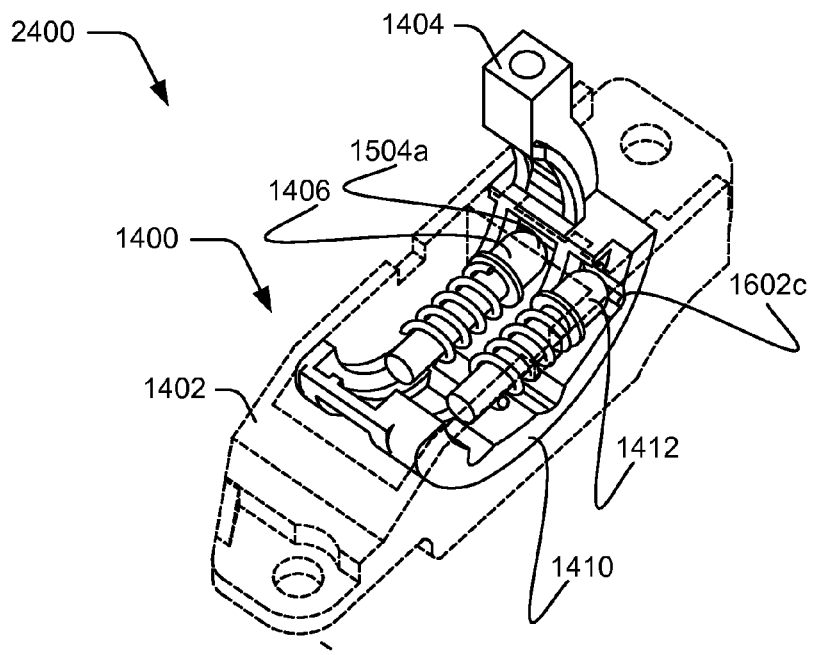
FIG. 24 illustrates an overhead view of a hinge in a second open position in accordance with one or more embodiments.

FIG. 24 illustrates an overhead view 2400 of the hinge 1400 in the second open position, as discussed above with reference to FIGS. 22 and 23. For ease of viewing, the hinge 1400 is illustrated in the view 2400 separate from an associated device and kickstand. Further, the hinge frame 1402 is illustrated via dashed lines.

The view 2400 illustrates that in the second open position for the hinge 1400, the hinge ring follower 1406 is engaged in the ring notch 1502*a* of the hinge ring 1404. Further illustrated is that the ring support follower 1412 is engaged in the support notch 1600*c* of the ring support 1410. Thus, in the second open position, the ring support 1410 remains in a closed position within the hinge frame 1402.

Figure 25:
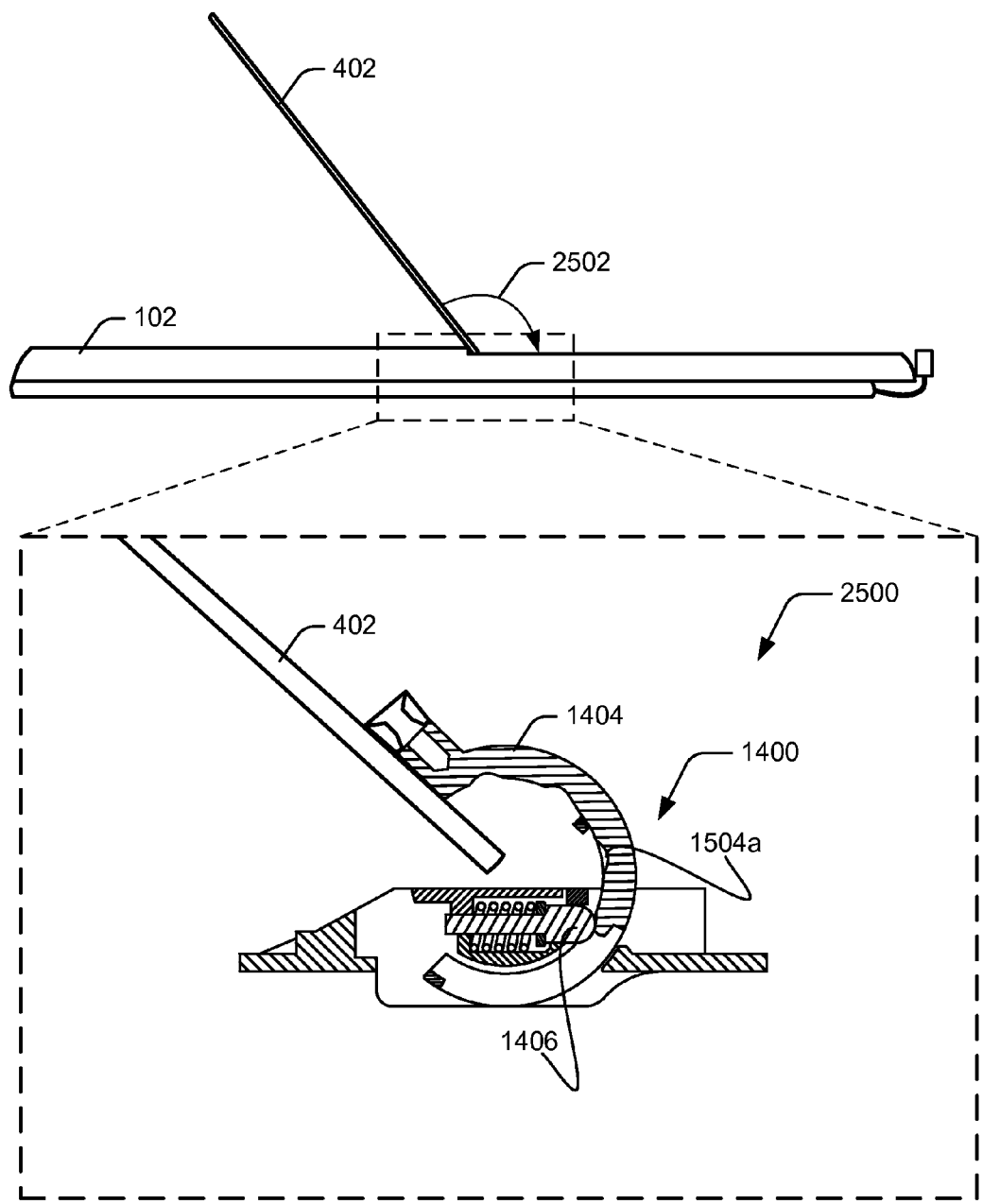
FIG. 25 illustrates a section view of a hinge in a third open position in accordance with one or more embodiments.

FIG. 25 illustrates a section view 2500 of the hinge 1400 in a third open position. For example, the view 2500 can correspond to a third open position of the kickstand 402 relative to the computing device 102. For ease of viewing, the hinge 1400 is illustrated with the kickstand 402 attached but separate from the computing device 102. Further to the view 2500, the hinge ring follower 1406 is disengaged from the ring notch 1502a of the hinge ring 1404 to enable the kickstand 402 to be positioned in the third open position.

In at least some embodiments, the third open position can correspond to an angle 2502 with reference to the kickstand 402 and the computing device 102. For example, the angle 2502 can correspond to angle from 130 degrees to 140 degrees, e.g., 135 degrees.

Figure 26:
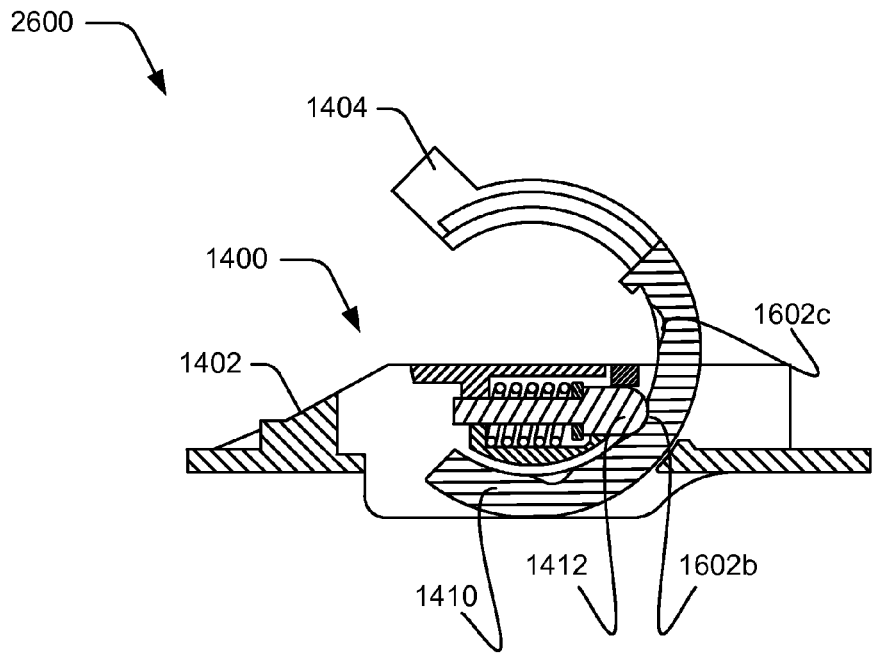
FIG. 26 illustrates a section view of a hinge in a third open position in accordance with one or more embodiments.

FIG. 26 illustrates a section view 2600 of the hinge 1400 in the third open position, as discussed above with reference to FIG. 25. For ease of viewing, the hinge 1400 is illustrated in the view 2600 separate from an associated device and kickstand.

The view 2600 illustrates that in the third open position, the hinge ring 1404 is rotated as discussed above. Further to the third open position, the ring support 1410 is rotated within the hinge frame 1402 such that the ring support follower 1412 disengages from the support notch 1600c, and engages with the support notch 1600b. For instance, when the hinge ring 1404 rotates from the second open position to the third open position, a catch mechanism on the hinge ring 1404 can engage the ring support 1410 and cause the ring support 1410 to rotate within the hinge frame 1402 to the third open position. An example catch mechanism is illustrated below with reference to FIGS. 31 and 32.

Figure 27:
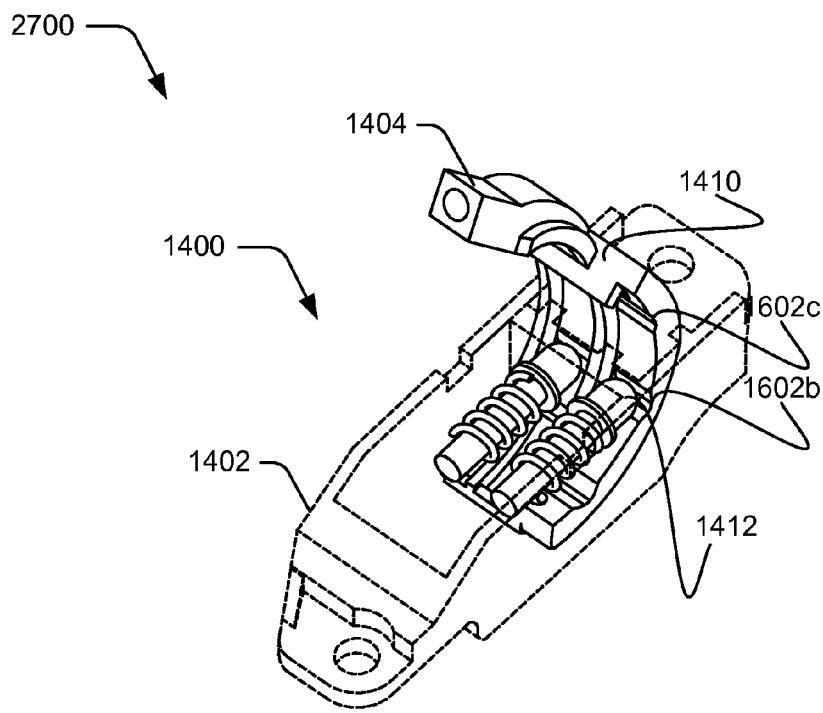
FIG. 27 illustrates an overhead view of a hinge in a third open position in accordance with one or more embodiments.

FIG. 27 illustrates an overhead view 2700 of the hinge 1400 in the third open position, as discussed above with reference to FIGS. 25 and 26. For ease of viewing, the hinge 1400 is illustrated in the view 2700 separate from an associated device and kickstand. Further, the hinge frame 1402 is illustrated via dashed lines.

The view 2700 illustrates that in the transition to the third open position, the hinge ring 1404 catches the ring support 1410 and causes the ring support 1410 to rotate within the hinge frame 1402 to an open position. As a result, the ring support follower 1412 disengages from the support notch 1600c, and engages with the support notch 1600b. In the third open position, the ring support 1410 serves as a stabilizing structure for the hinge ring 1404. Thus, an attached component (e.g., the kickstand 402) can be stabilized in the third open position.

Figure 28:
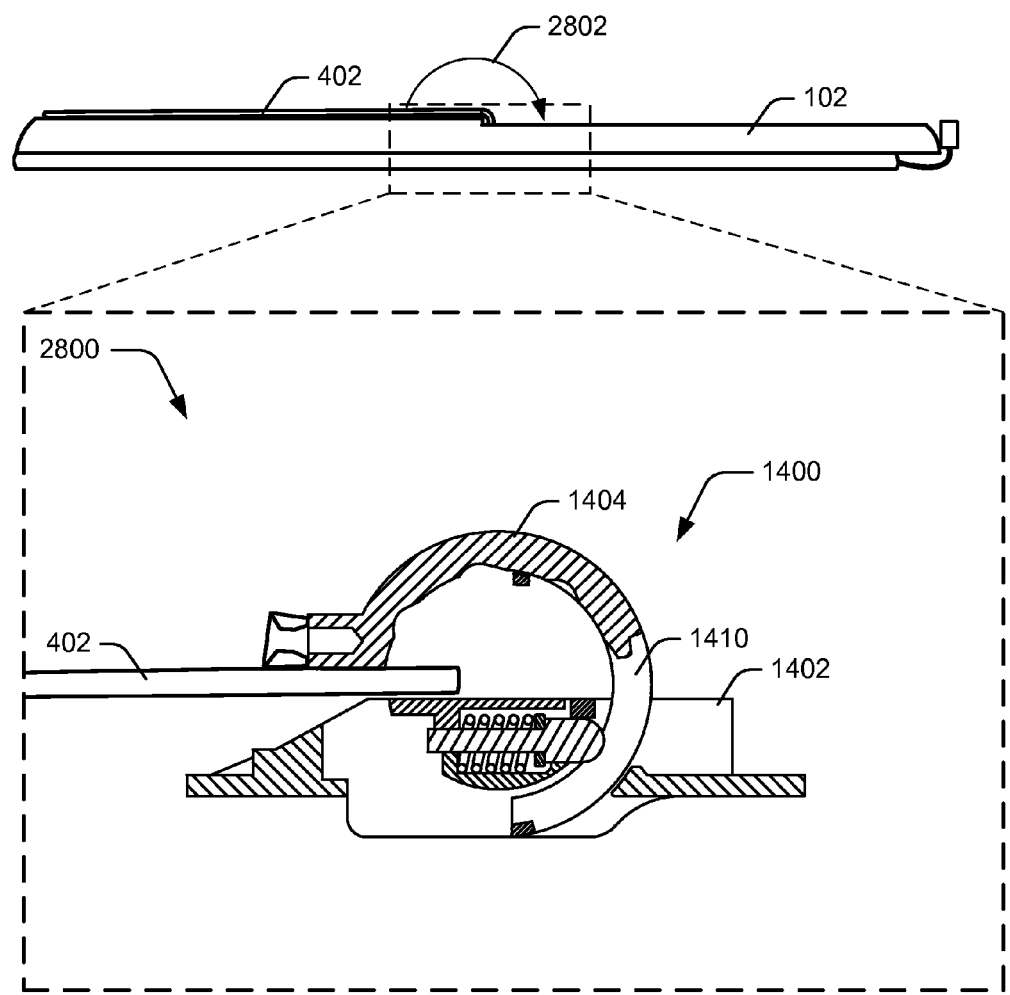
FIG. 28 illustrates a section view of a hinge in a fourth open position in accordance with one or more embodiments.

FIG. 28 illustrates a section view 2800 of the hinge 1400 in a fourth open position. For example, the view 2800 can correspond to a fourth open position of the kickstand 402 relative to the computing device 102. For ease of viewing, the hinge 1400 is illustrated in the view 2800 with the kickstand 402 attached but separate from the computing device 102. Further to the view 2800, the hinge ring 1404 is rotated to enable the kickstand 402 to be positioned in the fourth open position. As further discussed below, rotation of the hinge ring 1404 to the fourth open position causes the ring support 1410 to rotate within the hinge frame 1402 to the fourth open position for the hinge 1400.

In at least some embodiments, the fourth open position can correspond to an angle 2802 with reference to the kickstand 402 and the computing device 102. For example, the angle 2802 can be 180 degrees. In the fourth open position, for example, the kickstand 402 can be positioned against a rear surface of the computing device 102.

Figure 29:
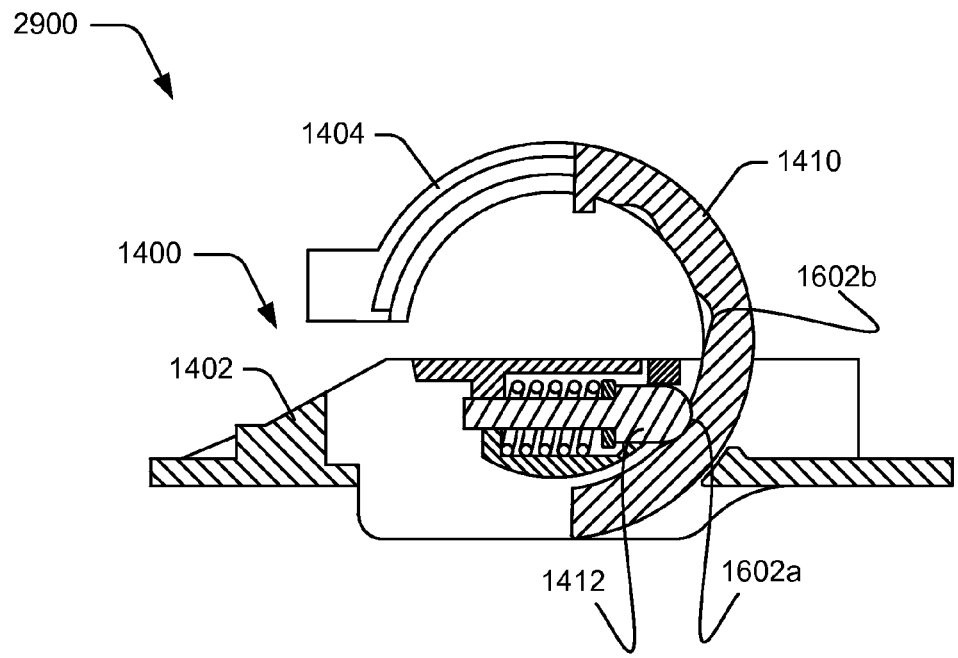
FIG. 29 illustrates a section view of a hinge in a fourth open position in accordance with one or more embodiments.

FIG. 29 illustrates a section view 2900 of the hinge 1400 in the fourth open position, as discussed above with reference to FIG. 28. For ease of viewing, the hinge 1400 is illustrated in the view 2900 separate from an associated device and kickstand.

The view 2900 illustrates that in the fourth open position, the hinge ring 1404 is rotated to the fourth open position as discussed above. Further to the fourth open position, the ring support 1410 is rotated within the hinge frame 1402 such that the ring support follower 1412 disengages from the support notch 1600b, and engages with the support notch 1600a. For instance, when the hinge ring 1404 rotates from the third open position to the fourth open position, a catch mechanism on the hinge ring 1404 that engages the ring support 1410 causes the ring support 1410 to rotate within the hinge frame 1402 to the fourth open position. An example catch mechanism is illustrated below with reference to FIGS. 31 and 32.

Figure 30:
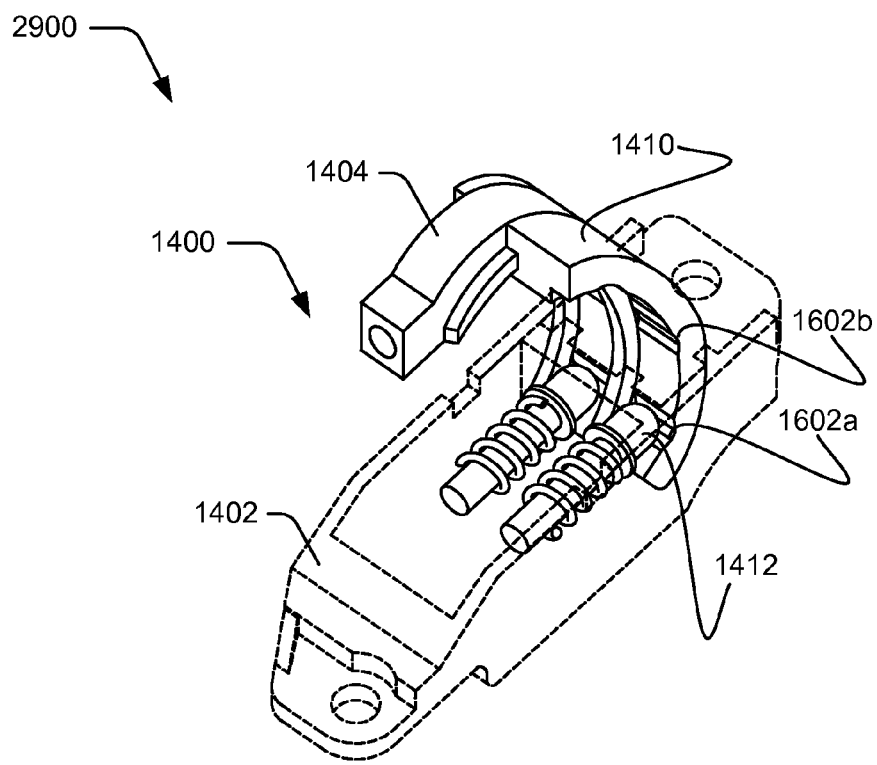
FIG. 30 illustrates an overhead view of a hinge in a fourth open position in accordance with one or more embodiments.

FIG. 30 illustrates an overhead view 3000 of the hinge 1400 in the fourth open position, as discussed above with reference to FIGS. 28 and 29. For ease of viewing, the hinge 1400 is illustrated in the view 3000 separate from an associated device and kickstand. Further, the hinge frame 1402 is illustrated via dashed lines.

The view 3000 illustrates that in the transition to the fourth open position, a catch mechanism on the hinge ring 1404 pulls the ring support 1410 and causes the ring support 1410 to rotate within the hinge frame 1402 to the fourth open position. As a result, the ring support follower 1412 disengages from the support notch 1600b, and engages with the support notch 1600a. In the fourth open position, the ring support 1410 serves as a stabilizing structure for the hinge ring 1404. Thus, an attached component (e.g., the kickstand 402) can be stabilized in the fourth open position.

Figure 31:
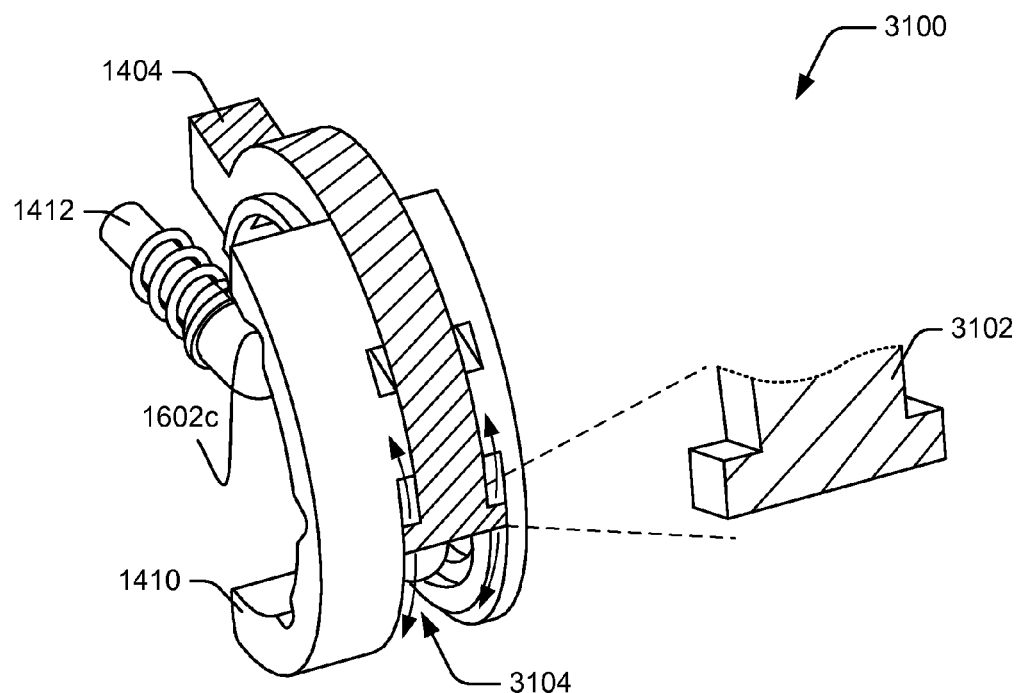
FIG. 31 illustrates a rear view of a hinge ring and a ring support in accordance with one or more embodiments.

FIG. 31 illustrates a rear view 3100 of the hinge ring 1404 and the ring support 1410. For ease of viewing, the hinge ring 1404 and the ring support 1410 are illustrated separately from other components of the hinge 1400. In at least some embodiments, the view 3100 represents a position of the hinge ring 1404 and the ring support 1410 when the hinge 1400 is in an open position, e.g., one of the open position one or open position two, discussed above. As discussed above, when the hinge 1400 is in a closed position, the open position one, or the open position two, the ring support follower 1412 is engaged in the support notch 1600c, as illustrated in the view 3100.

In the view 3100, the hinge ring 1404 includes a support catch 3102, which functions as a catch mechanism for engaging the ring support 1410 when the hinge ring 1404 is rotated to certain positions. The support catch 3102 is slidably disposed in a support slot 3104 of the ring support. In certain positions the hinge ring 1404 can slide within the support slot 3104 without causing movement of the ring support 1410, e.g., between a closed position and the open position two of the hinge 1400.

Figure 32:
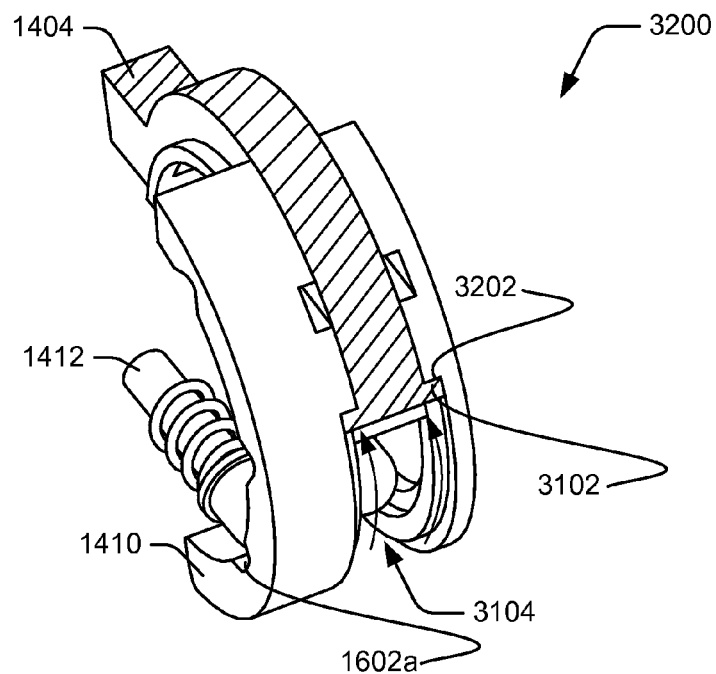
FIG. 32 illustrates a rear view of a hinge ring and a ring support in accordance with one or more embodiments.

FIG. 32 illustrates a rear view 3200 of the hinge ring 1404 and the ring support 1410. For ease of viewing, the hinge ring 1404 and the ring support 1410 are illustrated separately from other components of the hinge 1400. In at least some embodiments, the view 3200 represents a position of the hinge ring 1404 and the ring support 1410 when the hinge 1400 is in an open position, e.g., one of the open position three or open position four, discussed above.

In the view 3200, the hinge ring 1404 slides within the support slot 3104 such that the support catch 3102 engages a slot stop 3202 in the support slot 3104. As illustrated, the slot stop 3202 is narrower than the support catch 3102, and thus the support catch 3102 engages with the slot stop 3202 in certain open positions of the hinge 1400. When the hinge ring 1404 rotates within the hinge 1400 in a direction such that the support catch 3102 engages with the slot stop 3202, further movement in that direction causes the ring support 1410 to rotate within the hinge 1400. For example, when a user repositions a kickstand that is mounted to the hinge ring 1404 with the support catch 3102 engaged in the slot stop 3202, resulting rotation of the hinge ring 1404 causes the ring support 1410 to rotate.

In this particular example, the view 3200 represents the fourth open position of the hinge 1400, as indicated by the engagement of the ring support follower 1412 with the support notch 1600a of the ring support 1410. Thus, force applied by the support catch 3102 against the slot stop 3202 causes the ring support 1410 to rotate between various positions.

In at least some embodiments, the ring support 1410 may also include a lower catch mechanism such that when the hinge ring 1404 is rotated towards a closed position (e.g., from the fourth open position), the support catch 3102 engages the lower catch mechanism such that the ring support 1410 is corresponding rotated towards a closed position within the hinge 1400. For instance, consider the following embodiments.

Figure 33:
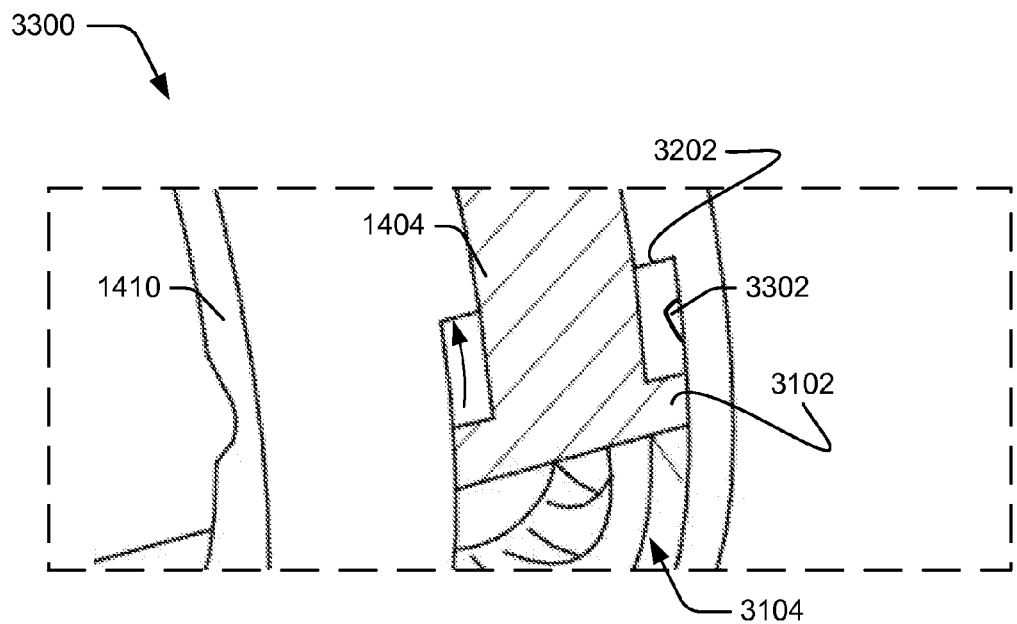
FIG. 33 illustrates a rear view of a hinge ring and a ring support in accordance with one or more embodiments.

FIG. 33 illustrates a rear view 3300 of portions of the ring support 1410 and the hinge ring 1404. Further illustrated is a return catch 3302, which is attached to and/or formed as a portion of the ring support 1410. The return catch 3302 protrudes inward into the support slot 3104. The return catch 3302 can be formed from various materials, such as rubber and/or other elastically deformable materials. In at least some embodiments, the return catch 3302 can be formed as a portion of the ring support 1410, and can thus be formed from the same material as the ring support 1410.

In at least some embodiments, when the hinge ring 1404 rotates towards an open position (e.g., towards the fourth open position discussed above), the support catch 3102 engages the return catch 3302. For instance, pressure from the support catch 3102 against the return catch 3302 can cause a slight deformation of the return catch 3302 such that the support catch 3102 can slide past the return catch 3302 to engage the slot stop 3202. For instance, consider the following illustration.

Figure 34:
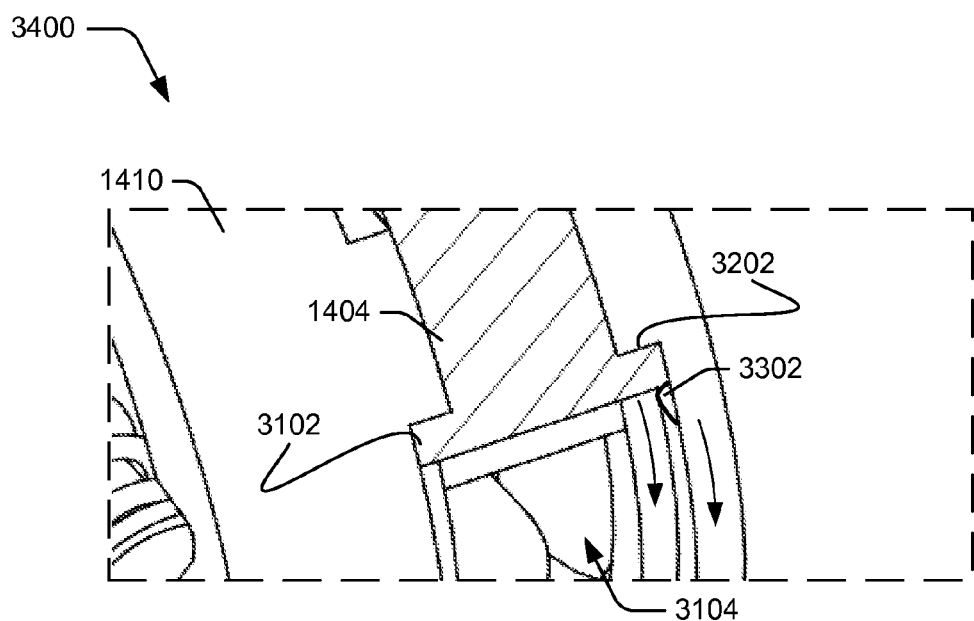
FIG. 34 illustrates a rear view of a hinge ring and a ring support in accordance with one or more embodiments.

FIG. 34 illustrates a rear view 3400 of portions of the ring support 1410 and the hinge ring 1404. In the view 3400, the hinge ring 1404 is rotated within the support slot 3104 past the return catch 3302 such that the support catch 3102 engages the slot stop 3202. As referenced above, the return catch 3302 can be formed from an elastic material. Thus, pressure from the support catch 3102 causes an elastic deformation of the return catch 3302 such that the support catch 3102 can rotate past the return catch 3302. The view 3400, for example, can represent an orientation of the ring support 1410 and the hinge ring 1402 in the fourth open position, discussed above.

As illustrated in the view 3400, the return catch 3302 is positioned on the ring support 1410 such that when the support catch 3102 is engaged with the slot stop 3202, a rear edge of the return catch 3302 applies pressure to the support catch 3102. Accordingly, when the hinge ring 1402 is rotated back towards a closed position, pressure from the support catch 3102 against the return catch 3302 causes the ring support 1410 to rotate towards a closed position within the hinge 1400. In at least some embodiments, this can enable the ring support 1410 to return from a fully open position (e.g., the fourth open position) such that the ring support 1410 can engage with the ring support follower 1412 (discussed above) in various positions of the hinge 1400.

Thus, embodiments discussed herein provide a stable hinge mechanism that enables an attached component (e.g., a kickstand) to be adjusted between multiple preset positions. It is to be appreciated that the example device orientations, kickstand positions, hinge positions, hinge stop positions, and so forth discussed above are presented for purposes of example only. Thus, a wide variety of different device orientations, kickstand positions, hinge positions, and hinge stop positions not specifically mentioned herein may be implemented within the spirit and scope of the claimed embodiments. For instance, an attachment mechanism used to attach a kickstand to a computing device (e.g., the peripheral hinges discussed above) can include any number and/or configuration of suitable stop positions to enable the kickstand to be opened to a variety of different positions to support various orientations of a computing device. Further, example hinges can be attached at any suitable position and/or portion of a kickstand and/or computing device in accordance with the claimed embodiments.

Example System and Device

Figure 35:
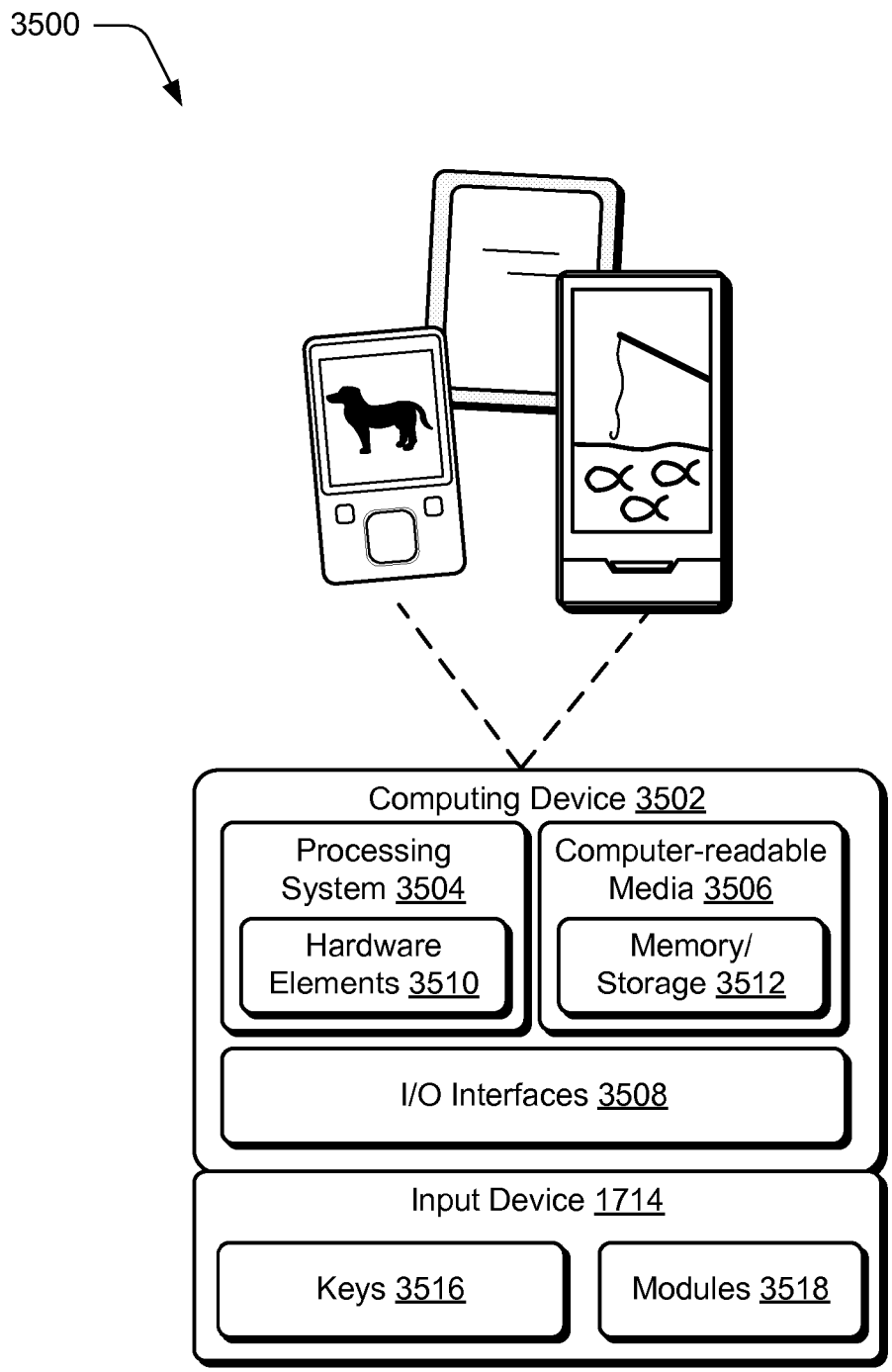
FIG. 35 illustrates an example system including various components of an example device that can be implemented as any type of computing device as described with reference to FIGS. 1-34 to implement embodiments of the techniques described herein.

FIG. 35 illustrates an example system generally at 3500 that includes an example computing device 3502 that is representative of one or more computing systems and/or devices that may implement the various techniques described herein. The computing device 3502 may be, for example, be configured to assume a mobile configuration through use of a housing formed and size to be grasped and carried by one or more hands of a user, illustrated examples of which include a mobile phone, mobile game and music device, and tablet computer although other examples are also contemplated.

The example computing device 3502 as illustrated includes a processing system 3504, one or more computer-readable media 3506, and one or more I/O interface 3508 that are communicatively coupled, one to another. Although not shown, the computing device 3502 may further include a system bus or other data and command transfer system that couples the various components, one to another. A system bus can include any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 3504 is representative of functionality to perform one or more operations using hardware. Accordingly, the processing system 3504 is illustrated as including hardware element 3510 that may be configured as processors, functional blocks, and so forth. This may include implementation in hardware as an application specific integrated circuit or other logic device formed using one or more semiconductors. The hardware elements 3510 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

The computer-readable storage media 3506 is illustrated as including memory/storage 3512. The memory/storage 3512 represents memory/storage capacity associated with one or more computer-readable media. The memory/storage component 3512 may include volatile media (such as random access memory (RAM)) and/or nonvolatile media (such as read only memory (ROM), Flash memory, optical disks, magnetic disks, and so forth). The memory/storage component 3512 may include fixed media (e.g., RAM, ROM, a fixed hard drive, and so on) as well as removable media (e.g., Flash memory, a removable hard drive, an optical disc, and so forth). The computer-readable media 3506 may be configured in a variety of other ways as further described below.

Input/output interface(s) 3508 are representative of functionality to allow a user to enter commands and information to computing device 3502, and also allow information to be presented to the user and/or other components or devices using various input/output devices. Examples of input devices include a keyboard, a cursor control device (e.g., a mouse), a microphone, a scanner, touch functionality (e.g., capacitive or other sensors that are configured to detect physical touch), a camera (e.g., which may employ visible or non-visible wavelengths such as infrared frequencies to recognize movement as gestures that do not involve touch), and so forth. Examples of output devices include a display device (e.g., a monitor or projector), speakers, a printer, a network card, tactile-response device, and so forth. Thus, the computing device 3502 may be configured in a variety of ways to support user interaction.

The computing device 3502 is further illustrated as being communicatively and physically coupled to an input device 3514 that is physically and communicatively removable from the computing device 3502. In this way, a variety of different input devices may be coupled to the computing device 3502 having a wide variety of configurations to support a wide variety of functionality. In this example, the input device 3514 includes one or more keys 3516, which may be configured as pressure sensitive keys, mechanically switched keys, and so forth.

The input device 3514 is further illustrated as include one or more modules 3518 that may be configured to support a variety of functionality. The one or more modules 3518, for instance, may be configured to process analog and/or digital signals received from the keys 3516 to determine whether a keystroke was intended, determine whether an input is indicative of resting pressure, support authentication of the input device 3514 for operation with the computing device 3502, and so on.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques may be implemented on a variety of commercial computing platforms having a variety of processors.

An implementation of the described modules and techniques may be stored on or transmitted across some form of computer-readable media. The computer-readable media may include a variety of media that may be accessed by the computing device 3502. By way of example, and not limitation, computer-readable media may include "computer-readable storage media" and "computer-readable signal media."

"Computer-readable storage media" may refer to media and/or devices that enable persistent storage of information in contrast to mere signal transmission, carrier waves, or signals per se. Thus, computer-readable storage media refers to non-signal bearing media. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Computer-readable signal media" may refer to a signal-bearing medium that is configured to transmit instructions to the hardware of the computing device 3502, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 3510 and computer-readable media 3506 are representative of modules, programmable device logic and/or fixed device logic implemented in a hardware form that may be employed in some embodiments to implement at least some aspects of the techniques described herein, such as to perform one or more instructions. Hardware may include components of an integrated circuit or on-chip system, an application-specific integrated circuit (ASIC), a field-programmable gate array (FPGA), a complex programmable logic device (CPLD), and other implementations in silicon or other hardware. In this context, hardware may operate as a processing device that performs program tasks defined by instructions and/or logic embodied by the hardware as well as a hardware utilized to store instructions for execution, e.g., the computer-readable storage media described previously.

Combinations of the foregoing may also be employed to implement various techniques described herein. Accordingly, software, hardware, or executable modules may be implemented as one or more instructions and/or logic embodied on some form of computer-readable storage media and/or by one or more hardware elements 3510. The computing device 3502 may be configured to implement particular instructions and/or functions corresponding to the software and/or hardware modules. Accordingly, implementation of a module that is executable by the computing device 3502 as software may be achieved at least partially in hardware, e.g., through use of computer-readable storage media and/or hardware elements 3510 of the processing system 3504. The instructions and/or functions may be executable/operable by one or more articles of manufacture (for example, one or more computing devices 3502 and/or processing systems 3504) to implement techniques, modules, and examples described herein.

CONCLUSION

Although the example implementations have been described in language specific to structural features and/or methodological acts, it is to be understood that the implementations defined in the appended claims is not necessarily limited to the specific features or acts described. Rather, the specific features and acts are disclosed as example forms of implementing the claimed features.

What is claimed is:

1. An apparatus comprising:
a kickstand configured to be rotatably attached to a rear portion of a computing device; and
at least one hinge that attaches a portion of the kickstand to the rear portion of the computing device, the hinge being configured to be held in two or more preset open positions such that the kickstand is positionable relative to the computing device according to the two or more preset open positions, the hinge including:
a hinge ring attached to the kickstand and that is rotatable in conjunction with the kickstand;
a hinge ring follower that applies pressure against the hinge ring to cause the hinge ring follower to engage in one or more notches on a surface of the hinge ring to hold the hinge ring in a preset open position of the two or more preset open positions; and
a spring positioned against the hinge ring follower and that applies pressure against the hinge ring follower to cause the hinge ring follower to apply pressure against the hinge ring.

2. An apparatus as recited in claim 1, wherein the hinge further comprises:
a hinge frame;
a ring support rotatably disposed at least partially within the hinge frame, the hinge ring being rotatably disposed relative to the ring support such that rotation of the hinge ring to a particular position relative to the ring support causes the hinge ring to engage the ring support, and further rotation of the hinge ring beyond the particular position causes corresponding rotation of the ring support with respect to the hinge frame.

3. An apparatus as recited in claim 2, wherein the hinge ring is rotatably disposed at least partially within the ring support.

4. An apparatus as recited in claim 2, wherein the hinge ring follower applies pressure into notches in a surface of the hinge ring to hold the hinge ring in at least some of the two or more preset open positions.

5. An apparatus as recited in claim 2, wherein the hinge comprises a ring support follower that applies pressure to the ring support to hold the ring support in at least some of the two or more preset open positions.

6. An apparatus as recited in claim 2, wherein the hinge comprises:
a ring support follower that applies pressure to the ring support to hold the ring support in others of the two or more preset open positions.

7. An apparatus as recited in claim 1, wherein one of the two or more preset open positions corresponds to a 180 degree rotation of the kickstand relative to the rear portion of the computing device.

8. An apparatus as recited in claim 1, wherein the hinge ring includes a hinge mount portion that is attached directly to the kickstand.

9. A hinge comprising:
a hinge frame;
a hinge ring rotatably disposed at least partially within the hinge frame, the hinge ring including one or more notches and being attachable to a component to enable rotation of the component relative to the hinge frame; and
a hinge ring follower and a hinge ring spring disposed within the hinge frame, the hinge ring spring applying pressure to the hinge ring follower such that the hinge ring follower presses against the hinge ring and when the hinge ring is rotated to an open position relative to the hinge frame, the hinge ring follower applies pressure into the one or more notches of the hinge ring to cause the hinge ring to assume one or more preset open positions for the hinge.

10. A hinge as recited in claim 9, further comprising a ring support rotatably disposed at least partially within the hinge frame, wherein the hinge ring is rotatably disposed at least partially within the ring support such that rotation of the hinge ring to a particular position relative to the ring support causes the hinge ring to engage the ring support, and further rotation of the hinge ring in an opening direction beyond the particular position causes corresponding rotation of the ring support with respect to the hinge frame to cause the ring support to assume one or more other preset open positions for the hinge.

11. A hinge as recited in claim 9, wherein the hinge is attached to a computing device, and the component comprises a kickstand that is rotatable via the hinge to support multiple orientations of the computing device relative to an adjacent surface.

12. A hinge as recited in claim 9, wherein the hinge is attached to a computing device, and the component comprises a kickstand that is rotatable via the hinge to support multiple orientations of the computing device relative to an adjacent surface, wherein at least some of the multiple orientations correspond to the one or more preset open positions of the hinge.

13. A hinge as recited in claim 9, further comprising:
a ring support rotatably disposed at least partially within the hinge frame, wherein the hinge ring is rotatably disposed at least partially within the ring support such that rotation of the hinge ring to a particular position relative to the ring support causes the hinge ring to engage the ring support, and further rotation of the hinge ring beyond the particular position causes corresponding rotation of the ring support with respect to the hinge frame to cause the ring support to assume one or more other preset open positions for the hinge; and
a ring support follower that applies pressure to the ring support to hold the ring support in the one or more other preset open positions.

14. A hinge as recited in claim 13, further comprising a ring support spring that applies pressure to the ring support follower to enable the ring support follower to apply pressure to the ring support.

15. A computing device comprising:
a housing; and
at least one hinge attached to the housing and a kickstand such that the kickstand is positionable via the hinge at preset positions to support multiple orientations of the computing device relative to an adjacent surface, the hinge including:
a hinge frame;
a hinge ring rotatably disposed at least partially within the hinge frame, the hinge ring including one or more notches and being attached to the kickstand such that the kickstand is rotatable relative to the housing; and
a hinge ring follower and a hinge ring spring disposed within the hinge frame, the hinge ring spring applying pressure against the hinge ring follower such that the hinge ring follower presses against the hinge ring and when the hinge ring is rotated to an open position relative to the hinge frame, the hinge ring follower engages against the one or more notches of the hinge ring to cause the hinge ring to assume one or more preset open positions for the hinge.

16. A computing device as described in claim 15, further comprising a ring support rotatably disposed at least partially within the hinge frame, wherein the hinge ring is rotatably disposed at least partially within the ring support such that rotation of the hinge ring to a particular position relative to the ring support causes the hinge ring to engage the ring support, and further rotation of the hinge ring beyond the particular positions causes corresponding rotation of the ring support with respect to the hinge frame to cause the ring support to assume one or more other preset open positions for the hinge.

17. A computing device as described in claim 15, wherein the one or more preset positions comprise a 180 degree rotation of the kickstand relative to the housing.

18. A computing device as described in claim 15, wherein the hinge further includes:
- a ring support rotatably disposed at least partially within the hinge frame, wherein the hinge ring is rotatably disposed at least partially within the ring support such that rotation of the hinge ring to a particular position relative to the ring support causes the hinge ring to engage the ring support, and further rotation of the hinge ring beyond the particular position causes corresponding rotation of the ring support with respect to the hinge frame to cause the ring support to assume one or more other preset open positions for the hinge; and
- a ring support follower that applies pressure to the ring support to hold the ring support in the one or more other preset open positions.

19. A computing device as described in claim 18, wherein the hinge further includes a ring support spring that applies pressure to the ring support follower to enable the ring support follower to apply pressure to the ring support.

20. A computing device as described in claim 15, wherein the hinge ring includes a hinge mount portion that is attached directly to a body of the kickstand.

* * * * *